(12) United States Patent
Shimada et al.

(10) Patent No.: US 7,820,357 B2
(45) Date of Patent: Oct. 26, 2010

(54) POLYMERIZABLE COMPOSITION AND PLANOGRAPHIC PRINTING PLATE PRECURSOR USING THE SAME

(75) Inventors: Kazuto Shimada, Shizuoka-ken (JP); Keisuke Arimura, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 207 days.

(21) Appl. No.: 11/644,912

(22) Filed: Dec. 26, 2006

(65) Prior Publication Data

US 2007/0148593 A1 Jun. 28, 2007

(30) Foreign Application Priority Data

Dec. 26, 2005 (JP) .............................. 2005-373602
Mar. 30, 2006 (JP) .............................. 2006-096011

(51) Int. Cl.
*G03C 1/00* (2006.01)
*G03F 7/00* (2006.01)
*G03F 7/26* (2006.01)

(52) U.S. Cl. .............. 430/270.1; 430/281.1; 430/286.1; 430/273.1; 430/913

(58) Field of Classification Search .............. 430/270.1, 430/276.1, 914, 281.1, 286.1, 287.1, 302, 430/273.1, 913, 916
See application file for complete search history.

(56) References Cited

U.S. PATENT DOCUMENTS 6,110,987 A 8/2000 Kamata et al.

| | | | |
|---|---|---|---|
| 2001/0024766 A1* | 9/2001 | Kita et al. | 430/272.1 |
| 2004/0009430 A1* | 1/2004 | Kanna et al. | 430/287.1 |
| 2004/0131974 A1* | 7/2004 | Suzuki | 430/302 |
| 2004/0137369 A1* | 7/2004 | Shimada | 430/281.1 |
| 2004/0180289 A1* | 9/2004 | Shimada et al. | 430/281.1 |
| 2004/0197701 A1* | 10/2004 | Mitsumoto et al. | 430/270.1 |
| 2004/0209774 A1* | 10/2004 | Odamura et al. | 503/227 |
| 2006/0263720 A1* | 11/2006 | Mori | 430/270.1 |

FOREIGN PATENT DOCUMENTS

| | | |
|---|---|---|
| CN | 1326117 Q | 12/2001 |
| EP | 0 684 522 A1 | 11/1995 |
| EP | 1 563 991 A1 | 8/2005 |
| EP | 1685957 A2 * | 8/2006 |
| EP | 1 705 007 A2 | 9/2006 |
| EP | 1 708 023 A1 | 10/2006 |
| JP | 58-29803 A | 2/1983 |
| JP | 4-31863 A | 2/1992 |
| JP | 4-106548 A | 4/1992 |
| JP | 2000-131837 A | 5/2000 |
| WO | WO 2004/008251 A1 | 1/2004 |

OTHER PUBLICATIONS

Chinese Office Action for Application No. 200610168663.X dated Sep. 18, 2009.

* cited by examiner

*Primary Examiner*—Cynthia H Kelly
*Assistant Examiner*—Connie P Johnson
(74) *Attorney, Agent, or Firm*—Sughrue Mion, PLLC

(57) ABSTRACT

There is provided a polymerizable composition comprising (A) a binder polymer, (B) a polymerizable compound having an unsaturated group, and (C) a diaryl iodonium salt having at least two electron-donating groups. The iodonium salt (C) preferably has three or more electron-donating groups. This polymerizable composition is useful as a recording layer of a negative type planographic printing plate precursor.

18 Claims, No Drawings

POLYMERIZABLE COMPOSITION AND PLANOGRAPHIC PRINTING PLATE PRECURSOR USING THE SAME

CROSS-REFERENCE TO RELATED APPLICATION

This application claims priority under 35 U.S.C. 119 from Japanese patent Application Nos. 2005-373602 and 2006-096011, the disclosures of which are incorporated by reference herein.

BACKGROUND OF THE INVENTION

1. Field of the Invention

The present invention relates to a polymerizable composition having responsiveness to the infrared wavelength range and to a planographic plate precursor using the polymerizable composition as a recording layer, and in particular to a polymerizable compound used preferably as a recording layer of a negative type planographic printing plate precursor capable of so-called direct plate-making in which plate is directly made using an infrared laser based on digital signals in a computer etc.

2. Description of the Related Art

Development of lasers is remarkable in recent years, and in particular, high power output and miniaturization of solid lasers and semiconductor lasers having an emission range in the near infrared to infrared range are being developed. Accordingly, these lasers are very useful as exposure light sources for direct plate-making from digital data in computers etc.

A negative type planographic printing plate precursor for infrared laser, using an infrared laser as an exposure light source having an emission region in the infrared ray region utilizes, for example, a photopolymerizable composition etc. as its recording layer for forming an image.

As the conventionally known method of forming an image with a photopolymerizable composition by light exposure, there are various kinds of known methods such as a method of forming a hardened relief image by forming a recording layer using a photopolymerizable composition containing an ethylenically unsaturated compound and a photopolymerizable initiator on the surface of a support and then subjecting it to imagewise exposure to polymerize and cure the ethylenically unsaturated compound in a light-exposed portion, followed by removing a light-unexposed portion by dissolution, a method of forming an image by changing the bonding strength of a photopolymerizable composition layer (recording layer) to a support by light exposure and then removing the support, and a method of forming an image by utilizing a change in the adhesion of a toner to a photopolymerizable composition caused by light. The photopolymerization initiator used in each of these methods is an initiator that is responsive to light having shorter wavelength centered in the ultraviolet region of 400 nm or less, such as benzoin, benzoin alkyl ether, benzyl ketal, benzophenone, anthraquinone, benzyl ketone or Michler's ketone.

As image-forming techniques have been developed in recent years, there has been strong needs for photosensitive materials with high sensitivity to light in the visible region. For example, a large number of photopolymerizable compositions with sensitivity in a range extending to about 500 nm to cope with a laser plate-making method using an oscillation beam at 488 nm from an argon ion laser. In addition, photopolymerizable compositions suitable for light having a longer wavelength than 600 nm that is adapted to a laser plate-making method using a He—Ne laser or a semiconductor laser or adapted to techniques of reproducing full-color images, have been actively studied.

A technique has been known which uses, in a photopolymerizable composition, an ethylenically unsaturated compound and a photoinitiation system that includes an s-triazine derivative having a specific structure and a cyanine colorant having a specific structure containing heterocyclic rings linked to each other via a mono-, tri-, penta- or heptamethine chain (see, for example, Japanese Patent Application Laid-Open (JP-A) Nos. 58-29803 and 4-31863). In another proposed photopolymerizble composition, the polymerization initiation system includes a squarylium compound having a specific structure and a specific s-triazine compound (see, for example, JP-A No. 4-106548).

However, with respect to the ability of a photopolymerization initiator to generate an active radical, the responsiveness to light having a wavelength of 500 nm or more, particularly more than 600 nm, is known to be lowered rapidly with decrease in photoactivation energy. Conventionally proposed photopolymerizable compositions such as those described above are not satisfactory in sensitivity to such light in longer wavelength range and have a problem in that photopolymerization reaction proceeds at the time of handling under a white fluorescent light. Therefore, it has been difficult to obtain a composition with stable quality.

To solve the problem accompanying these photopolymerizable compositions with respect to higher sensitivity and improvement of handling easiness under white light, photopolymerizable compositions have been proposed which contain an ethylenically unsaturated compound, a specific colorant, and a photopolymerization initiator (e.g., triazine compound) (see, for example, JP-A No. 2000-131837).

However, planographic printing plates using such a composition in a recording layer are poor in stability during storage. Therefore, there are strong needs for achievement of higher sensitivity together with practically satisfactory stability.

When existing alkyl-substituted iodonium salts or monoalkoxy-substituted iodonium salts are used as the initiator, the resultant photopolymerizable compositions are highly sensitive, but have remaining color in development after storage, have difficulty in practical use.

SUMMARY OF THE INVENTION

The present invention has been made in view of the circumstances described above, and provides a polymerizable composition and a planographic printing plate precursor using the same.

The inventors made extensive study, and as a result, they found that use of a specific iodonium salt compound is effective, thus reached the present invention.

According to a first aspect of the invention, a polymerizable composition includes (A) a binder polymer, (B) a polymerizable compound having an unsaturated group, and (C) a diaryl iodonium salt having at least two electron-donating groups.

This polymerizable composition preferably further includes (D) a compound having absorption maximum at 700 to 1200 nm from the viewpoint of sensitivity.

The diaryl iodonium salt having at least two electron-donating groups (C) used herein preferably has at least 3 electron-donating groups in its molecule. The electron-donating group is preferably an alkoxy group.

More specifically, in a preferable mode, the specific diaryl iodonium salt (C) has a partial structure represented by the following formula (I):

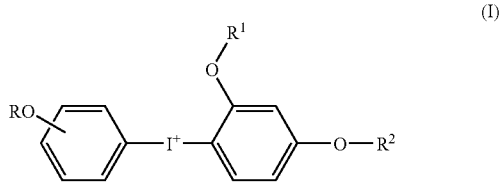

In formula (I), R, $R^1$ and $R^2$ each independently represent an alkyl group or an aryl group.

The binder polymer (A) is preferably an alkali-soluble resin, more preferably a polymer containing a structural unit represented by the following formula (II):

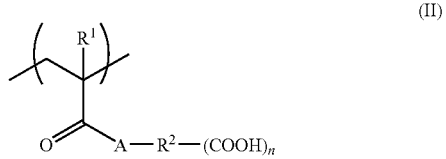

In formula (II), $R^1$ represents a hydrogen atom or a methyl group; $R^2$ is a linking group composed of two or more atoms selected from the group consisting of carbon atoms, hydrogen atoms, oxygen atoms, nitrogen atoms and sulfur atoms, wherein the number of atoms is 2 to 82; A represents an oxygen atom or —$NR^3$— wherein $R^3$ represents a hydrogen atom or a $C_{1-10}$ monovalent hydrocarbon group; and n is an integer of 1 to 5.

According to a second aspect of the present invention, a planographic printing plate precursor includes, on a support, a recording layer containing the polymerizable composition according to the first aspect of the invention described above.

The iodonium salt having excellent functions as a polymerization initiator is excellent in polymerization sensitivity and coloration sensitivity, but has a problem in stability, which makes its usage difficult. The mechanism of the invention is not evident, but is estimated as follows: In the polymerizable composition of the invention, a diaryl iodonium salt having two or more electron-donating groups introduced therein is used as a polymerization initiator, whereby the decomposition with time of the iodonium salt compound caused by water or a nucleophilic agent and the thermal electron transfer when used in combination with a colorant etc. are suppressed, resulting in improvement of the stability of the polymerizable composition with maintained sensitivity.

The inventors have also found that, by laminating a specific protective layer on the surface of a recording layer, the planographic printing plate precursor acquires excellent sensitivity and stability in sensitivity, and undesired adhesion can be suppressed even when such planographic printing plate precursors are stacked without an interleaf paper therebetween.

According to a third aspect, a planographic printing plate precursor includes a recording layer containing the polymerizable composition according to the first aspect and a protective layer laminated sequentially on a support.

The protective layer preferably includes a filler. It is preferable that at least one inorganic filler and at least one organic filler are contained as the filler.

The effects can be further improved when the protective layer has a multi-layer structure having a lower protective layer containing an inorganic layered compound provided on the recording layer, and an upper protective layer containing the filler provided on the surface of the lower protective layer.

That is, in this preferable mode of the invention, there is an advantage in that: by forming a protective layer having such a constitution, the recording layer acquires excellent stability with time, and even when the planographic printing plate precursors are stacked without an interleaf paper therebetween, undesired adhesion between the outermost surface of the recording layer and the backside of the adjacent support can be suppressed, and flaws and image loss attributable to the flaws can be suppressed.

As used herein, the terms "laminated sequentially" means that the respective layers are laminated in the indicated order on a support, and does not deny the presence of other layers that are optionally provided, for example, a back coat layer, an undercoat layer, an intermediate layer etc.

DETAILED DESCRIPTION OF THE INVENTION

Hereinafter, the present invention will be described in more detail.

[Polymerizable Composition]

The polymerizable composition according to the invention includes, as a polymerization initiator, (C) a diaryl iodonium salt having at least two electron-donating groups, in addition to (A) a binder polymer and (B) a polymerizable compound having an unsaturated group.

Hereinafter, the respective components contained in the polymerizable composition will be described sequentially. First, the diaryl iodonium salt having at least two electron-donating groups (C) [hereinafter referred to sometimes as a specific iodonium salt (C)], which is an important constituent component in the invention, will be described.

<Diaryl Iodonium Salt Having at Least Two Electron-Donating Groups (C)>

The specific iodonium salt (C) contained as a polymerization initiator in the invention is a compound having a diaryl iodonium skeleton. This compound is excellent in reactivity and stability, and has two or more electron-donating groups.

The electron-donating groups contained in the specific iodonium salt (C) may be, for example, an alkyl group, an alkoxy group, an amino group, a urea group, an alkoxyalkyl group, an acyloxyamino group, a cycloalkyl group, or an allyl group. These groups may have substituents such as an alkyl group, an alkenyl group, an aryl group, a hydroxyl group, an alkoxy group, a thiol group, a thioalkoxy group, an amino group or a halogen atom as far as their electron-donating property is not lost.

The electron-donating group is preferably an alkyl group or an alkoxy group, most preferably an alkoxy group.

The position of the electron-donating group relative to the aryl skeleton is preferably the para-position or an ortho-position.

The number of electron-donating groups introduced into the aryl skeleton should be at least two, and is preferably three or more, and is most preferably four.

In a preferable example of the combination of the electron-donating group and the number thereof, the specific iodonium salt (C) has alkoxy groups as electron-donating groups, and the number of the alkoxy groups is preferably 3 or more, more preferably 4 or more.

As to the physical characteristics related to introduction of electron-donating groups, the total sum of the Hammett's values of the substituents introduced into the aryl skeleton is preferably −0.28 or less, more preferably −0.56 or less, most preferably −0.84 or less.

The Hammett's value is indicative of the degree of electron withdrawal by a substituent in the diaryl iodonium salt structure, and for the Hammett's value in the invention, the numerical values described in "Kagaku Binran Kisohen II" (Chemical Handbook, Basic Edition II) compiled by The Chemical Society of Japan (published in 1984 by Maruzen Co., Ltd.) can be referenced.

The Hammett's value is usually calculated assuming that the position of the substituent is the m- or p-position. In the invention, as the electron effects, calculation is conducted assuming that the Hammett's value at the o-position is the same as that at the p-position.

The specific iodonium salt (C) which can be preferably used in the invention may be an iodonium salt having in its molecule a partial structure represented by the following formula (I):

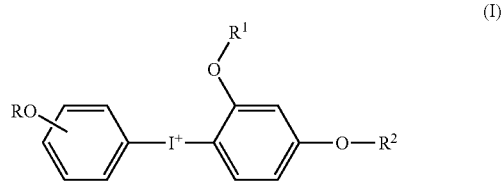
(I)

In formula (I), R, $R^1$ and $R^2$ each independently represent an alkyl group, an alkenyl group, an alkynyl group, a cycloalkyl group or a cycloalkenyl group.

Each of these groups may further have a substituent, and introducible substituents include a halogen atom, a hydroxy group, an alkyl group, an alkenyl group, an alkynyl group, a cycloalkyl group, a cycloalkenyl group, an alkoxy group, an alkoxycarbonyl group, a carboxyl group, an amino group, an aryl group, an aryloxy group, a sulfo group, a thioalkoxy group, a urea group, and a urethane group.

In respect of stability, the substituent is preferably an alkyl group.

The aromatic ring in the formula (I) may be substituted by other substituents such as a halogen atom, a hydroxyl group, an alkoxycarbonyl group, a carboxyl group and an amide group as far as the effects of the electron-donating group are not lost.

More preferable examples of the partial structure represented by the formula (I) include partial structures represented by the following formula (I-ii):

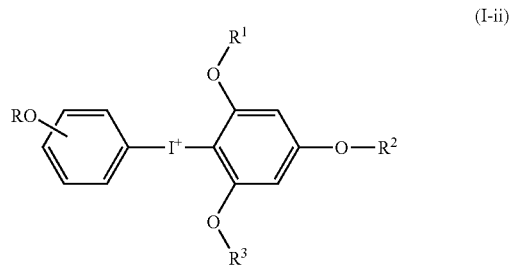
(I-ii)

R, $R^1$ and $R^2$ in the formula (I-ii) have the same definitions as R, $R^1$ and $R^2$ in the formula (I). $R^3$ also has the same definition as R, $R^1$ and $R^2$ in the formula (I).

As the counter anion of the specific iodonium salt (C) in the invention, any counter anion having an anion structure can be used without limitation.

Usable counter anions include a carboxylic acid anion, sulfonic acid anion, sulfonamide anion, borate anion, phosphoric acid anion, sulfinic acid anion, sulfuric acid anion, $PF_6^-$, $BF_4^-$, $SbF_6^-$, and halogen anions. Among these, an anion having a sulfonic acid group is preferable from the viewpoint of the balance between stability and sensitivity.

Specific examples [Exemplary Compounds (I-1) to (I-31)] of the specific iodonium salt (C) that can be preferably used in the invention are illustrated below, but the examples should not be constru
d as limiting the invention.

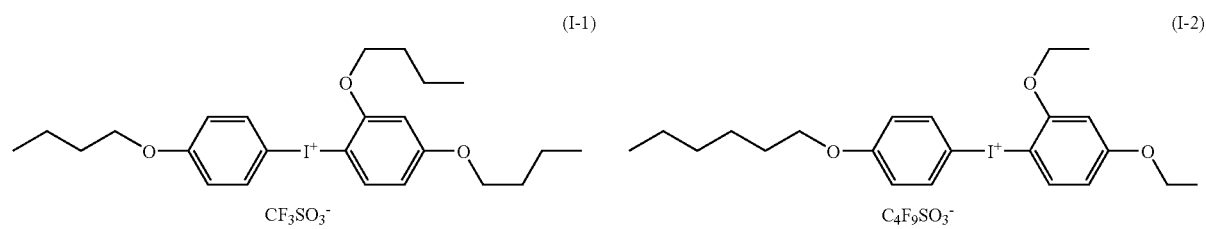

(I-1)

$CF_3SO_3^-$

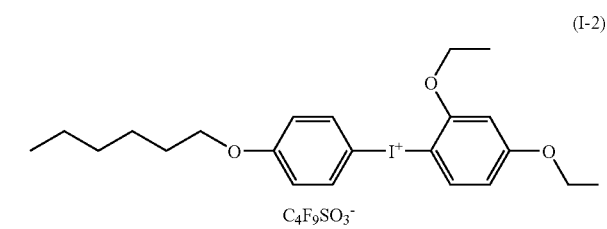

(I-2)

$C_4F_9SO_3^-$

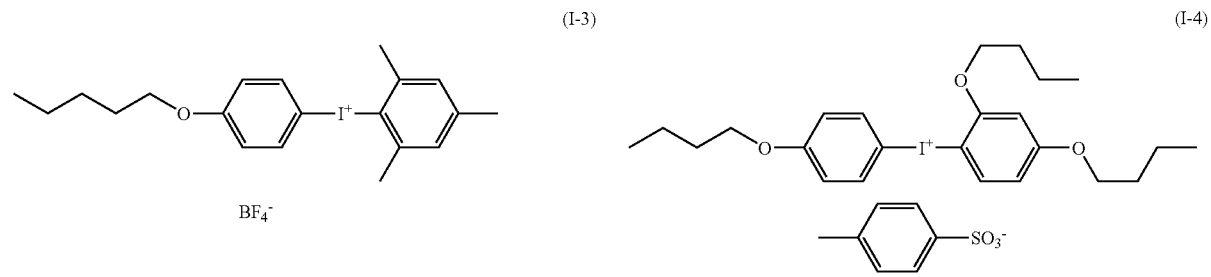

(I-3)

$BF_4^-$ (I-4)

-continued
(I-5) 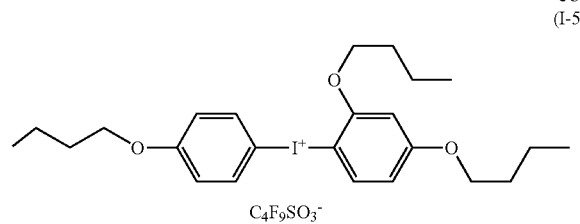
(I-6) 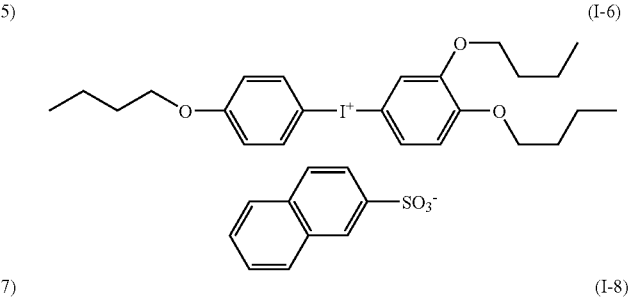
(I-7) 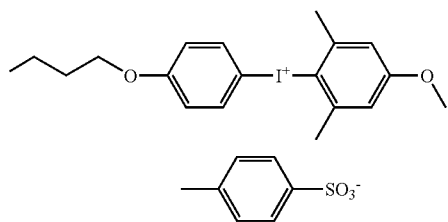
(I-8) 
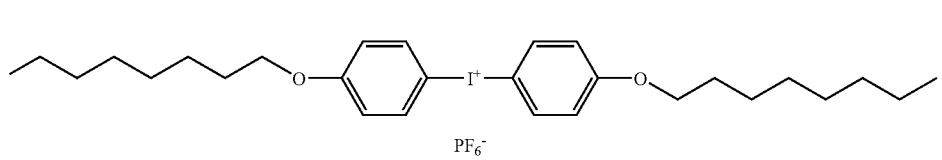
(I-9)
(I-10) 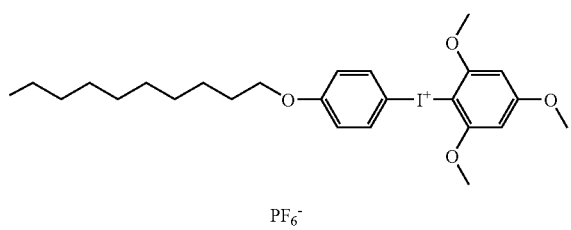
(I-11)
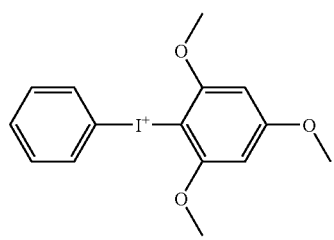
(I-12)
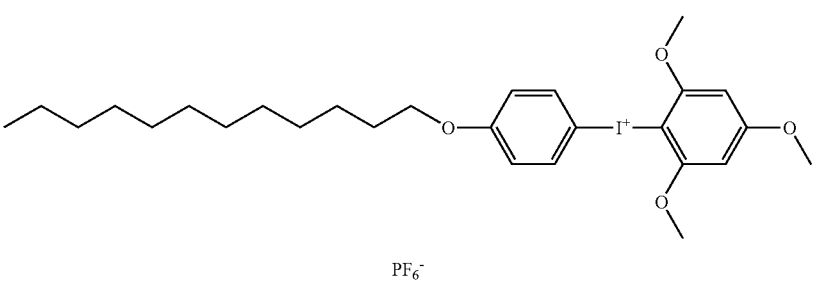
(I-13)

-continued
(I-14)
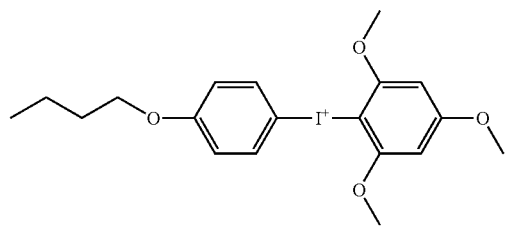
PF$_6^-$
(I-15)
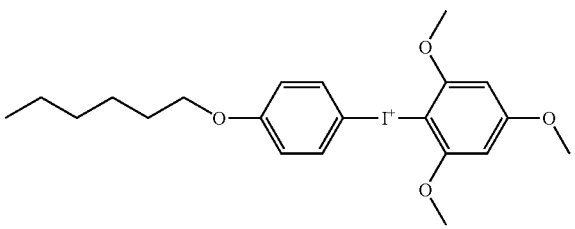
PF$_6^-$
(I-16)
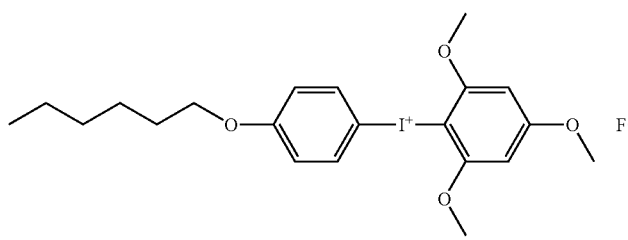 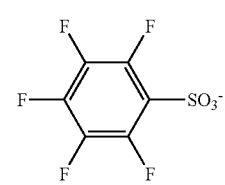
(I-17)
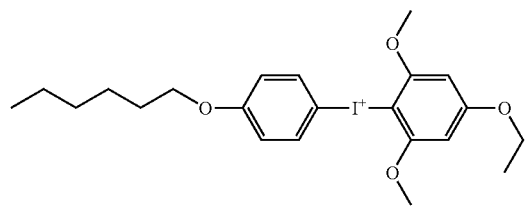
PF$_6^-$
(I-18)
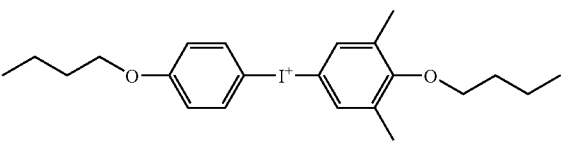
SbF$_6^-$
(I-19)
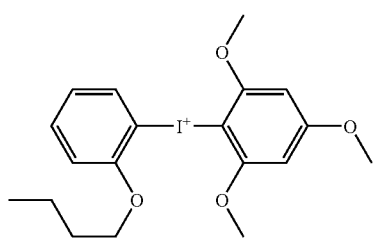
PF$_6^-$
(I-20)
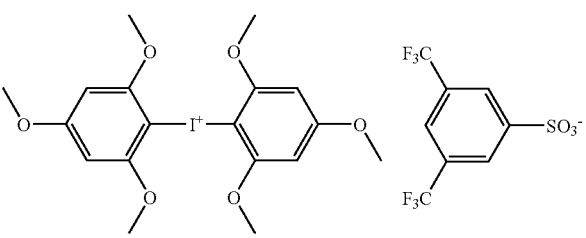
(I-21)
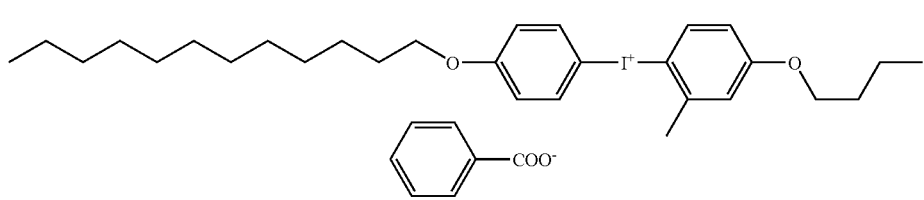
(I-23)
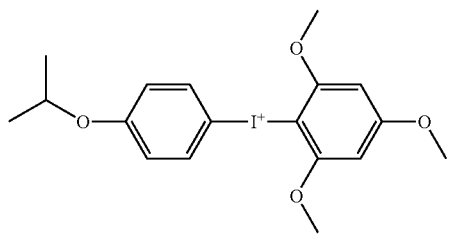
PF$_6^-$
(I-24)
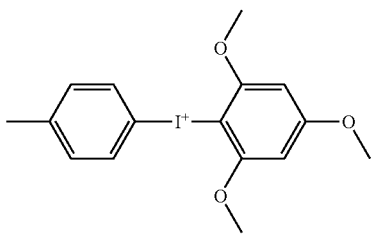
BF$_4^-$ -continued

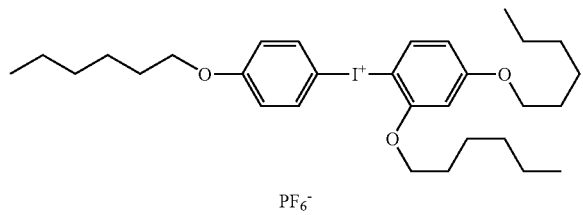
(I-25)

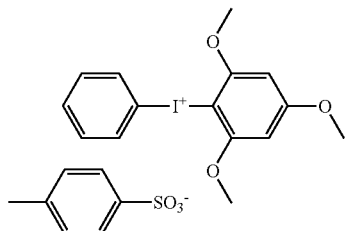
(I-26)

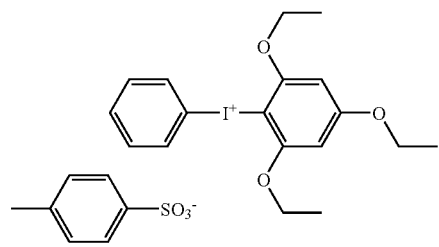
(I-27)

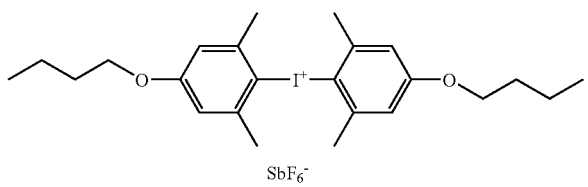
(I-28)

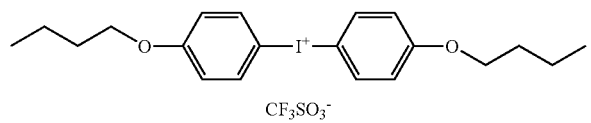
(I-29)

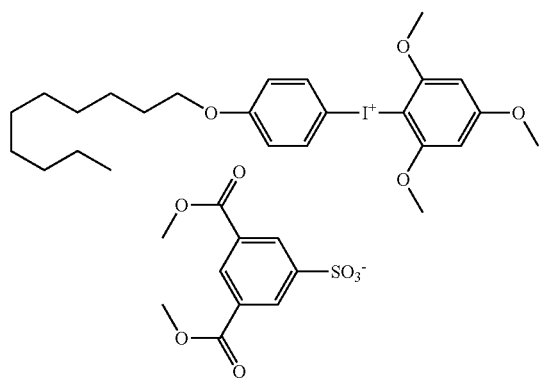
(I-30)

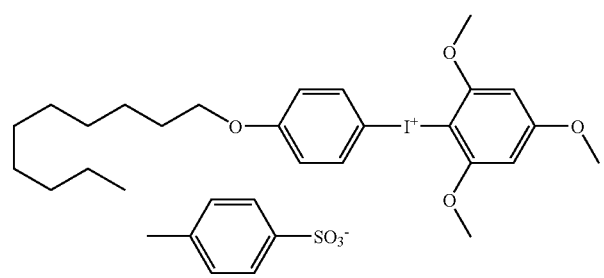
(I-31)

In the polymerizable composition, only one specific iodonium salts (C) may be used, or a combination of two specific iodonium salts (C) may be used.

The specific iodonium salt (C) can be added in an amount of 0.1 to 40 mass %, preferably 0.5 to 30 mass %, more preferably 1 to 20 mass %, relative to the total solid content of the polymerizable composition. Within this range, excellent curing sensitivity and stability can be attained.

When the polymerization initiator according to the invention is used as the image recording layer of the planographic printing plate precursor, excellent recording sensitivity can be achieved, and due to its stability, superior resistance to blemish on the non-image portion at the time of printing can be obtained.

In the polymerizable composition according to the invention, a known polymerization initiator can be used in combination with the specific iodonium salt (C) as far as the effect according to the invention is not impaired.

Examples of polymerization initiators that can be used in combination with the specific iodonium salt (C) include a lophine dimer compound, a disulfone compound, an azo compound, a peroxide compound, an oxime ester compound, a haloalkyl compound, a triazine compound, a borate compound, a sulfonium salt compound, a iodonium salt compound, a diazonium salt compound, and a pyridinium salt compound. The amount of the polymerization initiator used in combination with the specific iodonium salt (C) is preferably 50 mass % or less, more preferably 25 mass % or less, most preferably 10 mass % or less, based on the total amount of the polymerization initiators.

When the polymerizable composition according to the invention is used as the recording layer of the planographic printing plate precursor described later, the polymerization initiator including the specific iodonium salt (C) may not always be contained in the recording layer. Similar effects can be obtained even when the polymerization initiator including the specific iodonium salt (C) is added to another layer provided adjacent to the recording layer.

When the highly stable specific iodonium salt polymerization initiator (C), which is preferable as a polymerization initiator, is used in the recording layer of the planographic printing plate precursor according to the invention described later, radical polymerization reaction proceeds effectively to make the strength of the formed image portion very high. Accordingly, a planographic printing plate having the highly strong image portion can be produced, and as a result, printing durability can be further improved. Since the specific iodonium salt (C) is excellent in stability with time due to the influence of the electron-donating group, there is also an advantage in that undesired polymerization reaction is effectively prevented when the produced planographic printing plate precursor is stored.

(A) Binder Polymer

For the purpose of improving the layer-forming property of the recording image formed, the polymerizable composition according to the invention preferably includes a binder polymer. As the binder polymer, a linear organic polymer is preferably used. The "linear organic polymer" used may be any known linear organic polymer. Preferably, a linear organic polymer soluble or swollen in water or weakly alkaline water is selected so as to enable development in water or in weakly alkaline water.

The linear organic polymer is selected not only as a layer-forming agent for the image recording material. The linear organic polymer may be selected in consideration of the use, such as the developability in water, in weakly alkaline water, or in an organic solvent. For example, water development is possible if a water-soluble organic polymer is used. Examples of such a linear organic polymer include radical polymers having a carboxylic acid group in a side chain, such as those described in JP-A No. 59-44615, Japanese Patent Application Publication (JP-B) No. 54-34327, JP-B No. 58-12577, JP-B No. 54-25957, JP-A No. 54-92723, JP-A No. 59-53836, and JP-A No. 59-71048; that is, resins consisting of a homopolymer or copolymer containing a monomer having a carboxyl group, resins obtained by forming a homopolymer or copolymer containing a monomer having an acid anhydride and converting acid anhydride units in the homopolymer or copolymer to a hydrolysate, half ester or half amide of an acid anhydride, and epoxy acrylates consisting of an epoxy resin modified with unsaturated monocarboxylic acid and acid anhydride. Examples of the monomer having a carboxyl group include acrylic acid, methacrylic acid, itaconic acid, crotonic acid, maleic acid, fumaric acid, and 4-carboxylstyrene. Examples of the monomer having an acid anhydride include maleic anhydride.

Also usable is an acidic cellulose derivative having a carboxylic acid group in a side chain, and a product obtained by adding a cyclic acid anhydride to a polymer having a hydroxyl group.

When a copolymer containing an alkali-soluble resin is used, the copolymer may include a monomer other than the above-mentioned monomer having an acid group. Examples of such an additional monomer include the following compounds (1) to (13):

(1) Acrylic esters and methacrylic esters having an aliphatic hydroxyl group, such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate and 4-hydroxybutyl methacrylate.

(2) Alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyoxyethyl acrylate and propargyl acrylate.

(3) Alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyoxyethyl methacrylate and propargyl methacrylate.

(4) Acrylamides and methacrylamides, such as acrylamide, methacrylamide, N-methylol acrylamide, N-ethyl acrylamide, N-hexyl methacylamide, N-cyclohexyl acrylamide, N-hydroxyethyl acrylamide, N-phenyl acrylamide, N-nitrophenyl acrylamide, N-ethyl-N-phenyl acrylamide, vinyl acrylamide, vinyl methacrylamide, N,N-diallyl acrylamide, N,N-diallyl methacrylamide, allyl acrylamide and allyl methacrylamide.

(5) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether.

(6) Vinyl esters such as vinyl acetate, vinyl chloroacetate, vinyl butyrate and vinyl benzoate.

(7) Styrenes, such as styrene, α-methyl styrene, methyl styrene, chloromethyl styrene and p-acetoxy styrene.

(8) Vinyl ketones such as methyl vinyl ketone, ethyl vinyl ketone, propyl vinyl ketone and phenyl vinyl ketone.

(9) Olefins such as ethylene, propylene, isobutylene, butadiene and isoprene.

(10) N-vinyl pyrrolidone, acrylonitrile, methacrylonitrile etc.

(11) Unsaturated imides such as maleimide, N-acryloyl acrylamide, N-acetyl methacrylamide, N-propionyl methacrylamide and N-(p-chlorobenzoyl) methacrylamide.

(12) Methacrylic acid-based monomers having a heteroatom at the α-position. Examples thereof include compounds described in JP-A Nos. 2001-115595 and 2002-311569.

Among these, (meth)acrylic resins having a carboxyl group and at least one of an allyl group or a vinyl ester group in a side chain, alkali-soluble resins having a double bond in a side chain as described in JP-A No. 2000-187322 and JP-A No. 2002-62698, and alkali-soluble resins having an amide group in a side chain as described in JP-A No. 2001-242612 are preferable because they are excellent in the balance among film strength, sensitivity and developability.

Urethane-containing binder polymers containing an acid group as described in JP-B No. 7-12004, JP-B No. 7-120041, JP-B No. 7-120042, JP-B No. 8-12424, JP-A No. 63-287944, JP-A No. 63-287947, JP-A No. 1-271741 and JP-A No. 10-116232 and urethane-containing binder polymers containing an acid group and a double bond as described in JP-A No. 2002-107918 are very excellent in strength and thus advantageous in respect of printing durability and low-exposure suitability.

Acetal-modified polyvinyl alcohol-containing binder polymers having an acid group as described in EP993966, EP 1204000, and JP-A No. 2001-318463 are preferable because they are excellent in the balance between film strength and developability.

As other water-soluble linear organic compounds, polyvinyl pyrrolidone and polyethylene oxide are useful. To increase the strength of the cured film, alcohol-soluble nylon, polyethers of 2,2-bis-(4-hydroxyphenyl)-propane and epichlorohydrin, etc. are also useful.

The weight-average molecular weight of the binder polymer used in the invention is preferably 5000 or more, more preferably in the range of 10,000 to 300,000, and the number-average molecular weight thereof is preferably 1,000 or more, more preferably in the range of 2,000 to 250,000. Polydispersity (weight-average molecular weight/number-average molecular weight) is preferably 1 or more, more preferably in the range of 1.1 to 10.

The polymer may be a random polymer, a block polymer or a graft polymer.

The polymer used in the invention can be synthesized in a method known in the art. Examples of the solvent used in synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethyl formamide, N,N-dimethyl acetamide, toluene, ethyl acetate, methyl lactate, ethyl lactate, dimethyl sulfoxide, and water. Only one solvent may be used, or a mixture of two or more solvents may be used.

As the radical polymerization initiator used for synthesizing the polymer used in the invention, known compounds such as an azo initiator or a peroxide initiator can be used.

Among the binders described above, binder polymers having a repeating unit represented by the following formula (II) shown in Japanese Patent Application No. 2002-287920, such as 2-methacryloyloxyethylsuccinic acid polymer and 2-methacryloyloxyethylhexahydrophthalic acid copolymer, are preferable from the viewpoint of preventing damage caused by a developer.

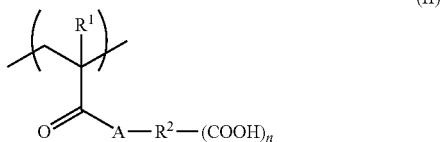

(II)

In formula (II), $R^1$ represents a hydrogen atom or a methyl group; $R^2$ is a linking group composed of two or more atoms selected from the group consisting of carbon atoms, hydrogen atoms, oxygen atoms, nitrogen atoms and sulfur atoms wherein the number of atoms in the linking group is 2 to 82; A represents an oxygen atom or $-NR^3-$ wherein $R^3$ represents a hydrogen atom or a $C_{1-10}$ monovalent hydrocarbon group; and n is an integer of 1 to 5.

In the formula (II) above, the number of atoms in the main skeleton of the linking group represented by $R^2$ is preferably 1 to 30. $R^2$ preferably has an alkylene structure or a structure including alkylene structures linked via ester linkages.

Hereinafter, the repeating units represented by the formula (II) will be described in detail.

$R^1$ in the formula (II) represents a hydrogen atom or a methyl group, preferably a methyl group.

The linking group represented by $R^2$ in the formula (II) is a linking group composed of two or more atoms selected from the group consisting of carbon atoms, hydrogen atoms, oxygen atoms, nitrogen atoms and sulfur atoms wherein the number of atoms in the linking group is 2 to 82, preferably 2 to 50, more preferably 2 to 30. When the linking group has substituent(s), the number of atoms refers to the number of atoms including the atoms in the substituent(s) on the linking group.

Specifically, the number of atoms in the main skeleton of the linking group represented by $R^2$ is preferably 1 to 30, more preferably 3 to 25, still more preferably 4 to 20, most preferably 5 to 10. The "main skeleton of the linking group" in the invention refers to an atom or an atomic group serving to link A to the terminal COOH in the formula (II). When plural linking routes are present, the main skeleton refers to the atom or atomic group constituting the linking route having the smallest number of atoms. Accordingly, when the linking group has a cyclic structure, the number of atoms to be used for calculation varies depending on the linking site (for example, o-, m-, p- etc.).

The structure of the specific binder polymer according to the invention, and the number of atoms constituting the main skeleton of the linking group represented by $R^2$ in the structure and the method of calculating the number of atoms, are both shown below.

| | Number of atoms constituting the main skeleton of the linking group |
|---|---|
| (1) 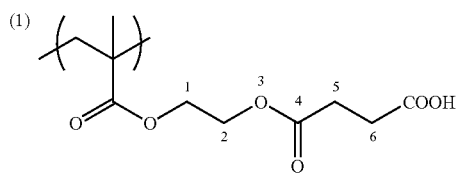 | |
| (2) 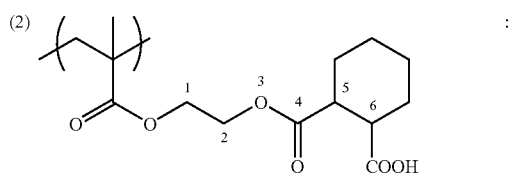 | :6 |

-continued

| | Number of atoms constituting the main skeleton of the linking group |
|---|---|
| (3) 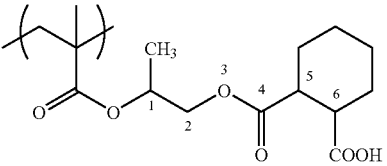 | :6 |
| (4) 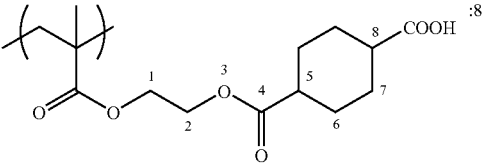 | :8 |
| (5) 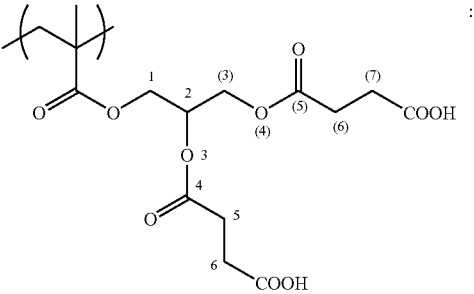 | :6 |
| (6) 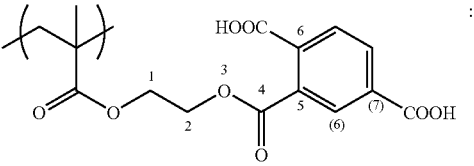 | :6 |
| (7) 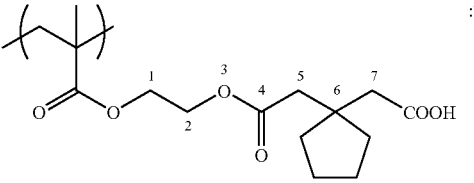 | :7 |
| (8) 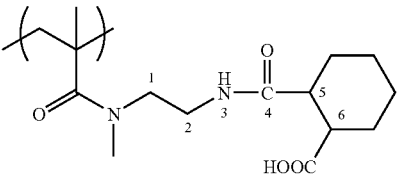 | :6 |

The linking group represented by $R^2$ in the formula (II) is more specifically an alkylene, a substituted alkylene, an arylene, a substituted arylene, or a group in which plural divalent groups, such as those described above, are linked via amide or ester linkages.

A linking group in the chain structure may be ethylene, propylene etc. A structure including such alkylene groups linked via ester linkages is also preferable.

The linking group represented by $R^2$ in the formula (II) is preferably a (n+1)-valent hydrocarbon group having a $C_{3-30}$ alicyclic structure. Examples thereof include (n+1)-valent hydrocarbon groups obtained by removing (n+1) hydrogen atoms on one or more arbitrary carbon atoms constituting a compound having an alicyclic structure such as cyclopropane, cyclopentane, cyclohexane, cycloheptane, cyclooctane, cyclodecane, dicyclohexyl, tertiary cyclohexyl or norbornane which may be substituted by one or more arbitrary substituents. $R^2$ preferably has 3 to 30 carbon atoms including the carbon atoms in the substituent(s) if any.

One or more arbitrary carbon atoms in the compound having an alicyclic structure may be substituted by one or more heteroatoms selected from the group consisting of nitrogen atoms, oxygen atoms and sulfur atoms. In respect of printing durability, $R^2$ is preferably a (n+1)-valent hydrocarbon group having an alicyclic structure which may have a substituent and which includes two or more rings and has 5 to 30 carbon atoms, such as a condensed polycyclic aliphatic hydrocarbon, a crosslinked alicyclic hydrocarbon, a spiroaliphatic hydrocarbon, and a combination of aliphatic hydrocarbon rings (a structure in which rings are combined by bonds or via linking groups). The number of carbon atoms refers to the number of carbon atoms including the carbon atoms in the substituent(s) if any.

The linking group represented by $R^2$ preferably has five to ten atoms. The structure of the linking group is preferably a chain structure. The chain structure preferably include an ester linkage or such a cyclic structure as described above.

A substituent which can be introduced into the linking group represented by $R^2$ may be a monovalent non-metal atomic group excluding hydrogen, and examples thereof include a halogen atom (—F, —Br, —Cl, —I), a hydroxyl group, an alkoxy group, an aryloxy group, a mercapto group, an alkyl thio group, an aryl thio group, an alkyl dithio group, an aryl dithio group, an amino group, a N-alkyl amino group, a N,N-dialkyl amino group, a N-aryl amino group, a N,N-diaryl amino group, a N-alkyl-N-aryl amino group, an acyloxy group, a carbamoyloxy group, a N-alkylcarbamoyloxy group, a N-aryl carbamoyloxy group, a N,N-dialkyl carbamoyloxy group, a N,N-diaryl carbamoyloxy group, a N-alkyl-N-aryl carbamoyloxy group, an alkyl sulfoxy group, an aryl sulfoxy group, an acyl thio group, an acyl amino group, a N-alkyl acyl amino group, a N-aryl acyl amino group, a ureido group, a N'-alkyl ureido group, a N',N'-dialkyl ureido group, a N'-aryl ureido group, a N',N'-diaryl ureido group, a N'-alkyl-N'-aryl ureido group, a N-alkyl ureido group, a N-aryl ureido group, a N'-alkyl-N-alkyl ureido group, a N'-alkyl-N-aryl ureido group, a N',N'-dialkyl-N-alkyl ureido group, a N',N'-dialkyl-N-aryl ureido group, a N'-aryl-N-alkyl ureido group, a N'-aryl-N-aryl ureido group, a N',N'-diaryl-N-alkyl ureido group, a N',N'-diaryl-N-aryl ureido group, a N'-alkyl-N'-aryl-N-alkyl ureido group, a N'-alkyl-N'-aryl-N-aryl ureido group, an alkoxy carbonyl amino group, an aryloxy carbonyl amino group, a N-alkyl-N-alkoxycarbonyl amino group, a N-alkyl-N-aryloxy carbonyl amino group, a N-aryl-N-alkoxycarbonyl amino group, a N-aryl-N-aryloxycarbonyl amino group, a formyl group, an acyl group, a carboxyl group and its conjugate base group, an alkoxy carbonyl group, an aryloxy carbonyl group, a carbamoyl group, a N-alkyl carbamoyl group, a N,N-dialkyl carbamoyl group, a N-aryl carbamoyl group, a N,N-diaryl carbamoyl group, a N-alkyl-N-aryl carbamoyl group, an alkyl sulfinyl group, an aryl sulfinyl group, an alkyl sulfonyl group, an aryl sulfonyl group, a sulfo group (—$SO_3H$) and its conjugate base group, an alkoxy sulfonyl group, an aryloxy sulfonyl group, a sulfinamoyl group, a N-alkyl sulfinamoyl group, a N,N-dialkyl sulfinamoyl group, a N-aryl sulfinamoyl group, a N,N-diaryl sulfinamoyl group, a N-alkyl-N-aryl sulfinamoyl group, a sulfamoyl group, a N-alkyl sulfamoyl group, a N,N-dialkyl sulfamoyl group, a N-aryl sulfamoyl group, a N,N-diaryl sulfamoyl group, a N-alkyl-N-aryl sulfamoyl group, a N-acyl sulfamoyl group and its conjugate base group, a N-alkyl sulfonyl sulfamoyl group (—$SO_2NHSO_2$ (alkyl)) and its conjugate base group, a N-aryl sulfonyl sulfamoyl group (—$SO_2NHSO_2$ (allyl)) and its conjugate base group, a N-alkyl sulfonyl carbamoyl group (—$CONHSO_2$ (alkyl)) and its conjugate base group, a N-aryl sulfonyl carbamoyl group (—$CONHSO_2$ (aryl)) and its conjugate base group, an alkoxy silyl group (—$Si(O\text{-alkyl})_3$), an aryloxy silyl group (—$Si(O\text{-aryl})_3$), a hydroxysilyl group (—$Si(OH)_3$) and its conjugate base group, a phosphono group (—$PO_3H_2$) and is conjugate base group, a dialkyl phosphono group (—$PO_3$ (alkyl)$_2$), a diaryl phosphono group (—$PO_3(\text{aryl})_2$), an alkyl aryl phosphono group (—$PO_3(\text{alkyl})(\text{aryl})$), a monoalkyl phosphono group (—$PO_3H(\text{alkyl})$) and its conjugate base group, a monoaryl phosphono group (—$PO_3H(\text{aryl})$) and its conjugate base group, a phosphonoxy group (—$OPO_3H_2$) and its conjugate base group, a dialkyl phosphonoxy group (—$OPO_3(\text{alkyl})_2$), a diaryl phosphonoxy group (—$OPO_3$ (aryl)$_2$), an alkyl aryl phosphonoxy group (—$OPO_3(\text{alkyl})$(aryl)), a monoalkyl phosphonoxy group (—$OPO_3H(\text{alkyl})$) and its conjugate base group, a monoaryl phosphonoxy group (—$OPO_3H(\text{aryl})$) and its conjugate base group, a cyano group, a nitro group, a dialkyl boryl group (—$B(\text{alkyl})_2$), a diaryl boryl group (—$B(\text{aryl})_2$), an alkyl aryl boryl group (—$B(\text{alkyl})(\text{aryl})$), a dihydroxy boryl group (—$B(OH)_2$) and its conjugate base group, an alkyl hydroxy boryl group (—$B(\text{alkyl})(OH)$) and its conjugate base group, an aryl hydroxy boryl group (—$B(\text{aryl})(OH)$) and its conjugate base group, an aryl group, an alkenyl group and an alkynyl group.

When the polymerizable composition according to the invention is used as the recording layer of the planographic printing plate precursor, a substituent having a hydrogen atom capable of hydrogen bonding, particularly a substituent having acidity whose acid dissociation constant (pKa) is lower than that of carboxylic acid, may not be preferable because it tends to lower printing durability. On the other hand, a hydrophobic substituent such as a halogen atom, a hydrocarbon group (alkyl group, aryl group, alkenyl group, or alkynyl group), an alkoxy group and an aryloxy group is preferable because it tends to improve printing durability. In particular, when the cyclic structure is a six-membered or lower-membered monocyclic aliphatic hydrocarbon such as cyclopentane or cyclohexane, the hydrocarbon preferably has such hydrophobic substituents. If possible, these substituents may be bound to one another or to a substituted hydrocarbon group to form a ring. The substituents may themselves be substituted.

When A in the formula (II) is $NR^3$—, $R^3$ represents a hydrogen atom or a $C_{1-10}$ monovalent hydrocarbon group. Examples of the $C_{1-10}$ monovalent hydrocarbon group represented by $R^3$ include an alkyl group, an aryl group, an alkenyl group and an alkynyl group.

Examples of the alkyl group include a $C_{1-10}$ linear, branched or cyclic alkyl group such as a methyl group, an ethyl group, a propyl group, a butyl group, a pentyl group, a hexyl group, a heptyl group, an octyl group, a nonyl group, a decyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclopentyl group, a cyclohexyl group, a 1-adamanthyl group and a 2-norbornyl group.

Examples of the aryl group include a $C_{1-10}$ aryl group such as a phenyl group, a naphthyl group and indenyl group, a $C_{1-10}$ heteroaryl group containing one heteroatom selected from the group consisting of a nitrogen atom, an oxygen atom and a sulfur atom, for example a Furyl group, a thienyl group, a pyrrolyl group, a pyridyl group and a quinolyl group.

Examples of the alkenyl group include a $C_{1-10}$ linear, branched or cyclic alkenyl group such as a vinyl group, a 1-propenyl group, a 1-butenyl group, a 1-methyl-1-propenyl group, a 1-cyclopentenyl group and a 1-cyclohexenyl group.

Examples of the alkynyl group include a $C_{1-10}$ alkynyl group such as an ethynyl group, a 1-propynyl group, a 1-butynyl group and a 1-octynyl group. Substituents that $R^3$ may have include the same substituents as those mentioned above as the substituents that $R^2$ may have. The number of carbon atoms in $R^3$, including the number of carbon atoms in its substituent, is 1 to 10.

A in the formula (II) is preferably an oxygen atom or —NH— in respect of easy synthesis.

n in the formula (II) is an integer of 1 to 5, preferably 1 in respect of printing durability.

Preferable examples of the repeating unit represented by the formula (II) in a favourable binder polymer are shown below, but the examples should not be construed as limiting the invention.

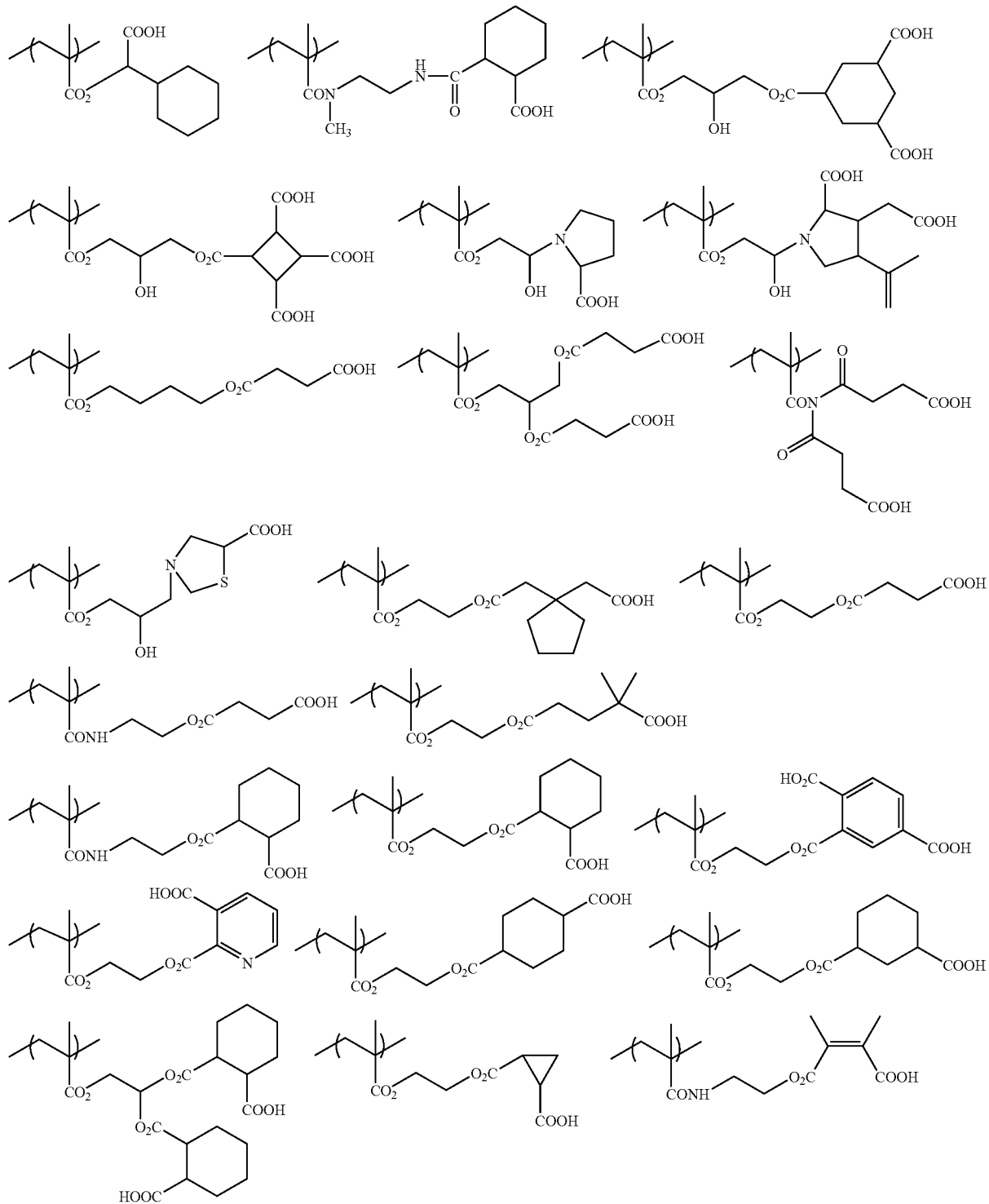

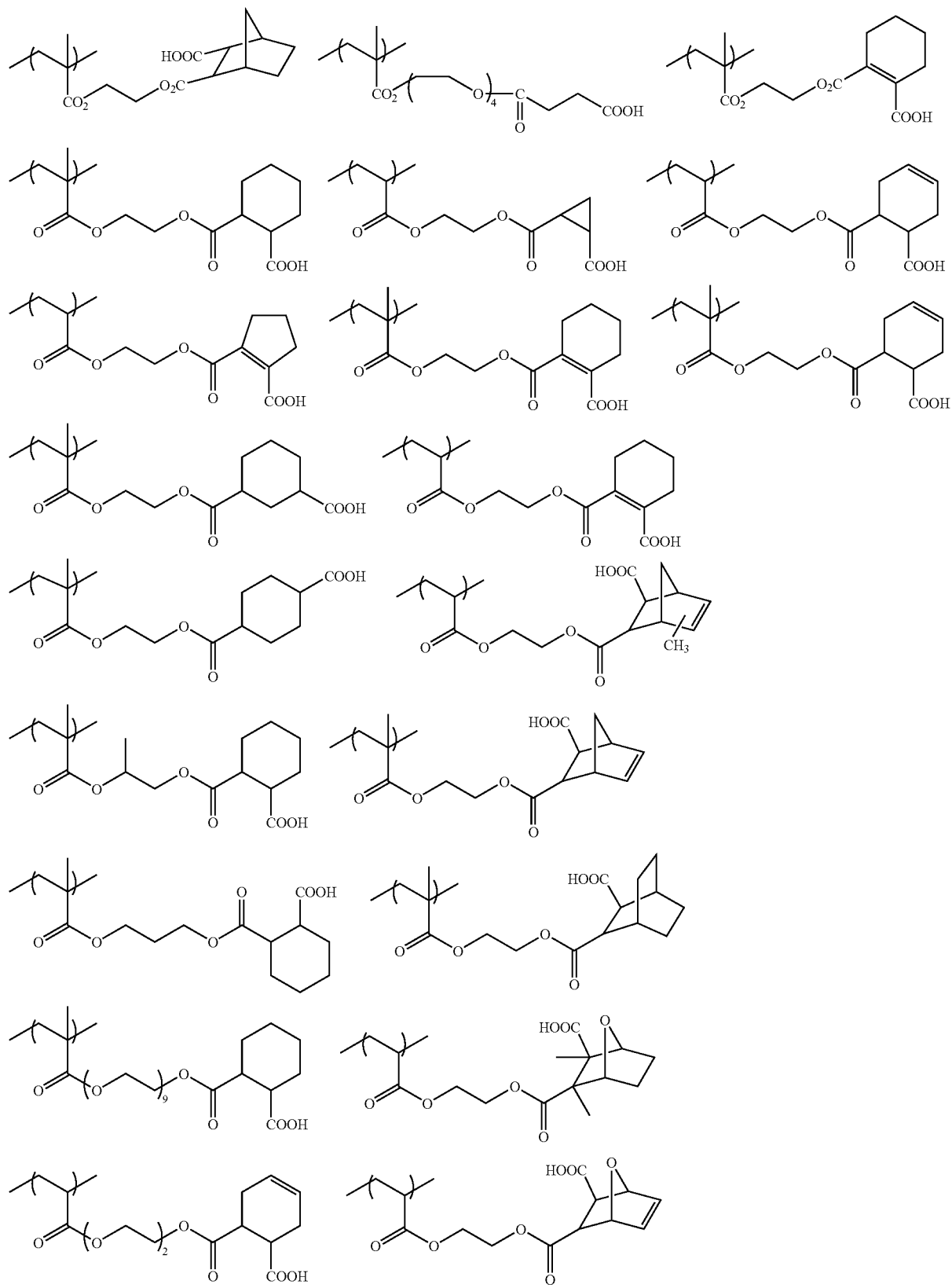

-continued
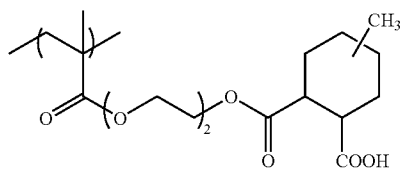 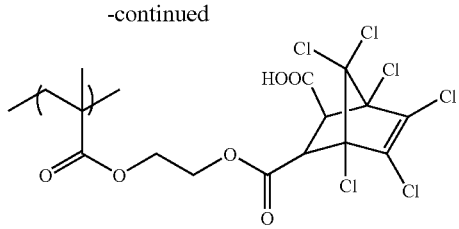
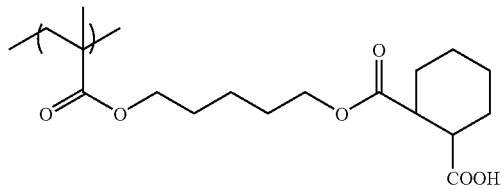
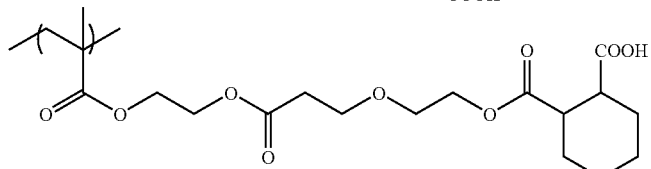 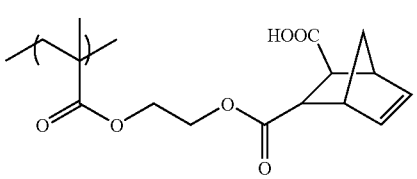
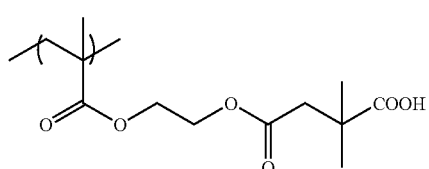 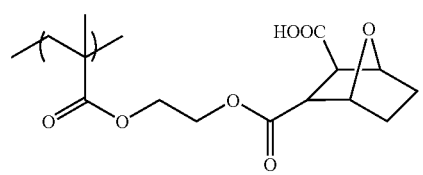
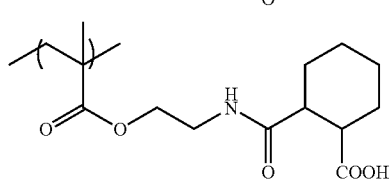 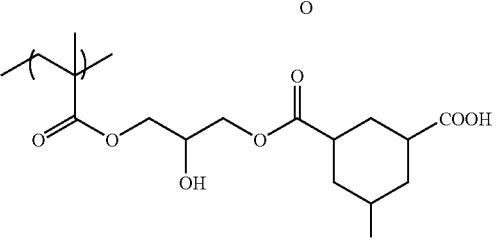
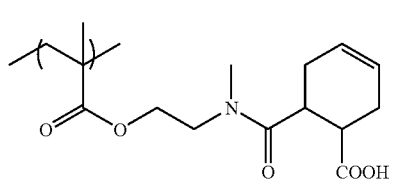
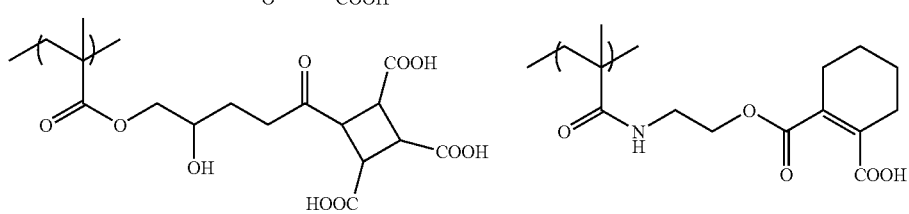
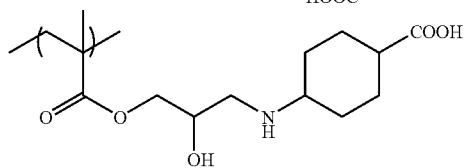 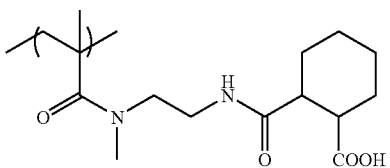
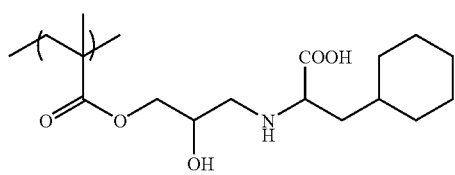 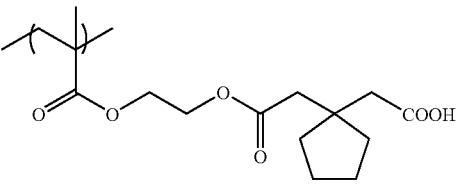

-continued
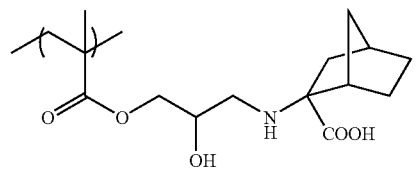
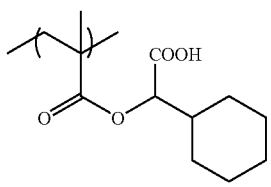
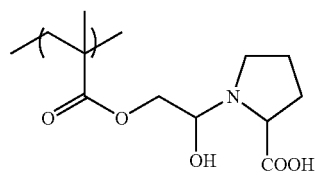
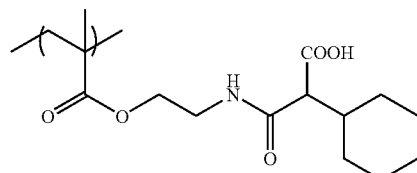
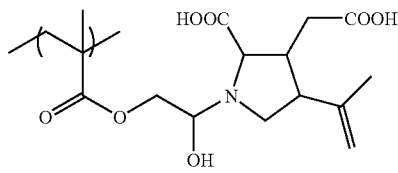
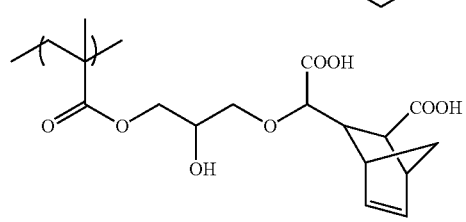
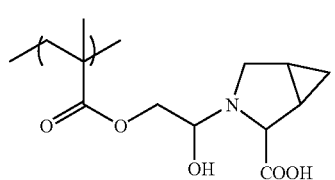
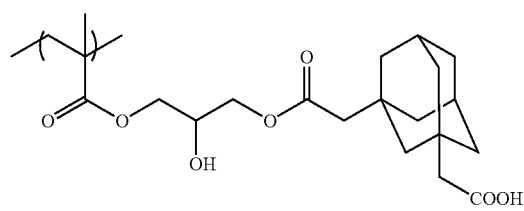
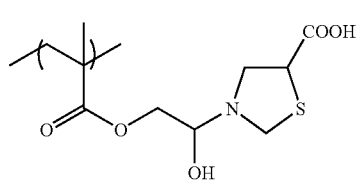
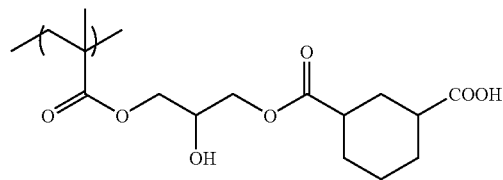
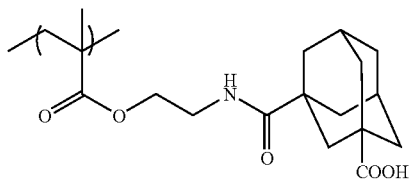
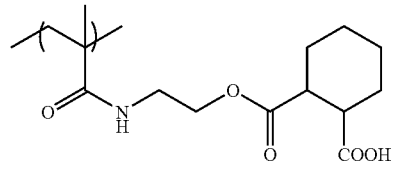
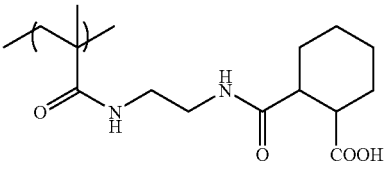
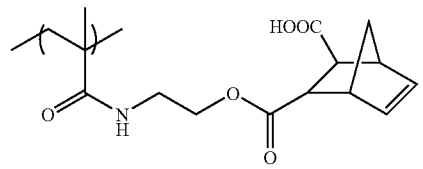
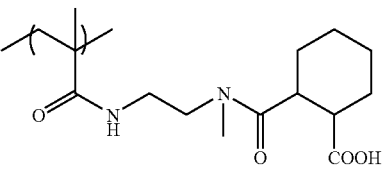
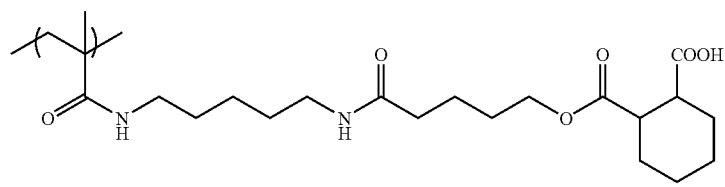
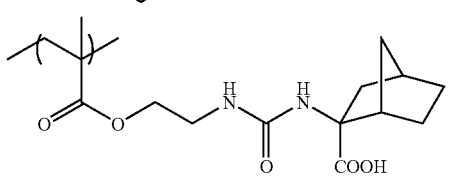

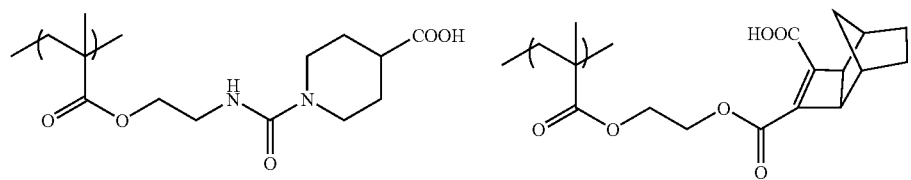
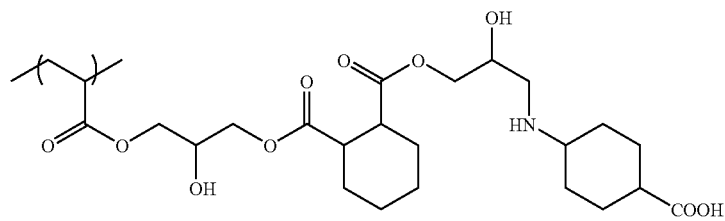
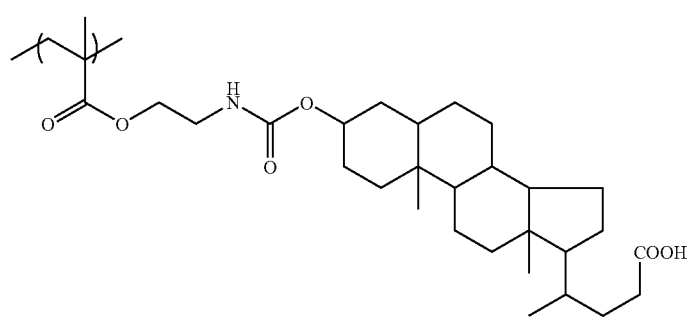
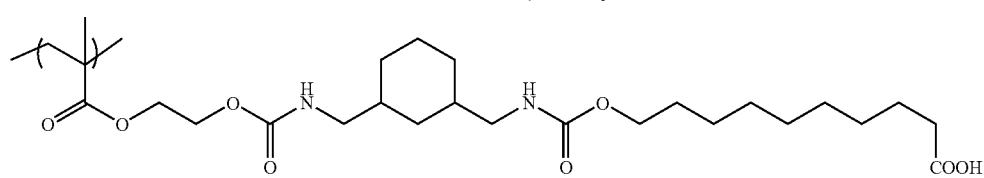
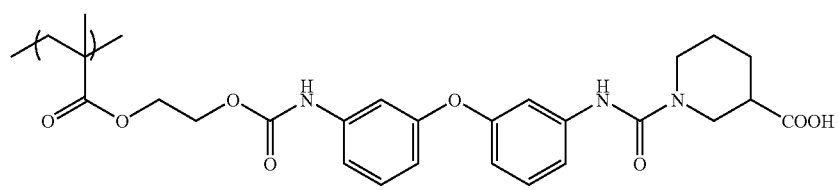
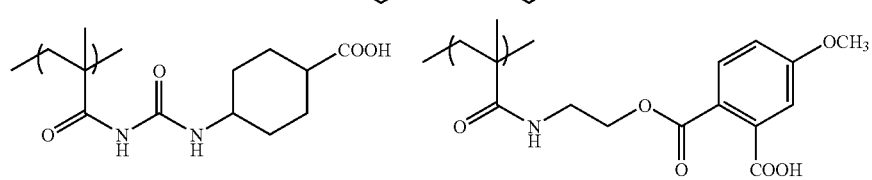
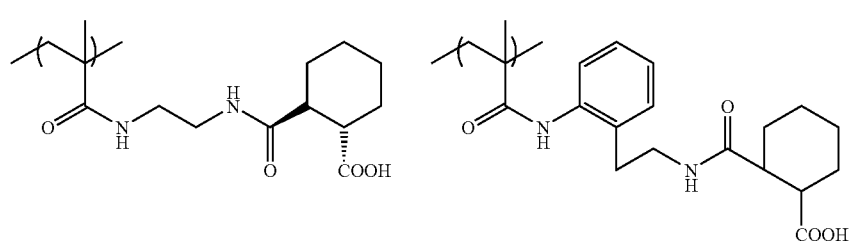
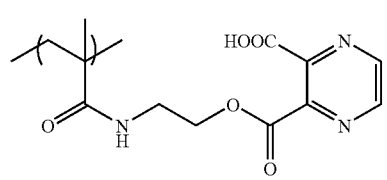

In an embodiment, one kind of repeating unit represented by formula (II) is included in the binder polymer. In another embodiment, two or more kinds of repeating unit represented by the formula (II) are contained in the binder polymer. The binder polymer preferred in the invention may be a polymer composed exclusively of the repeating unit represented by the formula (II), but is generally used as a copolymer containing one or more other copolymerizable components. The total content of the repeating unit represented by the formula (II) in the copolymer is determined suitably depending on the structure of the copolymer, the design of the polymerizable composition, etc., but is preferably 1 to 99 mol-%, more preferably 5 to 40 mol-%, still more preferably 5 to 20 mol-%, based on the total molar amount of the polymer components.

When a copolymer containing the repeating unit represented by formula (II) is used, other copolymer components than the repeating unit represented by formula (II) may be selected from radical polymerizable monomers known in the art without particular limitation. Specific examples include monomers described in Polymer Data Handbook—Fundamental Version—(in Japanese) compiled by the Society of Polymer Science, Japan and published by Baifukan, 1986. Such additional copolymerizable components may include only one copolymerization component, or a combination of two or more compolymerization components.

Among the binder polymers shown above, particularly [allyl (meth)acrylate/(meth)acrylic acid/optional other addition-polymerizable vinyl monomer] copolymer, polymers containing an acryl group, methacryl group and allyl group as described in JP-A No. 2000-131837, JP-A No. 2002-62648, JP-A No. 2000-187322, or the above Japanese Patent Application No. 2002-287920 are preferable because they are excellent in the balance among film strength, sensitivity and developability.

Most preferable among those described above are polymers having a repeating unit represented by the formula (II) above and a radical polymerizable group (carbon-carbon double bond) having a structure represented by any of the following formula (III) to (V):

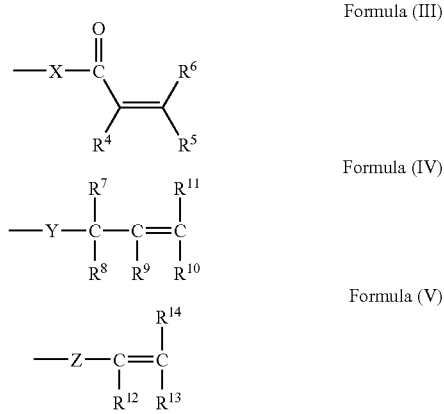

Formula (III)

Formula (IV)

Formula (V)

In the formulae (III) to (V), $R^4$ to $R^{14}$ each independently represent a hydrogen atom or a monovalent substituent; X and Y each independently represent an oxygen atom, a sulfur atom or $N-R^{15}$; Z represents an oxygen atom, a sulfur atom, $-N-R^{15}$ or a phenylene group wherein $R^{15}$ represents a hydrogen atom or a monovalent organic group.

In the formula (III) above, $R^4$ to $R^6$ each independently represent a hydrogen atom or a monovalent substituent. $R^4$ may be a hydrogen atom or an optionally substituted organic group such as an alkyl group. In particular, specifically, a hydrogen atom, a methyl group, a methylalkoxy group or a methyl ester group is preferable. $R^5$ and $R^6$ each independently represent a hydrogen atom, a halogen atom, an amino group, a dialkylamino group, a carboxyl group, an alkoxycarbonyl group, a sulfo group, a nitro group, a cyano group, an optionally substituted alkyl group, an optionally substituted aryl group, an optionally substituted alkoxy group, an optionally substituted aryloxy group, an optionally substituted alkylamino group, an optionally substituted arylamino group, an optionally substituted alkylsulfonyl group and an optionally substituted arylsulfonyl group, among which a hydrogen atom, a carboxyl group, an alkoxycarbonyl group, an optionally substituted alkyl group and an optionally substituted aryl group are preferable.

Substituents which can be introduced into these groups include a methoxycarbonyl group, an ethoxycarbonyl group, an isopropioxycarbonyl group, a methyl group, an ethyl group, and a phenyl group.

X represents an oxygen atom, a sulfur atom or $-N-R^{15}$ wherein $R^{15}$ includes an optionally substituted alkyl group etc.

In the formula (W) above, $R^7$ to $R^{11}$ each independently represent a hydrogen atom or a monovalent substituent, and examples of $R^7$ to $R^{11}$ include a hydrogen atom, a halogen atom, an amino group, a dialkylamino group, a carboxyl group, an alkoxycarbonyl group, a sulfo group, a nitro group, a cyano group, an optionally substituted alkyl group, an optionally substituted aryl group, an optionally substituted alkoxy group, an optionally substituted aryloxy group, an optionally substituted alkylamino group, an optionally substituted arylamino group, an optionally substituted alkylsulfonyl group and an optionally substituted arylsulfonyl group, among which a hydrogen atom, a carboxyl group, an alkoxycarbonyl group, an optionally substituted alkyl group and an optionally substituted aryl group are preferable.

Substituents which can be introduced into these groups include the substituents mentioned above as examples of the substituents that can be introduced in the explanation of the formula (II).

Y represents an oxygen atom, a sulfur atom or $-N-R^{15}$. Examples of $R^{15}$ include the same groups as mentioned in the formula (III).

In the formula (V) above, $R^{12}$ to $R^{14}$ each independently represent a hydrogen atom or a monovalent substituent, and specific examples include a hydrogen atom, a halogen atom, an amino group, a dialkylamino group, a carboxyl group, an alkoxycarbonyl group, a sulfo group, a nitro group, a cyano group, an optionally substituted alkyl group, an optionally substituted aryl group, an optionally substituted alkoxy group, an optionally substituted aryloxy group, an optionally substituted alkylamino group, an optionally substituted arylamino group, an optionally substituted alkylsulfonyl group and an optionally substituted arylsulfonyl group, among which a hydrogen atom, a carboxyl group, an alkoxycarbonyl group, an optionally substituted alkyl group and an optionally substituted aryl group are preferable.

Substituents which can be introduced into these groups include the substituents mentioned above as examples of the substituents that can be introduced in the formula (III).

Z represents an oxygen atom, a sulfur atom, $-N-R^{15}$ or a phenylene group. Examples of $R^{15}$ include the same groups as mentioned in the formula (III).

Among these radical-polymerizable groups, radical-polymerizable groups having a structure represented by the formulas (III) or (IV) are preferable.

In an embodiment, only one of such binder polymers is used. In another embodiment, a mixture of two or more of such binder polymers is used.

The molecular weight of the binder polymer (A) in the invention can be suitably determined from the viewpoint of image-forming property and printing durability. Usually the molecular weight is preferably in the range of 2,000 to 1,000,000, more preferably 5,000 to 500,000, still more preferably 10,000 to 200,000.

The binder polymer (A) used in the invention is a polymer substantially insoluble in water but soluble in an aqueous alkali solution. It follows that as the developer, an environmentally undesirable organic solvent is not used, or the amount of such an organic solvent can be limited to a very small amount. The acid value (i.e. acid content per g of the polymer, expressed in terms of chemical equivalence) and molecular weight of the binder polymer (A) are suitably selected from the viewpoint of image strength and developability. The acid value is preferably in the range of 0.4 to 3.0 meq/g, and the molecular weight is preferably 2,000 to 500,000, and more preferably, the acid value is in the range of 0.6 to 2.0, and the molecular weight is in the range of 10,000 to 300,000.

The total amount (content) of the binder polymer in the polymerizable composition according to the invention or in the recording layer of the planographic printing plate precursor can be suitably determined and is usually 10 to 90 mass %, preferably 20 to 80 mass %, more preferably 30 to 70 mass %, based on the total mass of the nonvolatile components.

(B) Polymerizable Compound Having an Unsaturated Group

A polymerizable compound having an unsaturated group (hereinafter referred to sometimes as polymerizable compound) is contained in the polymerizable composition according to the invention or in the recording layer of the planographic printing plate precursor according to the invention.

The polymerizable compound used in the invention is preferably an addition-polymerizable compound having at least one ethylenically unsaturated double bond and is selected preferably from compounds each having at least one, preferably two or more, terminal ethylenically unsaturated bonds. A group of such compounds is well-known in this industrial field, and in the invention, these compounds can be used without any particular limitation. The scope of these compounds include those in chemical forms such as monomers, prepolymers (i.e., dimers, trimers and oligomers), as well as mixtures and copolymers thereof.

Examples of such monomers and copolymers include unsaturated carboxylic acids (e.g., acrylic acid, methacrylic acid, itaconic acid, crotonic acid, isocrotonic acid, maleic acid etc.) and esters and amides thereof, and preferably used among these compounds are esters between unsaturated carboxylic acids and aliphatic polyvalent alcohols and amides between unsaturated carboxylic acids and aliphatic polyvalent amines. Also preferably used among these compounds are unsaturated carboxylic esters having a nucleophilic substituent such as a hydroxyl group, an amino group or a mercapto group, addition-reaction products of amides with monofunctional or multifunctional isocyanates or epoxy compounds, and dehydration condensation reaction products of amides with monofunctional or multifunctional carboxylic acids.

Also preferably used among these compounds are unsaturated carboxylic esters having an electrophilic substituent such as an isocyanate group or an epoxy group, addition-reaction products of amides with monofunctional or multifunctional alcohols, amines or thiols, unsaturated carboxylic esters having an eliminating substituent such as a halogen group and a tosyloxy group, and substitution-reaction products of amides with monofunctional or multifunctional alcohols, amines or thiols. Compounds obtained by replacing the above-described carboxylic acids with unsaturated phosphonic acids, styrene, vinyl ethers etc.

Examples of the ester monomers between aliphatic polyvalent alcohols and unsaturated carboxylic acids include:

acrylic esters such as ethylene glycol diacrylate, triethylene glycol diacrylate, 1,3-butane diol diacrylate, tetramethylene glycol diacrylate, propylene glycol diacrylate, neopentyl glycol diacrylate, trimethylol propane triacrylate, trimethylol propane tri(acryloyloxypropyl)ether, trimethylol ethane triacrylate, hexane diol diacrylate, 1,4-cyclohexane diol diacrylate, tetraethylene glycol diacrylate, pentaerythritol diacrylate, pentaerythritol triacrylate, pentaerythritol tetracrylate, dipentaerythritol diacrylate, dipentaerythritol hexacrylate, sorbitol triacrylate, sorbitol tetracrylate, sorbitol pentacrylate, sorbitol hexacrylate, tri(acryloyloxyethyl) isocyanurate, and polyester acrylate oligomers;

methacrylic esters such as tetramethylene glycol dimethacrylate, triethylene glycol dimethacrylate, neopentyl glycol dimethacrylate, trimethylol propane trimethacrylate, trimethylol ethane trimethacrylate, ethylene glycol dimethacrylate, 1,3-butane diol dimethacrylate, hexane diol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethyl methane, and bis[p-(methacryloxyethoxy)phenyl]dimethyl methane;

itaconic esters such as ethylene glycol diitaconate, propylene glycol diitaconate, 1,3-butane diol diitaconate, 1,4-butane diol diitaconate, tetramethylene glycol diitaconate, pentaerythritol diitaconate, and sorbitol tetraitaconate;

crotonic esters such as ethylene glycol dicrotonate, tetramethylene glycol dicrotonate, pentaerythritol dicrotonate, sorbitol tetradicrotonate;

isocrotonic esters such as ethylene glycol diisocrotonate, pentaerythritol diisocrotonate, and sorbitol tetraisocrotonate; and maleic esters such as ethylene glycol dimaleate, triethylene glycol dimaleate, pentaerythritol dimaleate, and sorbitol tetramaleate.

Other examples of preferable esters include aliphatic alcohol-based esters described in JP-B No. 46-27926, JP-B No. 51-47334 and JP-A No. 57-196231, those having an aromatic skeleton described in JP-A No. 59-5240, JP-A No. 59-5241 and JP-A No. 2-226149, and those having an amino group described in JP-A No. 1-165613.

In an embodiment, a mixture of such ester monomers is used.

Examples of monomers of the amides between aliphatic polyvalent amine compounds and unsaturated carboxylic acids include methylene bis-acrylamide, methylene bis-methacrylamide, 1,6-hexamethylene bis-acrylamide, 1,6-hexamethylene bis-methacrylamide, diethylene triamine trisacrylamide, xylylene bisacrylamide, and xylylene bis-methacrylamide.

Preferable examples of other amide-containing monomers include those having a cyclohexylene structure described in JP-B No. 54-21726.

Urethane-containing addition-polymerizable compounds produced by addition reaction between isocyanates and hydroxyl groups are also preferable, and examples thereof include a vinyl urethane compound containing two or more polymerizable vinyl groups in one molecule which is prepared by adding a vinyl monomer containing a hydroxyl group shown in the formula below to a polyisocyanate compound having two or more isocyanate groups in one molecule as described in JP-B No. 48-41708.

In the above formula, R and R' each independently represent H or $CH_3$.

Urethane acrylates described in JP-A No. 51-37193, JP-B No. 2-32293 and JP-B No. 2-16765 and urethane compounds having an ethylene oxide-based skeleton described in JP-B No. 58-49860, JP-B No. 56-17654, JP-B No. 62-39417 and JP-B No. 62-39418 are also preferable.

Addition-polymerizable compounds having an amino structure or sulfide structure in the molecule as described in JP-A No. 63-277653, JP-A No. 63-260909 and JP-A No. 1-105238 can be used to prepare heat-sensitive compositions excellent in curing speed.

As other examples, multifunctional acrylates and methacrylates such as polyester acrylates and epoxy acrylates obtained by reacting epoxy resin with (meth)acrylic acid, as described in JP-A No. 48-64183, JP-B No. 49-43191 and JP-B 52-30490, can be mentioned. Specific unsaturated compounds described in JP-B No. 46-43946, JP-B No. 1-40337 and JP-B No. 1-40336 and vinyl phosphonic acid-based compounds described in JP-A No. 2-25493 can also be mentioned. In some cases, a structure containing a perfluoroalkyl group described in JP-A No. 61-22048 is preferably used. Photosetting monomers and oligomers described in the Journal of Japanese Adhesive Society, vol. 20, No. 7, pp. 300-308 (1984) can also be used.

Details of the use of the polymerizable compounds—what structure is used, whether they are used singly or in combination, and the addition amount—can be arbitrarily determined in accordance with the performance and design of the final photosensitive material. For example, they are selected from the following viewpoints. In respect of photoresponse speed, their structure preferably has a high unsaturated group content per one molecule, and in many cases, they are preferably bifunctional or higher-functional. To increase the strength of an image portion i.e. the cured layer, they are preferably trifunctional or higher-functional. It is also effective to use a method of regulating both photosensitivity and strength by combined use of compounds (e.g. acrylic esters, methacrylic esters, styrene-containing compounds, and vinyl ether-containing compounds) having different functionalities and different polymerizable groups. Compounds having a higher molecular weight or compounds with higher hydrophobicity, though being excellent in photoresponse speed and layer strength, may be undesirable in some cases in respect of developing speed and precipitation in the developer.

A higher content of the polymerizable compound (B) is advantageous in respect of sensitivity. However, when the content is excessively high, there may be problems in undesirable phase separation, troubles in production process caused by the adhesiveness of the composition (e.g., defects in production process caused by transfer and adhesion of components in the photosensitive component), and separation from the developer when used in a planographic printing plate precursor. From these viewpoints, the content of the polymerizable compound (B) in the polymerizable composition according to the invention or in the recording layer of the planographic printing plate precursor is preferably in the range of 20 to 70% by weight, more preferably 25 to 50% by weight, based on the total solid content.

In an embodiment, only one polymerizable compound (B) is used. In another embodiment, two or more polymerizable compounds (B) are used.

The method of selecting and using the polymerizable compound is an important factor for compatibility and dispersibility with other components (e.g. a binder polymer, an initiator, a colorant etc.) in the recording layer used in the planographic printing plate precursor, and the compatibility may be improved by using e.g. a low-purity compound or a combination of two or more compounds.

(D) Compound Having Absorption Maximum at 700 to 1200 nm

From the viewpoint of improvement of sensitivity, a compound having absorption maximum at 700 to 1200 nm is preferably contained in the polymerizable composition or in the recording layer of the planographic printing plate precursor. By adding such a compound, the polymerizable composition according to the invention has responsiveness in the infrared wavelength range.

From the viewpoint of compatibility with an easily available high-power laser, the compound having absorption maximum at wavelengths of 700 to 1200 nm is preferably an infrared absorbing dye or pigment having absorption maximum at wavelengths of 760 to 1200 nm.

The dye may be any one of commercial dyes including known dyes described in e.g. "Senryo Binran" (Dye Handbook) (published in 1970 and compiled by Society of Synthetic Organic Chemistry, Japan). Examples of such dyes include azo dyes, metal complex salt azo dyes, pyrazolone azo dyes, naphthoquinone dyes, anthraquinone dyes, phthalocyanine dyes, carbonium dyes, quinone imine dyes, methine dyes, cyanine dyes, squarylium colorants, pyrylium salts, metal thiolate complexes, oxonol dyes, diimonium dyes, aminium dyes and croconium dyes.

Preferable dyes include, for example, cyanine dyes described in JP-A No. 58-125246, JP-A No. 59-84356, JP-A No. 59-202829, JP-A No. 60-78787 etc., methine dyes described in JP-A No. 58-173696, JP-A No. 58-181690, JP-A No. 58-194595 etc., naphthoquinone dyes described in JP-A No. 58-112793, JP-A No. 58-224793, JP-A No. 59-48187, JP-A No. 59-73996, JP-A No. 60-52940, JP-A No. 60-63744 etc., squarylium colorants described in JP-A No. 58-112792 etc., and cyanine dyes described in UK Patent No. 434,875.

Near infrared ray-absorbing sensitizers described in U.S. Pat. No. 5,156,938 are also preferably used. Also preferably used are substituted aryl benzo(thio) pyrylium salts described in U.S. Pat. No. 3,881,924, trimethine thiapyrylium salts described in JP-A No. 57-142645 (U.S. Pat. No. 4,327,169), pyrylium-containing compounds described in JP-A No. 58-181051, JP-A No. 58-220143, JP-A No. 59-41363, JP-A No. 59-84248, JP-A No. 59-84249, JP-A No. 59-146063, and JP-A No. 59-146061, cyanine colorants described in JP-A No. 59-216146, pentamethine thiopyrylium salts described in U.S. Pat. No. 4,283,475, and pyrylium compounds described in JP-B No. 5-13514 and JP-B No. 5-19702.

Other preferable examples of the dyes include the near infrared ray-absorbing dyes of formulae (I) and (II) described in U.S. Pat. No. 4,756,993.

Particularly preferable among these dyes are cyanine colorants, phthalocyanine dyes, oxonol dyes, squarylium colorants, pyrylium salts, thiopyrylium dyes, and nickel thiolate complexes. From the viewpoint of sensitivity, preferable among these dyes are those represented by formulae (a) to (e) below, and cyanine colorants represented by formula (a) below are most preferable because they give high polymerization activity and are excellent in stability and economical efficiency when used in the recording layer in the invention.

Formula (a)

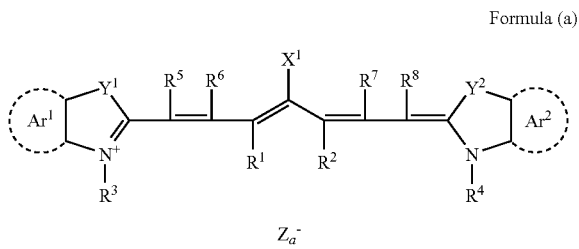

In the formula (a), $X^1$ represents a hydrogen atom, halogen atom, —$NAr^x{}_2$, $X^2$-$L^1$ or the group shown below. $Ar^x$ represents a $C_6$ to $C_{14}$ aromatic hydrocarbon group which may have one or more substituents selected from the group consisting of halogen atoms, alkyl groups, allyl groups, alkenyl groups, alkynyl groups, cyano groups, carboxy groups, nitro groups, amide groups, ester groups, alkoxy groups, amino groups and heterocyclic groups, and these substituents may themselves be substituted by such a substituent as those described above. $X^2$ represents an oxygen atom, a sulfur atom or —N($R^x$)— wherein $R^x$ represents a hydrogen atom or a $C_1$ to $C_{10}$ hydrocarbon group. $L^1$ represents a $C_1$ to $C_{12}$ hydrocarbon group, an aromatic ring having a heteroatom, or a $C_1$ to $C_{12}$ hydrocarbon group containing a heteroatom. The term "heteroatom" used herein refers to an atom selected from N, S, O, a halogen atom or Se.

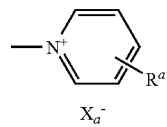

In the above formula, $X_a{}^-$ has the same definition as that of $Z_a{}^-$ defined later, and $R^a$ represents a hydrogen atom or a substituent selected from an alkyl group, an aryl group, a substituted or unsubstituted amino group, or a halogen atom.

$R^1$ and $R^2$ each independently represent a $C_{1-12}$ hydrocarbon group. For the storage stability of the recording layer coating liquid, each of $R^1$ and $R^2$ is preferably a hydrocarbon group containing two or more carbon atoms, and more preferably $R^1$ and $R^2$ are bound to each other to form a 5- or 6-membered ring.

$Ar^1$ and $Ar^2$ may be the same or different, and each independently represent an aromatic hydrocarbon group which may have a substituent. The aromatic hydrocarbon group is preferably a benzene ring or a naphthalene ring. The substituent is preferably a hydrocarbon group containing 12 or less carbon atoms, a halogen atom or an alkoxy group containing 12 or less carbon atoms, $Y^1$ and $Y^2$ may be the same or different, and each independently represent a sulfur atom or a dialkyl methylene group containing 12 or less carbon atoms. $R^3$ and $R^4$ may be the same or different, and each independently represent a hydrocarbon group containing 20 or less carbon atoms which may have a substituent. The substituent is preferably an alkoxy group containing 12 or less carbon atoms, a carboxyl group or a sulfo group. $R^5$, $R^6$, $R^7$ and $R^8$ may be the same or different, and each independently represent a hydrogen atom or a hydrocarbon group containing 12 or less carbon atoms. Each of $R^5$, $R^6$, $R^7$ and $R^8$ is preferably a hydrogen atom because the starting material is easily available. $Z_a{}^-$ represents a counter anion. However, when the cyanine colorant represented by the formula (a) has an anionic substituent in its structure and does not necessitate neutralization of the charge, $Z_a{}^-$ is not necessary. Because of the storage stability of the recording layer coating liquid, $Z_a{}^-$ is preferably a halogen ion, a perchlorate ion, a tetrafluoroborate ion, a hexafluorophosphate ion or a sulfonate ion, particularly preferably a perchlorate ion, a hexafluorophosphate ion or an aryl sulfonate ion.

Specific examples of the cyanine colorants represented by the formula (a), which can be used preferably in the invention, include not only those illustrated below, but also those described in paragraph numbers (0017) to (0019) in JP-A No. 2001-133969, paragraph numbers (0012) to (0038) in JP-A No. 2002-40638, and paragraph numbers (0012) to (0023) in JP-A No. 2002-23360.

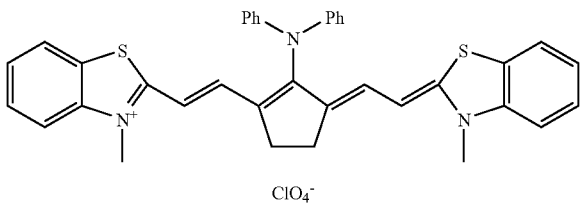

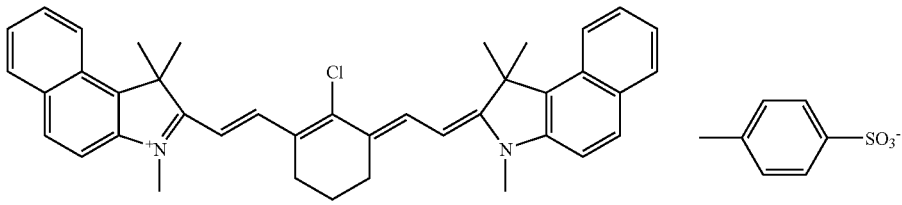

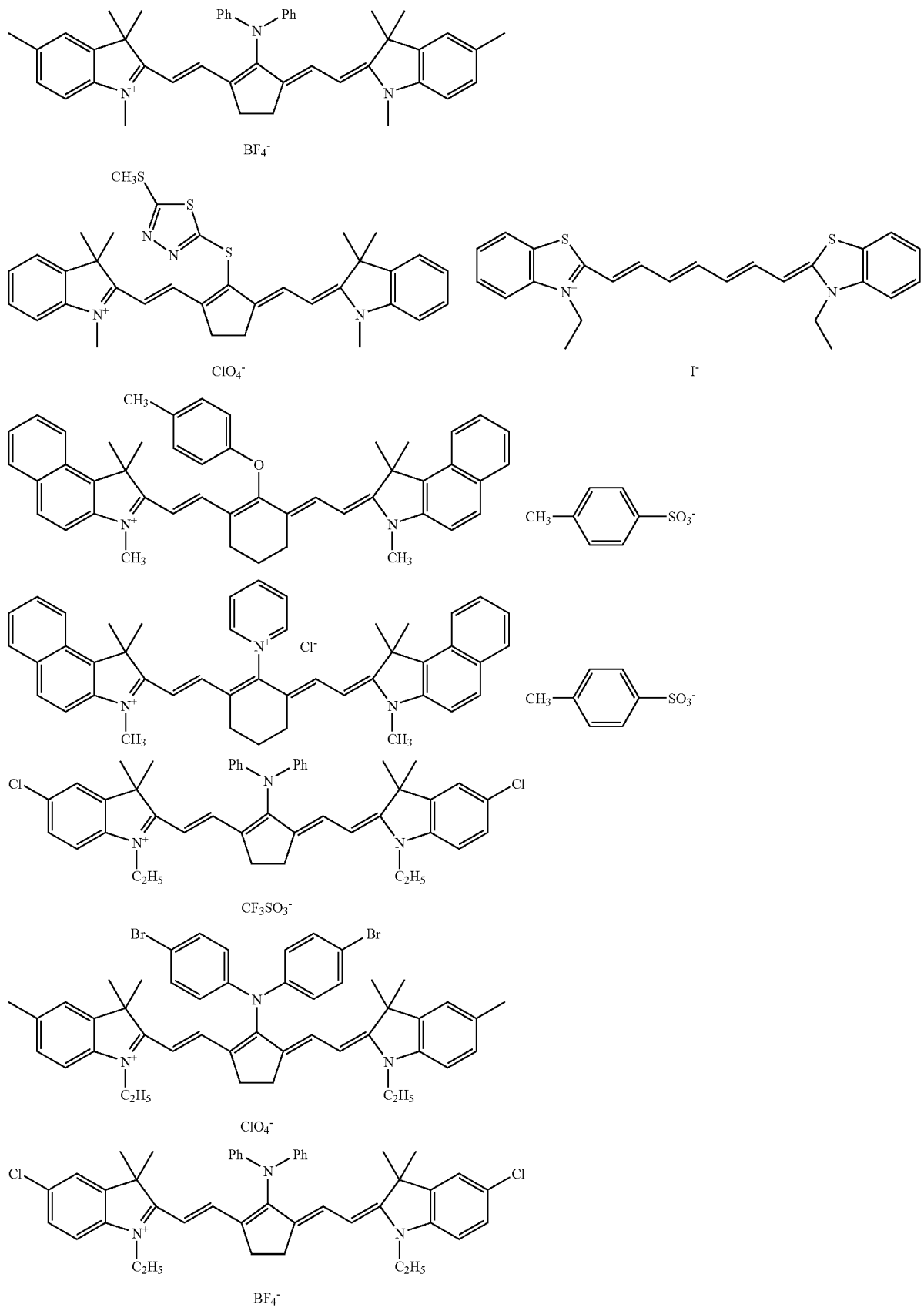

-continued
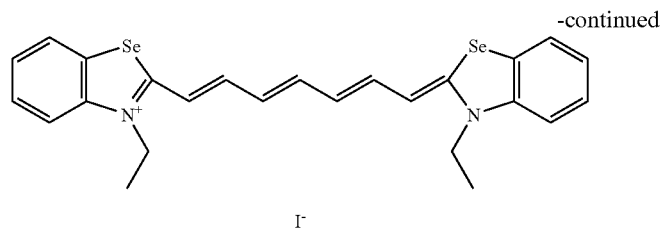
I⁻
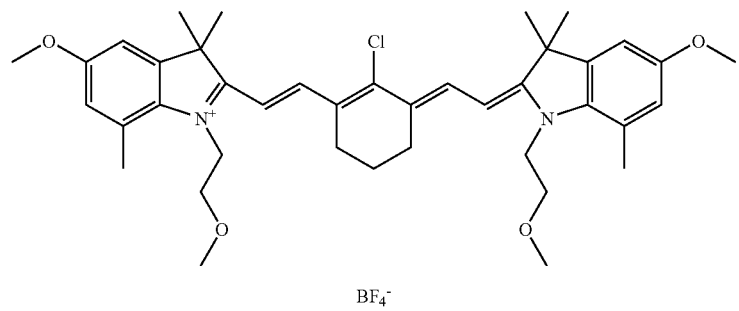
BF₄⁻
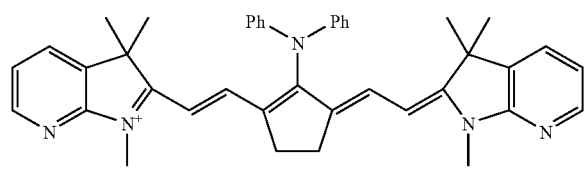
BF₃⁻
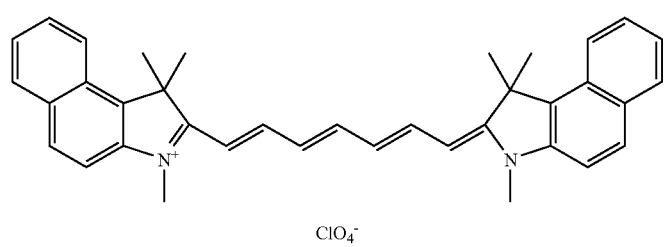
ClO₄⁻
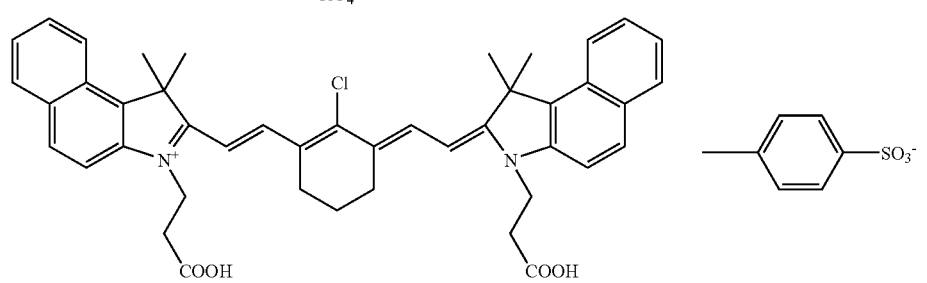
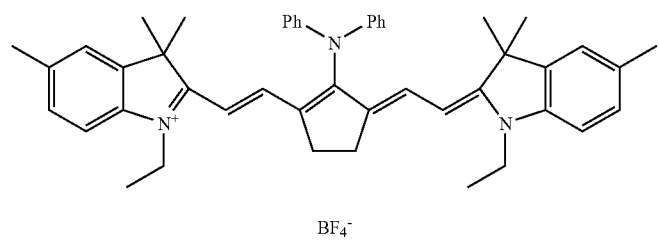
BF₄⁻

-continued

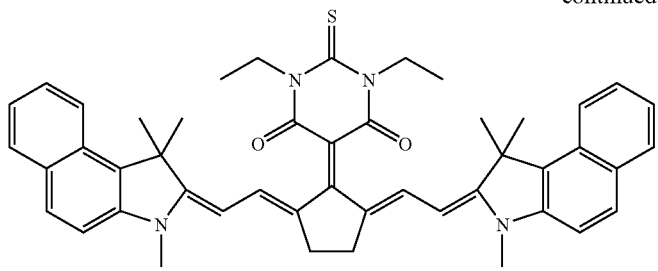

Formula (b)

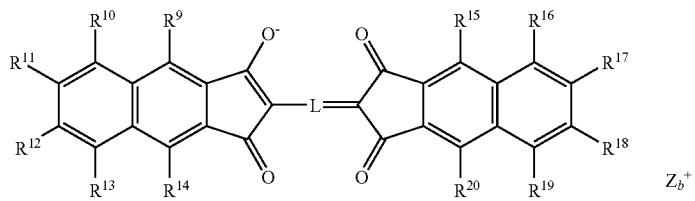

In the formula (b), L represents a methine chain containing 7 or more conjugated carbon atoms, and the methine chain may have a substituent, and the substituents may be bound to each other to form a ring structure. $Z_b^+$ represents a counter cation. The counter cation is preferably ammonium, iodonium, sulfonium, phosphonium, pyridinium or an alkali metal cation ($Ni^+$, $K^+$, $Li^+$). $R^9$ to $R^{14}$ and $R^{15}$ to $R^{20}$ each independently represent a hydrogen atom or a substituent selected from a halogen atom, a cyano group, an alkyl group, an aryl group, an alkenyl group, an alkynyl group, a carbonyl group, a thio group, a sulfonyl group, a sulfinyl group, an oxy group or an amino group, or a substituent composed of a combination of two or three such substituents which may be bound to each other to form a ring structure. Among the compounds of the formula (b), those having a methine chain containing 7 conjugated carbon atoms as L, and those in which each of $R^9$ to $R^{14}$ and $R^{15}$ to $R^{20}$ represents a hydrogen atom, are preferable from the viewpoint of easy availability and effects.

Examples of the dyes represented by the formula (b), which can be used preferably in the invention, include those illustrated below:

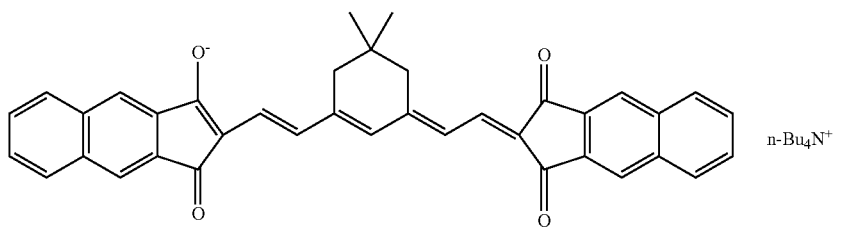

n-Bu$_4$N$^+$

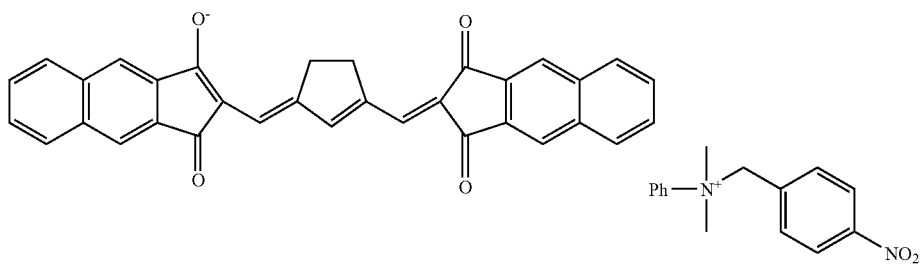

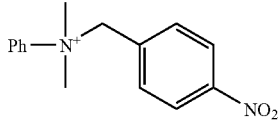

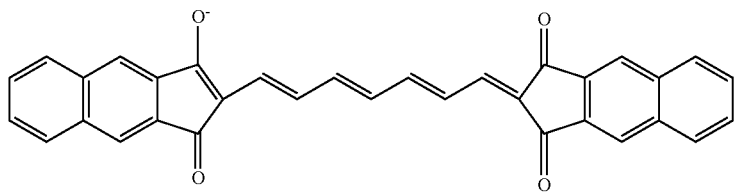

Me$_4$N$^+$

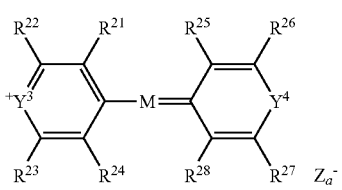

Formula (c)

In the formula (c), $Y^3$ and $Y^4$ each independently represent an oxygen atom, a sulfur atom, a selenium atom or a tellurium atom; M represents a methine chain containing 5 or more conjugated carbon atoms; $R^{21}$ to $R^{24}$ and $R^{25}$ to $R^{28}$ may be the same as or different from one another, and each independently represent a hydrogen atom, a halogen atom, a cyano group, an alkyl group, an aryl group, an alkenyl group, an alkynyl group, a carbonyl group, a thio group, a sulfonyl group, a sulfinyl group, an oxy group or an amino group; and $Z_a^-$ represents a counter anion and has the same definition as that of $Z_a^-$ in the formula (a) above.

Examples of the dyes represented by the formula (c), which can be used preferably in the invention, include those illustrated below:

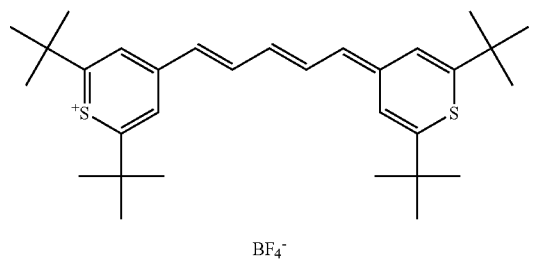

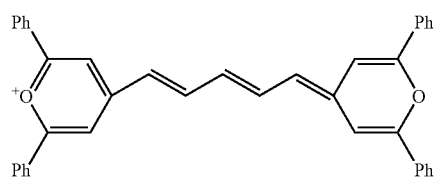

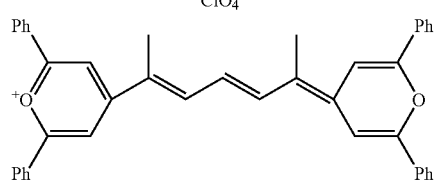

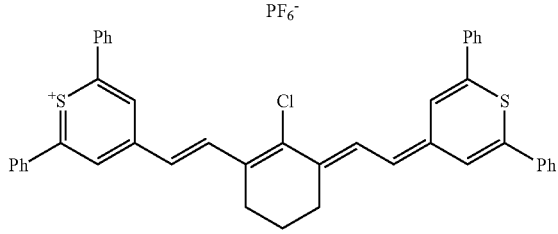

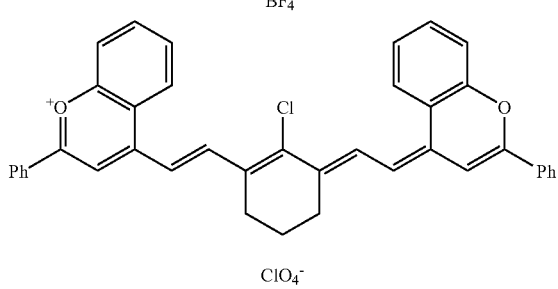

-continued

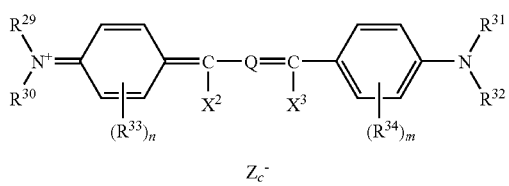

Formula (d)

In the formula (d), $R^{29}$ to $R^{31}$ each independently represent a hydrogen atom, an alkyl group or an aryl group; $R^{33}$ and $R^{34}$ each independently represent an alkyl group, a substituted oxy group or a halogen atom; n and m each independently represent an integer of 0 to 4; $R^{29}$ and $R^{30}$, or $R^{31}$ and $R^{32}$, may be bound to each other to form a ring; $R^{29}$ and/or $R^{30}$ may be bound to $R^{33}$ to form a ring; $R^{31}$ and/or $R^{32}$ may be bound to $R^{34}$ to form a ring; when plural $R^{33}$s are present, some of $R^{33}$s may be mutually bound to form a ring; when plural $R^{34}$s are present, some of $R^{34}$s may be mutually bound to form a ring; $X^2$ and $X^3$ each independently represent a hydrogen atom, an alkyl group or an aryl group, and at least one of $X^2$ and $X^3$ represents a hydrogen atom or an alkyl group; Q is an optionally substituted trimethine group or pentamethine group which may form a ring structure with a divalent organic group; and $Z_c^-$ represents a counter anion and has the same definition as that of $Z_a^-$ in the formula (a) above.

Examples of the dyes represented by the formula (d), which can be used preferably in the invention, include those illustrated below:

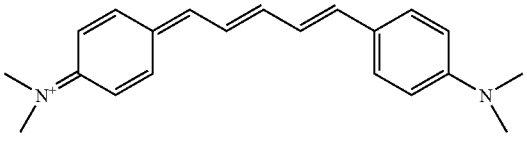

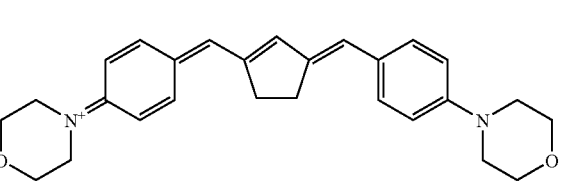

Formula (e)

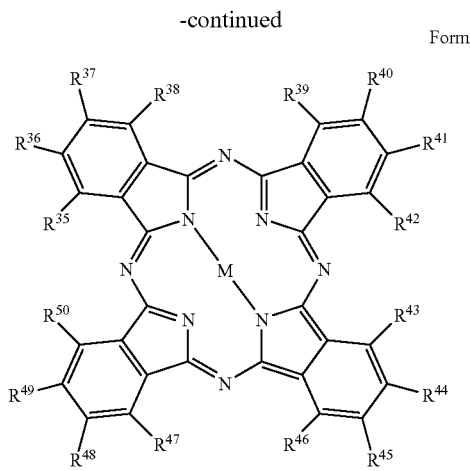

In the formula (e), $R^{35}$ to $R^{50}$ each independently represent a hydrogen atom, halogen atom, cyano group, alkyl group, aryl group, alkenyl group, alkynyl group, hydroxyl group, carbonyl group, thio group, sulfonyl group, sulfinyl group, oxy group, amino group, and onium salt structure, each of which may have a substituent; and M represents two hydrogen atoms, a metal atom, a halometal group or an oxymetal group, and examples of the metal atom contained therein include the groups IA, IIA, IIIB and IVB atoms in the periodic table, the transition metals in the first, second and third periods, and lanthanoid elements, among which copper, magnesium, iron, zinc, cobalt, aluminum, titanium and vanadium are preferable.

Examples of the dyes represented by the formula (e), which can be used preferably in the invention, include those illustrated below:

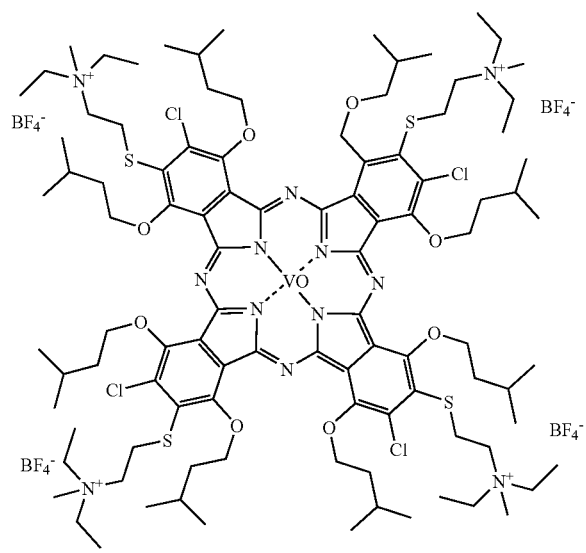

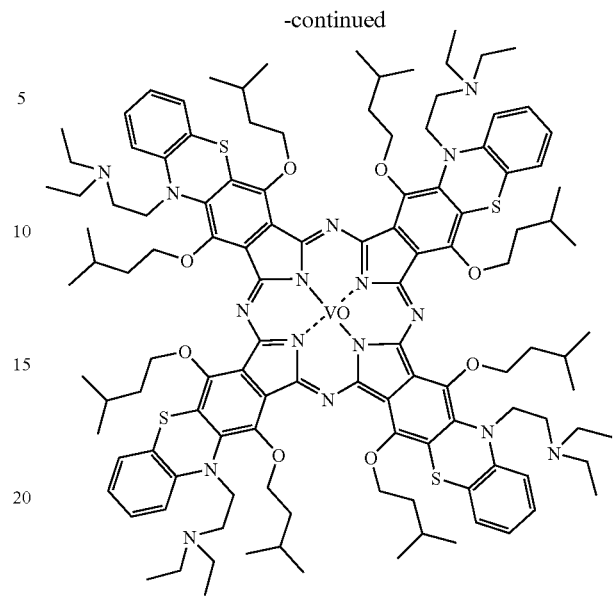

Examples of the pigment used as the component (D) in the invention include commercial pigments and those described in Color Index (C.I.) Handbook, "Saishin Ganryo Binran" (Newest Dye Handbook) (published in 1977 and compiled by Japanese Society of Pigment Technology), "Saishin Ganryho Oyo Gijyutsu" (Newest Pigment Applied Technology) (published in 1986 by CMC), and "Insatsu Inki Gijyutsu" (Printing Ink Technology) (published in 1984 by CMC).

As to the type of the pigment, examples of usable pigments include black pigments, yellow pigments, orange pigments, brown pigments, red pigments, violet pigments, blue pigments, green pigments, fluorescent pigments, metallic powder pigments, and other pigments such as polymer-binding colorants. Specific examples thereof include insoluble azo pigments, azo lake pigments, condensed azo pigments, chelate azo pigments, phthalocyanine pigments, anthraquinone pigments, perylene pigments, perinone pigments, thioindigo pigments, quinacridone pigments, dioxazine pigments, isoindolinone pigments, quinophthalone pigments, dyed lake pigments, azine pigments, nitroso pigments, nitro pigments, natural pigments, fluorescent pigments, inorganic pigments, and carbon black. A preferable pigment among those described above is carbon black.

Such pigments may be used with or without being subjected to surface treatment. Examples of the method of surface treatment include a method of coating the surface with a resin or a wax, a method of allowing a surfactant to adhere to the surface, and a method of bonding a reactive substance (e.g., a silane coupling agent, an epoxy compound, a polyisocyanate etc.) onto the surface of the pigment. These methods of surface treatment are described in "Kinzoku Sekken No Seishitsu To Oyo" (Properties and Application of Metallic Soap) (Sachi Shobo), "Insatsu Inki Gijyutsu" (Printing Ink Technology) (published in 1984 by CMC Shuppan) and "Saishin Ganryho Oyo Gijyutsu" (Newest Pigment Applied Technology) (published in 1986 by CMC Shuppan).

The particle diameter of the pigment is preferably in the range of 0.01 to 10 μm, more preferably 0.05 to 1 μm, still more preferably 0.1 to 1 μm. A pigment particle diameter of less than 0.01 μm is not preferable in respect of the stability of a pigment dispersion in the image recording layer coating liquid, whereas a particle diameter of more than 10 μm is not preferable in respect of the uniformity of the image recording layer.

As the method of dispersing the pigments, any known dispersion techniques used in production of inks or toners can be used. Examples of the dispersing machine include a supersonic dispersing device, a sand mill, an attritor, a pearl mill, a super mill, a ball mill, an impeller, a disperser, a KD mill, a colloid mill, a dynatron, a triple roll mill, and a press kneader. Details thereof are described in "Saishin Ganryho Oyo Gijyutsu" (Newest Pigment Applied Technology) (published in 1986 by CMC Shuppan).

The components (D) in the invention may include only one substance or a combination of two or more substances.

The component (D) in the invention is preferably a cyanine colorant.

From the viewpoint of sensitivity, the component (D) is more preferably a cyanine colorant represented by the formula (a). Among colorants represented by the formula (a), cyanine colorants in which $X^1$ is a diarylamino group or $X^2$-$L^1$ is preferable, and those having a diaryl amino group are more preferable.

A cyanine colorant having an electron-withdrawing group or a heavy atom-containing substituent at each of indolenine sites at both terminals is also preferable, and for example, the one described in Japanese Patent Application No. 2001-6323 is preferably used. A cyanine colorant which has an electron-withdrawing group at each of indolenine sites at both terminals, and which has a diarylamino group as $X^1$ is most preferable.

The component (D) in the polymerizable composition according to the invention, when used in the recording layer of the planographic printing plate precursor, is also preferably added in the range of 0.5 to 5 mass % based on the total solid content. In this range, excellent sensitivity can be achieved due to change in physical properties caused by light exposure, whereby sufficient uniformity and strength of the layer are maintained.

[Layer Structure of the Planographic Printing Plate Precursor]

Hereinafter, the layer structure of the planographic printing plate precursor in which the polymerizable composition according to the invention is used as the recording layer will be described.

The planographic printing plate precursor according to the invention includes, on a support, a recording layer containing at least the components (A) to (C). The planographic printing plate precursor may further include, as necessary, one or more other layers such as an intermediate layer or a protective layer.

(Recording Layer)

In the planographic printing plate precursor according to the invention, the recording layer having a function of forming an image will be described. The recording layer of the planographic printing plate precursor according to the invention contains the components (A) to (C) and preferably contains a compound (D) having absorption maximum at 700 to 1200 nm from the viewpoint of improving sensitivity.

The component (C) in the recording layer of the planographic printing plate precursor according to the invention functions particularly as a polymerization initiator for initiating and accelerating the polymerization of the polymerizable compound that is the component (B).

Details of the compound used as the polymerizable compound (B) used in the recording layer of the planographic printing plate precursor are described in detail above. The selection of the compound to be used may depend on the requirements described above. In addition, a compound having a specific structure may be selected for the purpose of improving the adhesiveness to the support, the overcoat layer, or the like described later.

When the polymerizable compound is used, suitable structure, composition and amount thereof may be selected arbitrarily in consideration of the degree of polymerization inhibition by oxygen, resolution, fogging, change in refractive index, and surface adhesiveness. In some cases, a layer structure/coating method such as undercoating or overcoating may be adopted.

The component (D) may be added to the composition used in the recording layer that also contains the other components, or to a layer other than the recording layer.

The component (D) is preferably used to form a recording layer of the negative type planographic printing plate precursor such that the optical density of the recording layer is in the range of 0.1 to 3.0 at the wavelength that gives an absorption maximum in the wavelength range of 760 to 1200 nm. When the recording layer has such an optical density, excellent recording sensitivity can be achieved. Since the optical density is determined depending on the amount of the component (D) added and the thickness of the recording layer, a predetermined optical density can be obtained by regulating both of the conditions. The optical density of the recording layer can be measured in a usual manner. Examples of measuring methods include a method comprising forming a recording layer on a transparent or white support such that the thickness of the recording layer is a predetermined thickness corresponding to an adequate dry coating weight as a planographic printing plate, and measuring the optical density by a transmission-type optical densitometer, and a method comprising forming a recording layer on a reflective support such as aluminum, and measuring the reflection density.

The amount of the component (D) added to the recording layer is preferably 0.1 to 30 mass %, more preferably 0.5 to 20 mass %, still more preferably 1 to 10 mass %, based on the total solid content. In the above content ranges, excellent exposure sensitivity, and uniformity and strength of the layer can be achieved simultaneously.

(E) Other Components

Other components suitable for the intended use, the production method etc. can further be added if necessary to the polymerizable composition according to the invention or to the composition constituting the recording layer of the planographic printing plate precursor. Hereinafter, preferable additives will be described.

(E-1) Co-Sensitizer

By use of a certain additive in the polymerizable composition, the sensitivity can be further improved. Such a compound will be referred to as a co-sensitizer hereinafter. Its working mechanism is not clear, but is considered to be based mainly on the following chemical process. That is, it is estimated that various intermediate active species (radials, cations) generated in the photo-reaction initiated by the heat-polymerization initiator and in the subsequent addition-polymerization reaction react with the co-sensitizer to form new active radicals. Such co-sensitizers can be roughly classified into (i) those capable of forming active radicals when reduced, (ii) those capable of forming active radicals when oxidized, and (iii) those converted into highly active radicals through reaction with radicals with low activity or those acting as chain transfer agents. There are many compounds whose classification is not commonly understood.

(i) Compound Forming Active Radicals when Reduced Reduction

Compounds having a carbon-halogen bond: It is considered that the carbon-halogen bond is reductively cleaved to generate active radicals. Specifically, for example, trihalomethyl-s-triazines and trihalomethyl oxadiazoles can be preferably used.

Compounds having a nitrogen-nitrogen bond: It is considered that the nitrogen-nitrogen bond is reductively cleaved to form active radicals. Specifically, hexaryl biimidazoles can be preferably used.

Compounds having an oxygen-oxygen bond: It is considered that the oxygen-oxygen bond is reductively cleaved to generate active radicals. Specifically, organic peroxides can be preferably used.

Onium compounds: It is considered that a carbon-heteroatom bond or an oxygen-nitrogen bond is reductively cleaved to generate active radicals. Specifically, diaryl iodonium salts, triaryl sulfonium salts, and N-alkoxy pyridinium (azinium) salts can be preferably used.

Ferrocene, iron arene complexes: Capable of forming active radicals reductively.

(ii) Compounds Forming Active Radicals when Oxidized

Alkylate complexes: It is considered that a carbon-heteroatom bond is oxidatively cleaved to generate active radicals. Specifically, for example, triaryl alkyl borates can be preferably used.

Alkyl amine compounds: It is considered that a C—X bond on a carbon adjacent to the nitrogen is cleaved by oxidation to form active radicals. X is preferably a hydrogen atom, a carboxyl group, a trimethylsilyl group, or a benzyl group. Specifically, ethanol amines, N-phenyl glycines, N-phenyliminodiacetic acid and its derivatives, and N-trimethylsilylmethyl anilines can be mentioned.

Sulfur- or tin-containing compounds: A compound obtained by replacing the nitrogen atom in any of the above-described amines with a sulfur atom or a tin atom can form active radicals in a similar mechanism. Further, compounds having S—S bonds are known to act as sensitizers by cleavage of the S—S bonds.

α-Substituted methyl carbonyl compounds: Capable of forming active radicals through the cleavage of the carbonyl-α carbon bond upon oxidation. Further, compounds obtained by replacing the carbonyl in such a compound with an oxime ether exhibit the same action. Specifically, examples include 2-alkyl-1-[4-(alkylthio)phenyl]-2-morpholinopronone-1 and derivatives thereof, as well as oxime ethers prepared by reacting such compounds with hydroxy amines and then etherifying N—OH.

Sulfinates: Capable of forming active radicals reductively. Specifically, sodium aryl sulfinates can be mentioned.

(iii) Compounds converted into highly active radicals through reaction with radicals, or compounds acting as chain transfer agents: For example, compounds having SH, PH, SiH or GeH in the molecule are usable. These compounds can form radicals by donating hydrogen to radicals having low-activity or by undergoing oxidization and subsequent deprotonation. Specifically, for example, 2-mercaptobenzimidazoles can be mentioned.

In a preferable embodiment, a polycarboxylic acid compound containing an aromatic ring or heterocyclic aromatic ring structure to which at least two carboxyl groups are bonded directly or via a divalent linking group is contained for the purpose of improving sensitivity and/or developability. Specific examples of the polycarboxylic acid compound include (p-acetamidophenylimido)diacetic acid, 3-(bis(carboxymethyl)amino) benzoic acid, 4-(bis(carboxymethyl)amino)benzoic acid, 2-[(carboxymethyl)phenylamino] benzoic acid, 2-[(carboxymethyl)phenylamino]-5-methoxybenzoic acid, 3-[bis(carboxymethyl)amino]-2-naphthalene carboxylic acid, N-(4-aminophenyl)-N-(carboxymethyl)glycine, N,N'-1,3-phenylene-bis-glycine, N,N'-1,3-phenylenebis[N-(carboxymethyl)] glycine, N,N'-1,2-phenylenebis[N-(carboxymethyl)] glycine, N-(carboxymethyl)-N-(4-methoxyphenyl)glycine, N-(carboxymethyl)-N-(3-methoxyphenyl)glycine, N-(carboxymethyl)-N-(3-hydroxyphenyl)glycine, N-(carboxymethyl)-N-(3-chlorophenyl)glycine, N-(carboxymethyl)-N-(4-bromophenyl)glycine, N-(carboxymethyl)-N-(4-chlorophenyl)glycine, N-(carboxymethyl)-N-(2-chlorophenyl)glycine, N-(carboxymethyl)-N-(4-ethylphenyl)glycine, N-(carboxymethyl)-N-(2,3-dimethylphenyl)glycine, N-(carboxymethyl)-N-(3,4-dimethylphenyl)glycine, N-(carboxymethyl)-N-(3,5-dimethylphenyl)glycine, N-(carboxymethyl)-N-(2,4-dimethylphenyl)glycine, N-(carboxymethyl)-N-(2,6-dimethylphenyl)glycine, N-(carboxymethyl)-N-(4-formylphenyl)glycine, N-(carboxymethyl)-N-ethylanthranilic acid, N-(carboxymethyl)-N-propylanthranilic acid, 5-bromo-N-(carboxymethyl) anthranilic acid, N-(2-carboxyphenyl)glycine, o-dianisidine-N,N,N',N'-tetraacetic acid, N,N'-[1,2-ethanediylbis(oxy-2,1-phenylene)]bis[N-(carboxymethyl)glycine], 4-carboxyphenoxy acetic acid, cathecol-O,O'-diacetic acid, 4-methylcatechol-O,O'-diacetic acid, resorcinol-O,O'-diacetic acid, hydroquinone-O,O'-diacetic acid, α-carboxy-o-anisic acid, 4,4'-isopropylidene diphenoxy acetic acid, 2,2'-(dibenzofuran-2,8-diyldioxy)diacetic acid, 2-(carboxymethylthio)benzoic acid, 5-amino-2-(carboxymethylthio)benzoic acid, and 3-[(carboxymethyl)thio]-2-naphthalene carboxylic acid.

In particular, N-arylpolycarboxylic acids represented by the following formula (VI) or compounds represented by the following formula (VII) are preferable.

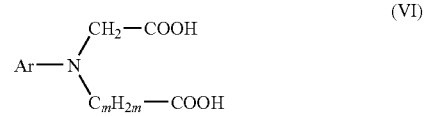
(VI)

In formula (VI), Ar represents a monosubstituted, polysubstituted or unsubstituted aryl group, and m is an integer from 1 to 5.

Examples of a substituent which can be introduced into the aryl group include a $C_1$ to $C_3$ alkyl group, a $C_1$ to $C_3$ alkoxy group, a $C_1$ to $C_3$ thioalkyl group and a halogen atom. This aryl group preferably has 1 to 3 identical or different substituents m is preferably 1, and Ar preferably represents a phenyl group.

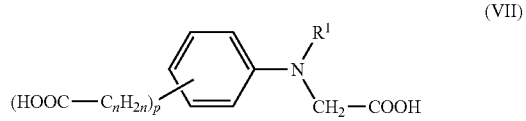
(VII)

In formula (VII), $R^1$ represents a hydrogen atom or a $C_1$, to $C_6$ alkyl group, and each of n and p is an integer from 1 to 5.

n is preferably 1, and $R^1$ is preferably a hydrogen atom. The most preferable polycarboxylic acid is anilinodiacetic acid.

Another compound preferable for improving sensitivity and/or developability is a compound having two or more groups selected from carboxylic acid groups and sulfonic acid groups, and specific examples thereof include 5-aminoisophthalic acid, 5-nitroisophthalic acid, 4-methylphthalic acid, terephthalic acid, 2-bromoterephthalic acid, 2,3-naphthalenedicarboxylic acid, diphenic acid, 1,4,5,8-naphthalenetetracarboxylic acid, N-benzyliminodiacetic acid, N-(2-carboxyphenylglycine), N-phenyliminodiacetic acid, 1,3,5-benzenetricarboxylic acid, 1,2,4,5-benzenetetracarboxylic acid, 5-sulfosalicylic acid, 2-sulfobenzoic acid, 1,5-naphthalenedisulfonic acid, and 4-sulfophthalic acid. The above compound can be further substituted by an alkyl group, an alkenyl group, an alkynyl group, a cyano group, a halogen atom, a hydroxyl group, a carboxyl group, a carbonyl group, an alkoxy group, an amino group, an amide group, a thiol group, a thioalkoxy group, or a sulfonyl group.

Among those described above, the most preferable compound is a compound represented by the formula (V) or (VI).

The amount of such poly(carboxylic acid/sulfonic acid) compound to be added is preferably 0.5 to 15 mass %, more preferably 1 to 10 mass %, still more preferably 3 to 8 mass %, based on the solid content of the polymerizable composition.

A large number of more specific examples of these co-sensitizers are described, for example, in JP-A No. 9-236913 as additives for improving sensitivity, and such compounds can also be used in the invention.

Only one co-sensitizer, or a combination of two or more co-sensitizers, may be used. The amount of the co-sensitizer to be used may be in the range of 0.05 to 100 parts by mass, preferably 1 to 80 parts by mass, more preferably 3 to 50 parts by mass, relative to 100 parts by mass of the polymerizable compound (B).

(E-2) Polymerization Inhibitor

In the invention, in addition to the basic components described above, a small amount of a heat-polymerization inhibitor is preferably added so as to inhibit unnecessary heat polymerization of the polymerizable compound during production or storage of the composition used in the recording layer. Suitable examples of the heat-polymerization inhibitor include hydroquinone, p-methoxyphenol, di-t-butyl-p-cresol, pyrogallol, t-butyl catechol, benzoquinone, 4,4'-thiobis(3-methyl-6-t-butyl phenol), 2,2'-methylene bis(4-methyl-6-t-butyl phenol), and N-nitrosophenyl hydroxylamine primary cerium salts. The amount of the heat-polymerization inhibitor to be added is preferably about 0.01 mass % to about 5 mass % relative to the mass of the entire composition. To prevent the polymerization inhibition by oxygen, a higher fatty acid derivative such as behenic acid or behenic amide may be added as necessary so that the higher fatty acid derivative localizes on the surface of the recording layer in the drying step after application onto a support etc. during the production process of the planographic printing plate precursor. The amount of the higher fatty acid derivative to be added is preferably about 0.5 mass % to about 10 mass % based on the entire composition.

(E-3) Colorant etc.

A dye or pigment may be added to the planographic printing plate precursor according to the invention, for the purpose of coloring its recording layer. The plate-checking property of the printing plate, such as visibility after plate-making and compatibility with an image densitometer, can thereby be improved. The colorant is preferably a pigment since many dyes lower the sensitivity of the photopolymerizable recording layer. Examples of the colorant include pigments such as phthalocyanine pigments, azo pigments, carbon black and titanium oxide, and dyes such as Ethyl Violet, Crystal Violet, azo dyes, anthraquinone dyes and cyanine dyes. The amount of the dyes and pigments to be added is preferably about 0.5 mass % to about 5 mass % based on the entire composition.

(E-4) Other Additives

In the planographic printing plate precursor according to the invention, known additives such as inorganic fillers for improving the physical properties of a cured film, plasticizers, and sensitizers capable of improving the inking property of the surface of the recording layer can be added.

Examples of the plasticizers include dioctyl phthalate, didodecyl phthalate, triethylene glycol dicaprylate, dimethyl glycol phthalate, tricresyl phosphate, dioctyl adipate, dibutyl sebacate, and triacetyl glycerin. When a plasticizer is used, it may be added in an amount of 10 mass % or less relative to the total mass of the binder and the compound having an ethylenically unsaturated double bond.

UV initiators and heat-crosslinking agents for enhancing the effects of heating and light exposure after development can also be added for the purpose of improving the layer strength (printing durability) described later.

Additional additives or an intermediate layer for improving the adhesion between the recording layer and the support and for enhancing the removability of the light-unexposed recording layer during development can also be added. Compounds exhibiting a relative strong interaction with the substrate, such as a compound having a diazonium structure or a phosphone compound, can be used for undercoating or added, so as to improve the adhesion and enhance the printing durability. Hydrophilic polymers such as polyacrylic acid and polysulfonic acid can be used for undercoating or added, so as to improve the developability of the non-image portion and improve stain resistance.

The planographic printing plate precursor according to the invention can be produced by coating a suitable support with a recording layer coating liquid containing the polymerizable composition according to the invention or with a solution prepared by dissolving, in solvent, a coating component for a desired layer such as protective layer.

Examples of usable solvents include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxy propanol, methoxy methoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxy propyl acetate, N,N-dimethyl formamide, dimethyl sulfoxide, γ-butyrolactone, methyl lactate and ethyl lactate. Only one solvent may be used, or a mixture of two or more solvents may be used. An adequate solids content of the coating liquid is from 2 to 50 mass %.

It is preferable that the coating amount of the recording layer on the support be determined suitably depending on applications in consideration of the effects on the sensitivity and developability of the recording layer and the strength and printing durability of the light-exposed layer. When the coating amount is too small, printing durability is not satisfactory. A too large coating amount is not preferable because sensitivity is decreased, the time for light exposure is prolonged, and the development treatment also requires a longer time. In the planographic printing plate precursor according to the invention, the coating amount in terms of mass after drying is generally from about 0.1 to about 10 g/m$^2$, more preferably from 0.5 to 5 g/m$^2$.

<Protective Layer>

Next, the protective layer optionally provided on the recording layer described above will be described in detail.

The protective layer is desirably a layer which does not substantially inhibit penetration of light used in light exposure, is excellent in adhesiveness to the recording layer, and can be easily removed in the development after light exposure. Conventionally, the protective layer has been devised in many ways and described in detail in U.S. Pat. No. 3,458,311 and JP-A No. 55-49729. Such a protective layer can also be applied to the planographic printing plate precursor according to the invention.

The negative type planographic printing plate precursor according to the invention has the polymerizable image recording layer, and thus the protective layer preferably possesses oxygen shielding property which enables shielding of oxygen in the air—a gas that inhibits polymerization—during exposure to light. On one hand, the planographic printing plate precursor according to the invention also desirably has moderate oxygen permeability that allows polymerization inhibition in dark from the viewpoint of stability during storage or safelight suitability. For exhibiting the both functions, the protective layer preferably has low oxygen permeability.

(Water-Soluble Polymer Compound)

A material usable as the major component in the protective layer is preferably a water-soluble polymer compound relatively high crystallinity. Specifically, water-soluble polymers such as polyvinyl alcohol, polyvinyl pyrrolidone, acidic celluloses, gelatin, gum arabic and polyacrylic acid are well-known in the art. Among these compounds, the use of polyvinyl alcohol as the major component may lead to the best results with respect to basic characteristics such as oxygen impermeability and removability at development. The polyvinyl alcohol used in the protective layer may be partially substituted by ester, ether or acetal insofar as it has unsubstituted vinyl alcohol units, which impart necessary oxygen impermeability and water solubility. Similarly, the polyvinyl alcohol may be a copolymer having a part that contains one or more other copolymerizable components.

Specific examples of the polyvinyl alcohol include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 manufactured by Kuraray Co., Ltd. Example of the copolymer described above include polyvinyl acetate, chloroacetate or propionate, polyvinyl formal or polyvinyl acetal hydrolyzed to 88 to 100%, and copolymers thereof. Other useful water-soluble polymer compounds include polyvinyl pyrrolidone, gelatin and gum arabic. Only one water-soluble polymer compound may be used, or a combination of two or more water-soluble polymer compounds may be used.

Polyvinyl alcohols used preferably in this embodiment include polyvinyl alcohols having a saponification degree of 71 to 100% and a molecular weight in the range of 200 to 2400. From the viewpoint of having excellent oxygen impermeability, excellent layer-forming property, and a surface of low adhesiveness, the use of polyvinyl alcohols having a saponification degree of 91 mol % or higher is more preferable.

Specifically, commercial polyvinyl alcohols usable in the recording layer include PVA-102, PVA-103, PVA-104, PVA-105, PVA-110, PVA-117, PVA-120, PVA-124, PVA-117H, PVA-135H, PVA-HC, PVA-617, PVA-624, PVA-706, PVA-613, PVA-CS and PVA-CST manufactured by Kuraray Co., Ltd., GOSENOL NL-05, NM-11, NM-14, AL-06, P-610, C-500, A-300 and AH-17 manufactured by Nippon Synthetic Chemical Industry Co., Ltd., and JF-04, JF-05, JF-10, JF-17, JF-17L, JM-05, JM-10, JM-17, JM-17L, JT-05, JT-13 and JT-15 manufactured by JAPAN VAM&POVAL CO., LTD.

Acid-modified polyvinyl alcohols can also be preferably used. Preferable examples include a carboxy-modified polyvinyl alcohol modified with itaconic acid or maleic acid and a polyvinyl alcohol modified with sulfonic acid. Use of an acid-modified polyvinyl alcohol having a saponification degree of 91 mol % or higher is more preferable.

Specific examples of the acid-modified polyvinyl alcohol include KL-118, KM-618, KM-118, SK-5102, MP-102 and R-2105 manufactured by Kuraray Co., Ltd., GOSENAL CKS-50, T-HS-1, T-215, T-350, T-330 and T-330H manufactured by Nippon Synthetic Chemical Industry Co., Ltd., and AF-17, AT-17 etc. manufactured by JAPAN VAM&POVAL CO., LTD.

In consideration of the sensitivity of the resultant planographic printing plate precursor and the adhesion between the planographic printing plate precursors when stacked, the water-soluble polymer compound described above is preferably contained in the range of 45 to 95 mass %, more preferably in the range of 50 to 90 mass %, based on the total solid content of the protective layer.

At least one water-soluble polymer compound may be used. For example, a combination of two or more water-soluble compounds may be used. When plural water-soluble polymer compounds are simultaneously used, the total mass thereof is preferably in the range described above.

The adhesiveness to an image portion of the recording layer and the uniformity of the layer are very important characteristics of the protective layer from the viewpoint of handling of the printing plate. That is, if a hydrophilic layer consisting of a water-soluble polymer is laminated on a lipophilic recording layer, layer separation occurs easily due to insufficient adhesiveness, and the released portion causes deficiency such as insufficient layer curing attributable to polymerization inhibition by oxygen. Against this problem, various proposals for improving the adhesion between the two layers have been made. For example, U.S. patent application Ser. Nos. 292,501 and 44,563 describe that an acrylic emulsion, a water-insoluble vinyl pyrrolidone-vinyl acetate copolymer or the like is mixed in an amount of 20 to 60 mass % in a hydrophilic polymer mainly composed of polyvinyl alcohol and then the resultant composition is laminated on a recording layer, whereby satisfactory adhesiveness is obtained. Any of these known techniques can naturally be applied.

From the viewpoint of adhesion to the recording layer, sensitivity, and occurrence of unnecessary fogging, polyvinyl alcohol and polyvinyl pyrrolidone may be simultaneously used in the protective layer. As to the ratio between the respective components in this case, the ratio of (polyvinyl alcohol having a saponification degree of 91 mol % or more/polyvinyl pyrrolidone ratio (mass ratio)) is preferably not higher than 3/1. Other than polyvinyl pyrrolidone, acidic cellulose, gelatin, gum arabic, and polyacrylic acid, which are relatively high in crystallinity, and copolymers thereof can also be used in combination with polyvinyl alcohol.

(Filler)

The protective layer according to the invention preferably contains a filler in addition to the polymer compounds described above. By incorporating the filler, scratch resistance of the surface of the photosensitive layer can be improved, the adhesion between the adjacent photosensitive printing plate precursors when stacked without an interleaf paper therebetween can be suppressed, and thus the planographic printing plate precursors can be easily separable from one another, so that the handling property may be advantageously improved. Such a filler may be any of an organic filler, an inorganic filler, or an inorganic-organic composite filler, or a mixture of two or more of such fillers. It is preferable to use one or more inorganic fillers and one or more organic fillers simultaneously.

The shape of the filler can be selected suitably in accordance with the object, and may be in the form of, for example, a fiber, a needle, a plate, a sphere, a granule ("granule" refers to "amorphous granule", and the same applies hereinafter), a tetrapod, or a balloon. Among these, the filler is preferably in the form of a plate, a sphere or a granule.

Examples of the organic filler include synthetic resin particles and naturally occurring polymer particles. The organic filler is preferably resin particles such as particles of acrylic resin, polyethylene, polypropylene, polyethylene oxide, polypropylene oxide, polyethylene imine, polystyrene, polyurethane, polyurea, polyester, polyamide, polyimide, carboxymethyl cellulose, gelatin, starch, chitin or chitosan, more preferably resin particles of acrylic resin, polyethylene, polypropylene or polystyrene.

Specifically, commercial fillers suitable as the organic filler to be added to the protective layer include Chemipearl W100, W200, W300, W308, W310, W400, W401, W4005, W410, W500, WF640, W700, W800, W900, W950 and WP100 manufactured by Mitsui Chemicals, Inc., MX-150, MX-180, MX-300, MX-500, MX-1000, MX-1500H, MX-2000, MR-2HQ MR-7HG, MR-10HG MR-3GSN, MR-5GSN, MR-2G MR-7G MR-10G, MR-20G MR-5C, MR-7GC, SX-130H, SX-350H, SX-500H, SGP-50C and SGP-70C manufactured by Soken Chemical & Engineering Co., Ltd., and MBX-5, MBX-8, MBX-12, MBX-15, MBX-20, MB20X-5, MB30X-5, MB30X-8, MB30X-20, SBX-6, SBX-8, SBX-12 and SBX-17 manufactured by Sekisui Plastics Co., Ltd.

The particle-size distribution may be either monodisperse or polydisperse and is preferably monodisperse. As to the size of the filler, the average particle diameter is preferably 1 to 20 μm, more preferably 2 to 15 μm, still more preferably 3 to 10 μm. Within these ranges, the effects of the invention can be exhibited more effectively.

The content of the organic filler is preferably 0.1 to 20 mass %, more preferably 1 to 15 mass %, still more preferably 2 to 10 mass %, based on the total solid content of the protective layer.

Examples of the inorganic filler include metals and metal compounds such as oxides, complex oxides, hydroxides, carbonates, sulfates, silicates, phosphates, nitrides, carbides, sulfides, and complexes each containing at least two of such substances. Specific examples include mica compounds, glass, zinc oxide, alumina, zirconium oxide, tin oxide, potassium titanate, strontium titanate, aluminum borate, magnesium oxide, magnesium borate, aluminum hydroxide, magnesium hydroxide, calcium hydroxide, titanium hydroxide, basic magnesium sulfate, calcium carbonate, magnesium carbonate, calcium sulfate, magnesium sulfate, calcium silicate, magnesium silicate, calcium phosphate, silicon nitride, titanium nitride, aluminum nitride, silicon carbide, titanium carbide, zinc sulfide, and complexes each containing at least two of such substances.

Preferable examples include mica compounds, glass, alumina, potassium titanate, strontium titanate, aluminum borate, magnesium oxide, calcium carbonate, magnesium carbonate, calcium silicate, magnesium silicate, calcium phosphate and calcium sulfate.

Among those described above, mica compounds can be mentioned as particularly preferable fillers usable in the protective layer. Inorganic layered compounds, whose typical examples are mica compounds, will be described in detail below.

(Inorganic Layered Compound)

The protective layer according to the invention preferably contains an inorganic layered compound. By further using the inorganic layered compound, oxygen permeability can be further improved, the strength of the protective layer can be further improved to improve scratch resistance, and matting property can also be imparted to the protective layer.

As a result, the protective layer, not only has oxygen impermeability as described above, but can also prevent flaws and deterioration due to deformation. By imparting matting property to the protective layer, the adhesion of the surface of the protective layer of a planographic printing plate precursor to the back surface of the support of an adjacent planographic printing plate precursor can be suppressed when planographic printing plate precursors are stacked.

Examples of the inorganic layered compound include mica compounds such as a natural mica and a synthetic mica represented by, for example, the formula: $A(B, C)_2\text{-}5D_4O_{10}(OH, F, O)_2$ wherein A is K, Na or Ca; each of B and C is Fe(II), Fe(II), Mn, Al, Mg, or V; and D is Si or Al.

Examples of natural mica compounds include white mica, paragonite, bronze mica, black mica and flaky mica. Examples of synthetic mica compounds include non-swelling mica such as fluorine bronze mica $KMg_3 (AlSi_3O_{10})F_2$ and potassium tetrasilicate mica $KMg_{2.5} (Si_4O_{10})F_2$ and swelling mica such as Na tetrasilyric mica $NaMg_{2.5} (Si_4O_{10})F_2$, Na or Li teniolite (Na, Li) $Mg_2Li (Si_4O_{10})F_2$, montmorillonite type Na or Li hectorite $(Na, Li)_{1/8}Ng_{2/5}Li_{1/8} (Si_4O_{10})F_2$. Synthetic smectite is also useful.

Among the mica compounds described above, fluorine-based swelling mica is particularly useful. That is, this swelling synthetic mica has a layered structure consisting of unit crystal lattice layers having a thickness of about 10 to 15 Å wherein intra-lattice metal atom substitution is far significant than in other clay minerals. As a result, the lattice layers are deficient in positive charge which is compensated for by adsorbing cations such as $Na^+$, $Ca^{2+}$ or $Mg^{2+}$ between the layers. Cations that are present between the layers are called exchangeable cations, and are exchanged with various cations. In particular, when cations between the layers are $Li^+$ or $Na^+$, the ion radius thereof is small and the bonding between the layered crystal lattices is weak, thus showing great swelling in the presence of water. When shearing force is applied in this state, the layered structure is easily cleaved to form stable sol in water. This occurs easily in the swelling synthetic mica, which is useful in this embodiment; therefore, the swelling synthetic mica is particularly preferably used.

From the viewpoint of regulation of diffusion, the mica compound is preferably thinner, and the plane size is preferably larger insofar as the flatness of the coating surface and the permeation of active ray are not inhibited. Accordingly, the aspect ratio may be 20 or more, preferably 100 or more, more preferably 200 or more. The aspect ratio is the ratio of the thickness to the major axis of the particle and can be measured for example from a projection view obtained from a photomicrograph of the particle. As the aspect ratio is increased, the obtained effects are greater.

The particle diameter of the mica compound may be 0.3 to 20 μm, preferably 0.5 to 10 μm, more preferably 1 to 5 μm, in terms of the average length of the major axis. The average thickness of the particles may be 0.1 μm or less, preferably 0.05 μm or less, more preferably 0.01 μm or less. Specifically, the size of the swelling synthetic mica as a typical compound has a thickness of 1 to 50 nm and a major axis length (plane size) of about 1 to 20 μm.

The amount of the inorganic layered compound contained in the protective layer is preferably in the range of 5 to 50 mass %, more preferably in the range of 10 to 40 mass %, based on the total solid content of the protective layer, from the viewpoint of suppression of the adhesion between the planographic printing plate precursors when stacked, suppression of flaw generation, deterioration in sensitivity due to shielding at the time of exposure to laser light, and low oxygen permeability. When plural inorganic layered compounds are simultaneously used, the total amount of the inorganic layered compounds is preferably in the range (mass %) described above.

Similarly, the amount of inorganic filler (other than the inorganic layered compound) contained in the protective layer is preferably in the range of 5 to 50 mass %, more preferably in the range of 10 to 40 mass %, based on the total solid content of the protective layer.

In the protective layer, a mixture of one or more organic fillers and one or more inorganic fillers can also be used, and the mixing ratio by weight is preferably in the range of 1:1 to 1:5. The content thereof in the protective layer is, in terms of the total amount of the inorganic fillers and organic fillers, preferably in the range of 5 to 50 mass %, more preferably in the range of 10 to 40 mass %.

An inorganic-organic composite filler can also be used. The inorganic-organic composite filler may be, for example, a composite of an organic filler selected from the above-described organic fillers and an inorganic filler selected from the above-described inorganic fillers. Examples of the inorganic filler used in such a composite include metal powder, particles of metal compounds (for example, oxides, nitrides, sulfides, carbides and composites thereof), preferably particles of oxides and sulfides, more preferably particles of glass, $SiO_2$, ZnO, $Fe_2O_3$, $ZrO_2$, $SnO_2$, ZnS, CuS etc. The content of the inorganic-organic composite filler in the protective layer is preferably in the range of 5 to 50 mass %, more preferably in the range of 10 to 40 mass %, based on the total solid content of the protective layer.

The components in the protective layer (selection of polyvinyl alcohol and inorganic layered compound and use of additives), the coating amount, etc. are selected in consideration of fogging, adhesiveness and scratch resistance, besides oxygen impermeability and removability at development.

In the invention, the protective layer is not limited to a single layer, and plural protective layers having different compositions from one another may also be provided to form a multi-layer structure. In a preferable embodiment of the multi-layer protective layer, a protective layer containing an inorganic layered compound is provided as a lower protective layer adjacent to the recording layer, and a protective layer containing a filler is laminated as an upper protective layer on the surface of the lower protective layer.

By providing such a multi-layer protective layer, the advantages in scratch resistance and anti-adhesion property attributable to the filler are sufficiently obtained due to the presence of the outermost protective layer, while excellent oxygen impermeability of the lower protective layer is also demonstrated, whereby image defect attributable to flaw generation or image defect attributable to undesired oxygen permeation are both effectively prevented.

The oxygen permeability of the protective layer in the invention is preferably 0.5 to 100 ml/m$^2$·day at 25° C. and 1 atmospheric pressure, and it is preferable to control the coating amount to attain such oxygen permeability.

A colorant (water-soluble dye) excellent in transmittance to the light used for exposure of the recording layer and capable of effectively absorbing light of a wavelength that does not participate in exposure may be added to the protective layer. Safelight compatibility can thereby be increased without reducing sensitivity.

(Formation of the Protective Layer)

A method of applying the protective layer is not particularly limited and can be carried out by coating the recording layer with an aqueous coating liquid for the protective layer containing the components described above. For example, methods described in U.S. Pat. No. 3,458,311 or JP-A No. 55-49729 can also be used.

Hereinafter, a method of applying the protective layer containing the inorganic layered compound such as a mica compound and the water-soluble polymer compound such as polyvinyl alcohol will be described in detail. A dispersion liquid in which the inorganic layered compound such as a mica compound is dispersed is prepared, and this dispersion liquid is mixed with the water-soluble polymer compound such as polyvinyl alcohol (or an aqueous solution containing the water-soluble polymer compound dissolved therein) to prepare a coating liquid for a protective layer, followed by applying the coating liquid onto the recording layer to form the protective layer.

Examples of the method of dispersing the inorganic layered compound used in the protective layer such as a mica compound will be described. First, 5 to 10 parts by mass of the swelling mica compound mentioned above as a preferable mica compound is added to 100 parts by mass of water, and left sufficiently to reach a stable state, so that the mica compound swelled. Then, the mixture is treated with a dispersing machine, so that the mica compound is dispersed in water. Examples of the dispersing machine to be used include various mills that mechanically apply direct force for dispersing, high-speed stirring dispersing machines having high shear force, and dispersing machines giving high-intensity ultrasonic energy. Specific examples include a ball mill, a sand grinder mill, a viscomill, a colloid mill, a homogenizer, a dissolver, a Polytron, a homomixer, a homoblender, a Keddy mill, a jet agitator, a capillary emulsifier, a liquid siren, an electromagnetic strain ultrasonic generator, and an emulsifier having a Poleman whistle. In general, 2 to 15 mass % dispersion of the mica compound dispersed by the method described above is highly viscous or gelled and extremely excellent in storage stability. When this dispersion is used to prepare a coating liquid for protective layer, the coating liquid is prepared preferably by diluting the dispersion with water and sufficiently stirring it, followed by compounding it with the water-soluble polymer compound such as polyvinyl alcohol (or an aqueous solution containing the water-soluble polymer compound such as polyvinyl alcohol dissolved therein).

Known additives such as a surfactant for improving coatability and a water-soluble plasticizer for improving the physical properties of the resultant coating can be added to this coating liquid for protective layer. The water-soluble plasticizer may be, for example, propionamide, cyclohexane diol, glycerin, or sorbitol. A water-soluble (meth)acrylic polymer can also be added. Known additives for improving adhesiveness to the recording layer or the stability of the coating liquid over time can also be added to the coating liquid.

The coating amount of the protective layer is preferably 0.1 g/m$^2$ to 4.0 g/m$^2$, more preferably 0.3 g/m$^2$ to 3.0 g/m$^2$ from the viewpoints of the strength and scratch resistance of the resultant protective layer, maintenance of image quality, and maintenance of suitable oxygen permeability for imparting safelight compatibility.

When a multi-layer protective layer is provided, the coating method is not particularly limited, and may be either a method of simultaneous multi-layer coating or a method of laminating plural layers by sequential coating processes.

When multi-layer coating is conducted, the coating amount of the lower protective layer containing the inorganic layered compound is preferably 0.1 g/m$^2$ to 1.5 g/m$^2$, more preferably 0.2 g/m$^2$ to 1.0 g/m$^2$, while the amount of the upper protective layer containing the filler is preferably 0.1 g/m$^2$ to 4.0 g/m$^2$, more preferably 0.2 g/m$^2$ to 3.0 g/m$^2$. The lower protective layer/upper protective layer ratio is preferably from 1/1 to 1/5.

(Resin Intermediate Layer)

In the planographic printing plate precursor according to the invention, a resin intermediate layer including an alkali-soluble polymer can be arranged as necessary between the recording layer and the support.

When the recording layer that is an infrared light-sensitive layer whose solubility in an alkali developer is decreased upon exposure to light is disposed as a light exposure surface or in the vicinity thereof, the sensitivity to an infrared laser light is improved. Further, the resin intermediate layer between the support and the infrared light-sensitive recording layer acts as a heat insulating layer, thereby preventing heat generated upon exposure to infrared laser light from diffusing in the support. Therefore, the heat is used effectively, and the sensitivity can be heightened.

It is estimated that in a light-exposed portion, the photosensitive layer (recording layer) made impermeable to an alkali developer functions as a protective layer for the resin intermediate layer, thus improving development stability, forming an image excellent in discrimination and securing stability with time, while in a light-unexposed portion, an unhardened binder component is rapidly dissolved and dispersed in a developer. Since the resin intermediate layer provided adjacent to the support is made of an alkali-soluble polymer, the resin intermediate layer is excellent in solubility in a developer, and is rapidly dissolved to attain excellent developability without generating a remaining layer even if, for example, a developer having lowered activity is used.

<Substrate (Support)>

The support used in the planographic printing plate precursor according to the invention may be paper, a polyester film or an aluminum plate, among which an aluminum plate is particularly preferable because it is excellent in dimensional stability, is relatively inexpensive, can provide a surface excellent in hydrophilicity and strength by performing surface treatment as necessary. A composite sheet having an aluminum sheet bonded to a polyethylene terephthalate film, as described in JP-B No. 48-18327, is also preferable.

The aluminum plate as used herein is a dimensionally stable metal plate including aluminum as a major component, and the scope of the aluminum plate includes not only a pure aluminum plate but also an alloy plate including aluminum as a major component and a very small amount of hetero elements, and a plastic film or paper having aluminum (alloy) laminated or vapor-deposited thereon. In the following description, supports made of aluminum or aluminum alloys are referred to collectively as aluminum supports. Examples of the hetero elements contained in the aluminum alloy include silicon, iron, manganese, copper, magnesium, chromium, zinc, bismuth, nickel, and titanium. The content of the hetero elements in the alloy is 10 mass % or less. A pure aluminum plate is particularly preferable, but because production of completely pure aluminum is difficult from the viewpoint of refining techniques, aluminum may contain a very small amount of hetero elements. The composition of the aluminum plate is not limited, and any aluminum plates made of known and conventionally used aluminum materials such as JIS A 1050, JIS A 1100, JIS A 3103 and JIS A 3005 can be used as necessary.

The thickness of the aluminum support is about 0.1 to 0.6 mm. This thickness can be suitably changed depending on the size of a printing machine, the size of a printing plate, and user's requests.

The aluminum support may be subjected to the following surface treatment to make it hydrophilic.

(Surface Roughening Treatment)

Examples of the surface roughening treatment include mechanical roughening, chemical etching and electrolytic grain as disclosed in JP-A No. 56-28893. Other examples include an electrochemical surface roughening method of electrochemically roughening the surface in a hydrochloric acid or nitric acid electrolytic solution, and mechanical surface roughening methods such as a wire brush grain method of scratching an aluminum surface with a metallic wire, a pole grain method of graining an aluminum surface with abrasive grains and an abrasive, or a brush grain method of roughening the surface with a nylon brush and an abrasive. Only one of these surface roughening methods may be used, or a combination of two or more of these surface roughening methods may be used. Among these methods, the electrochemical method of roughening the surface chemically in a hydrochloric acid or nitric acid electrolytic solution is particularly useful in surface roughening. The anode time electricity is preferably in the range of 50 to 400 C/dm$^2$. Specifically, it is preferable to conduct alternating current and/or direct current electrolysis at a temperature of 20 to 80° C., for 1 second to 30 minutes with a current density of 100 to 400 C/dm$^2$ in an electrolytic solution containing 0.1 to 50% hydrochloric acid or nitric acid.

The aluminum support thus surface-roughened may be etched chemically with acid or alkali. Preferable examples of the etching agent to be used include sodium hydroxide, sodium carbonate, sodium aluminate, sodium metasilicate, sodium phosphate, potassium hydroxide, lithium hydroxide etc., and the concentration and temperature are preferably in the range of 1 to 50% and 20 to 100° C., respectively. After etching, washing with acid may be carried out to remove blemish (smuts) remaining on the surface. Examples of the acid to be used include nitric acid, sulfuric acid, phosphoric acid, chromic acid, fluoric acid and hydrofluoboric acid. The method of removing smuts after electrochemical surface roughening treatment is preferably a method of contacting with 15 to 65% by mass sulfuric acid at a temperature of 50 to 90° C. as described in JP-A No. 53-12739 or a method of alkali etching as described in JP-B No. 48-28123. The method and conditions are not particularly limited as long as the surface roughness Ra of the treated surface is about 0.2 to 0.5 µm after the treatment.

(Anodizing Treatment)

The thus treated aluminum support having an oxide layer formed thereon is then subjected to anodizing treatment.

In the anodizing treatment, an aqueous solution of sulfuric acid, phosphoric acid, oxalic acid or boric acid-sodium borate, or an aqueous solution of a combination of two or more of such substances, can be used as the major component in an electrolytic bath. In this case, the electrolytic solution may naturally contain at least components usually contained in the Al alloy plate, the electrodes, tap water and underground water. Second and third components may also be contained. The range of the second and third components include, for example, cations of metals such as Na, K, Mg, Li, Ca, Ti, Al, V, Cr, Mn, Fe, Co, Ni, Cu and Zn, ammonium ions, and anions such as nitrate ion, carbonate ion, chlorine ion, phosphate ion, fluorine ion, sulfite ion, titanate ion, silicate ion and borate ion, and the concentration thereof may be from about 0 to 10000 ppm. Although the conditions for the anodizing treatment are not particularly limited, the plate is preferably treated with 30 to 500 g/L solution at a temperature of 10 to 70° C. by direct current or alternating current electrolysis in the range of a current density of 0.1 to 40 A/m$^2$. The thickness of the anodized layer formed may be in the range of 0.5 to 1.5 μm. Preferably, the thickness is in the range of 0.5 to 1.0 μm. The treatment conditions are preferably selected such that the pore diameter of micropores present in the anodized layer formed on the support by the treatment described above is 5 to 10 nm and such that the pore density is $8 \times 10^{15}$ to $2 \times 10^{16}$ pores/m$^2$.

The treatment for imparting hydrophilicity to the surface of the support may be selected from various known methods. The treatment is particularly preferably hydrophilicity-imparting treatment with a silicate, polyvinylphosphonic acid, or the like. The obtained layer may have a Si or P element content of 2 to 40 mg/m$^2$, preferably 4 to 30 mg/m$^2$. The coating amount can be measured by fluorescence X ray analysis.

In the hydrophilicity-imparting treatment, the aluminum support having an anodized layer formed thereon is dipped in an aqueous solution at pH 10 to 13 (determined at 25° C.) containing an alkali metal silicate or polyvinylphosphonic acid in an amount of 1 to 30 mass %, more preferably 2 to 15 mass %, for example at 15 to 80° C. for 0.5 to 120 seconds.

As the alkali metal silicate used in the treatment for imparting hydrophilicity, sodium silicate, potassium silicate, lithium silicate, or the like is used. The hydroxide used for raising the pH value of the aqueous alkali metal silicate solution may be sodium hydroxide, potassium hydroxide, lithium hydroxide, or the like. Alkaline earth metal salts or the group IVB metal salts may be incorporated into the treating solution described above. Examples of the alkaline earth metal salts include nitrates such as calcium nitrate, strontium nitrate, magnesium nitrate and barium nitrate, and water-soluble salts such as sulfate, hydrochloride, phosphate, acetate, oxalate and borate. Examples of the group IVB metal salts include titanium tetrachloride, titanium trichloride, titanium potassium fluoride, titanium potassium oxalate, titanium sulfate, titanium tetraiodide, zirconium chloride oxide, zirconium dioxide, zirconium oxychloride, and zirconium tetrachloride.

In an embodiment, only one selected from alkaline earth metal salts and group IVB metal salts is used. In another embodiment, a combination of two or more selected from alkaline earth metal salts and group IVB metal salts is used. The amount of these metal salts is preferably in the range of 0.01 to 10% by mass, more preferably 0.05 to 5.0% by mass. Electrodeposition with silicate as described in U.S. Pat. No. 3,658,662 is also effective. A surface treatment which is a combination of a support which has been subjected to electrolytic graining as disclosed in JP-B No. 46-27481, JP-A No. 52-58602 and JP-A No. 52-30503, and the anodizing treatment and the hydrophilicity-imparting treatment described above, is also useful.

[Production of the Planographic Printing Plate Precursor]

The planographic printing plate precursor according to the invention may have a recording layer and a protective layer on this order on a support and may be provided if necessary with an intermediate layer (undercoat layer) etc. Such a planographic printing plate precursor can be produced by applying coating liquids containing the respective components sequentially onto a support.

When the recording layer is formed by coating, the recording layer components are dissolved in an organic solvent, which may be selected from various organic solvents, to form a recording layer coating liquid. The recording layer coating liquid is then applied onto the support or the undercoat layer.

Examples of the solvent to be used for the recording layer coating liquid include acetone, methyl ethyl ketone, cyclohexane, ethyl acetate, ethylene dichloride, tetrahydrofaran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxy propanol, methoxy methoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxy propyl acetate, N,N-dimethyl formamide, dimethyl sulfoxide, γ-butyrolactone, methyl lactate and ethyl lactate. The solvent to be used may include only one of these solvents or a mixture of two or more of these solvents. A suitable solids content of the recording layer coating liquid is from 2 to 50 mass %.

The coating amount of the recording layer can mainly influence the sensitivity of the recording layer, the strength of the light-exposed layer, developability, and the printing durability of the resultant printing plate, and is desirably selected in accordance with the application. In the case of the planographic printing plate precursor for scanning exposure, the coating amount in terms of the mass of the recording layer after drying is preferably in the range of about 0.1 g/m$^2$ to about 10 g/m$^2$, more preferably 0.5 to 5 g/m$^2$.

[Intermediate Layer (Undercoat Layer)]

For the purpose of improving the adhesiveness between the recording layer and the support and stain resistance, the planographic printing plate precursor may have an intermediate layer (undercoat layer). Specific examples of the intermediate layer include those described in JP-B No. 50-7481, JP-A No. 54-72104, JP-A No. 59-101651, JP-A No. 60-149491, JP-A No. 60-232998, JP-A 3-56177, JP-A No. 4-282637, JP-A No. 5-16558, JP-A No. 5-246171, JP-A No. 7-159983, JP-A No. 7-314937, JP-A No. 8-202025, JP-A No. 8-320551, JP-A No. 9-34104, JP-A No. 9-236911, JP-A No. 9-269593, JP-A No. 10-69092, JP-A No. 10-115931, JP-A No. 10-161317, JP-A No. 10-260536, JP-A No. 10-282682, JP-A No. 11-84674, JP-A No. 10-69092, JP-A No. 10-115931, JP-A No. 11-38635, JP-A No. 11-38629, JP-A No. 10-282645, JP-A No. 10-301262, JP-A No. 11-24277, JP-A No. 11-109641, JP-A No. 10-319600, JP-A No. 11-84674, JP-A No. 11-327152, JP-A No. 2000-10292, JP-A No. 2000-235254, JP-A No. 2000-352854, JP-A No. 2001-209170, JP-A No. 2001-175001 etc.

<Plate-Making Method>

Hereinafter, the method of making a plate from the planographic printing plate precursor according to the invention will be described.

In an embodiment of the method of making a plate from the planographic printing plate precursor, a plurality of the planographic printing plate precursors described above are stacked such that the protective layer directly contacts with the back surface of the support; the stack of the planographic printing plate precursors is then set in a plate setter and the planographic printing plate precursors are automatically conveyed one by one; each precursor is imagewise exposed to light having a wavelengths of 750 to 1400 nm; and then the precursor is developed to remove the non-image portion so that the plate-making process is completed. Even when the planographic printing plate precursors according to the invention are stacked without inserting interleaf paper between the precursors, the adhesion between the planographic printing plate precursors and flaws on the protective layer can be suppressed, and therefore, the planographic printing plate precursor can be applied to the plate-making method described above. According to this plate-making method, since the stack of the planographic printing plate precursors in which the precursors are stacked without using interleaf paper between the precursors is used, the step of removing interleaf paper is unnecessary, and thus the productivity in the plate-making process is improved.

As a matter of course, plate-making can be conducted using a stack in which the planographic printing plate precursors according to the invention and sheets of interleaf paper are stacked alternately.

[Light Exposure]

The light source used in the exposure treatment may be any light source that can allow exposure at a wavelength of 750 to 1400 nm, and is preferably an infrared laser. The light source is more preferably a solid laser or a semiconductor laser emitting infrared rays having a wavelength of 750 to 1400 nm for imagewise light exposure. The output power of the laser is preferably 100 mW or more, and it is preferable to use a multi-beam laser device to reduce the exposure time. The exposure time per pixel is preferably within 20 μsec. The quantity of energy per unit irradiated on the planographic printing plate precursor is preferably 10 to 300 mJ/cm$^2$.

The light exposure can be carried out by overlapping beams from a light source. The term "overlapping" means that exposure is conducted under such a condition that the sub-scanning pitch is smaller than the beam diameter. For example, when the beam diameter is expressed in terms of full-width at half-maximum (FWHM) of the beam intensity, overlapping can be quantitatively expressed in FWHM/sub-scanning pitch (overlapping coefficient). In the invention, the overlapping coefficient is preferably 0.1 or more.

The scanning system for a light source in the light exposure device is not particularly limited, and a drum outer surface scanning method, a drum inner surface scanning method, a flatbed scanning method, or the like can be used. The channel of the light source may be a single channel or a multi-channel, but in the case of the drum outer surface scanning method, a multi-channel is preferably used.

In plate-making, the planographic printing plate precursor according to the invention can be subjected to development treatment without carrying out special thermal treatment and/or water washing treatment usually conducted after exposure treatment. Because the thermal treatment is not carried out, image unevenness attributable to the thermal treatment can be prevented. Because the thermal treatment and/or water washing treatment is not carried out, stable high-speed treatment is possible in development treatment.

[Development]

Hereinafter, the developer used in development treatment carried out after the light exposure treatment will be described.

<Developer>

The developer to be used is not particularly limited, but is usually an aqueous alkali solution at pH 14 or less containing an alkali agent.

(Alkali Agent)

Examples of the alkali agent used in the developer include inorganic alkali agents such as tertiary sodium phosphate, tertiary potassium phosphate, tertiary ammonium phosphate, sodium borate, potassium borate, ammonium borate, sodium hydroxide, potassium hydroxide, ammonium hydroxide and lithium hydroxide, and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethylene imine, ethylene diamine, pyridine and tetramethyl ammonium hydroxide. Only one alkali agent may be used, or a combination of two or more alkali agents may be used.

Alkali agents other than those described above include alkali silicates. Alkali silicates may used in combination with a base. The alkali silicates to be used may be those showing alkalinity when dissolved in water, and examples thereof include sodium silicate, potassium silicate, lithium silicate and ammonium silicate. In an embodiment, only one alkali silicate is used. In another embodiment, a mixture of two or more alkali silicates is used.

When a silicate is used, the characteristics of the developer can be adjusted easily to the optimum range by controlling the mixing ratio and concentration of silicon oxide $SiO_2$ as silicate component and alkali oxide $M_2O$ (M is an alkali metal or an ammonium group) as alkali component. From the viewpoint of suppressing blemish attributable to excess dissolution (etching) of the anodized film on a support and inhibiting generation of insoluble gas attributable to formation of a complex of dissolved aluminum and a silicate, the mixing ratio of silicon oxide $SiO_2$ to alkali metal oxide $M_2O$ ($SiO_2/M_2O$ molar ratio) is preferably in the range of 0.75 to 4.0, more preferably in the range of 0.75 to 3.5.

Regarding the concentration of the alkali silicate salt in the developer, the amount of $SiO_2$ relative to the mass of the developer is preferably in the range of 0.01 to 1 mol/L, more preferably 0.05 to 0.8 mol/L from the viewpoint of inhibitory effects on dissolution (etching) of the anodized film on a support, developability, inhibitory effects on precipitation and crystallization, and inhibitory effects on gelling upon neutralization at the time of waste liquid treatment.

(Aromatic Anionic Surfactant)

The developer preferably contains an aromatic anionic surfactant from the viewpoint of the development accelerating effect, stabilization of a dispersion of the negative type polymerizable recording layer components and protective layer components in the developer, and stabilization of development treatment.

The aromatic anionic surfactant is not particularly limited, but is preferably a compound represented by the following formula (A) or (B):

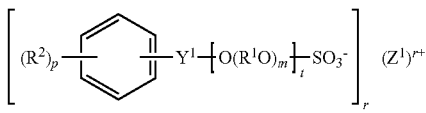
Formula (A)

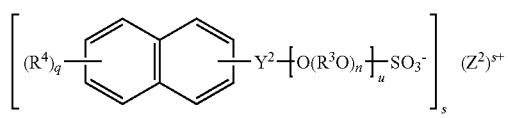
Formula (B)

In the formula (A) or (B) above, $R^1$ and $R^3$ each independently represent a linear or branched $C_1$ to $C_5$ alkylene group, and specific examples include an ethylene group, a propylene group, a butylene group and a pentylene group, among which an ethylene group and a propylene group are particularly preferable.

m and d each independently represent an integer from 1 to 100, and is preferably from 1 to 30, more preferably from 2 to 20. When m is 2 or greater, there are plural $R^1$s which may be the same as or different from each other. When n is 2 or greater, there are plural $R^3$s which may be the same as or different from each other.

t and u each independently represent 0 or 1.

$R^2$ and $R^4$ each independently represent a linear or branched $C_1$ to $C_{20}$ alkyl group, and specific examples include a methyl group, an ethyl group, a propyl group, a butyl group, a hexyl group and a dodecyl group, among which a methyl group, an ethyl group, an iso-propyl group, an n-propyl group, an n-butyl group, an iso-butyl group and a tert-butyl group are particularly preferable.

Each of p and q represents an integer from 0 to 2. Each of $Y^1$ and $Y^2$ represents a single bond or a $C_1$ to $C_{10}$ alkylene group and is preferably a single bond, a methylene group or an ethylene group, particularly preferably a single bond.

$(Z^1)^{r+}$ and $(Z^2)^{s+}$ each independently represent an alkali metal ion, an alkaline earth metal ion, unsubstituted ammonium ion or an ammonium ion substituted by an alkyl group. Specific examples include a lithium ion, a sodium ion, a potassium ion, a magnesium ion, a calcium ion, an ammonium ion, a secondary to quaternary ammonium ion substituted by an alkyl, aryl or aralkyl group having 20 or less carbon atoms. $(Z^1)^{r+}$ and $(Z^2)^{s+}$ each is particularly preferably a sodium ion, r and s each independently represent 1 or 2.

Specific examples of the aromatic anionic surfactant are shown below. However, the examples should not be construed as limiting the invention.

K-1
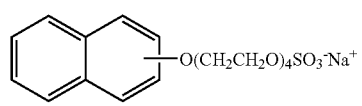

K-2
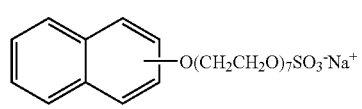

K-3
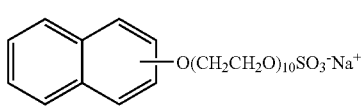

K-4
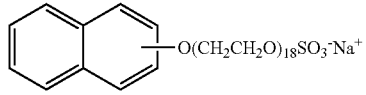

K-5
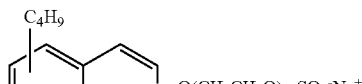

K-6
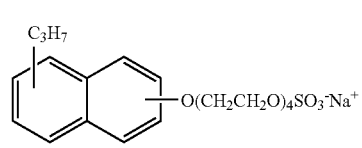

K-7
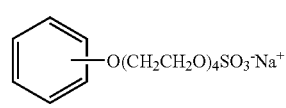

K-8
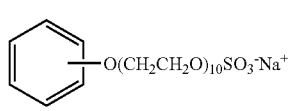

K-9
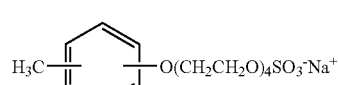

K-10
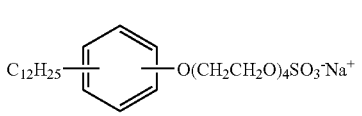

K-11
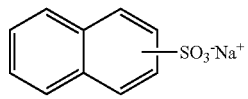

K-12
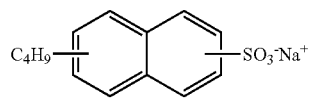

In an embodiment, only one aromatic anionic surfactant is used. In another embodiment, an arbitrary combination of two or more aromatic anionic surfactants is used. The amount of aromatic anionic surfactant to be added is not particularly limited. From the viewpoint of developability, the solubility of the recording layer components and the protective layer components, and the printing durability of the resultant printing plate, the concentration of the aromatic anionic surfactant in the developer is preferably in the range of 1.0 to 10 mass %, more preferably in the range of 2 to 10 mass %.

In the developer, the aromatic anionic surfactant may be used in combination with one or more other surfactants. Such other surfactants may be nonionic surfactants, and examples thereof include polyoxyethylene alkyl ethers such as polyoxyethylene naphthyl ether, polyoxyethylene alkyl phenyl ether, polyoxyethylene lauryl ether, polyoxyethylene cetyl ether, and polyoxyethylene stearyl ether, polyoxyethylene alkyl esters such as polyoxyethylene stearate, sorbitan alkyl esters such as sorbitan monolaurate, sorbitan monostearate, sorbitan distearate, sorbitan monooleate, sorbitan sesquioleate and sorbitan trioleate, and monoglyceride alkyl esters such as glycerol monostearate and glycerol monooleate.

The content of such additional surfactant in the developer is preferably from 0.1 to 10 mass %.

(Chelate Agent)

For the purpose of preventing the influence from calcium ions etc. contained in hard water, for example, a chelate agent for divalent metals is preferably contained in the developer. Examples of the chelate agent for divalent metals include polyphosphates such as $Na_2P_2O_7$, $Na_5P_3O_3$, $Na_3P_3O_9$, $Na_2O_4P(NaO_3P)PO_3Na_2$, and Calgon (sodium polymetaphosphate), aminopolycarboxylic acids (for example, ethylenediaminetetraacetic acid, potassium salts thereof, and sodium salts thereof, amine salt thereof; diethylenetriaminepentaacetic acid, potassium salt thereof, sodium salt thereof; triethylenetetraminehexaacetic acid, potassium salt thereof, sodium salt thereof; hydroxyethylenediaminetriacetic acid, potassium salt thereof, sodium salt thereof; nitrilotriacetic acid, potassium salt thereof, sodium salt thereof; 1,2-diaminocyclohexanetetraacetic acid, potassium salt thereof, sodium salt thereof; 1,3-diamino-2-propanol tetraacetic acid, potassium salt thereof, sodium salt thereof); other polycarboxylic acids (for example, 2-phosphonobutanetricarboxylic acid-1,2,4, potassium salt thereof, sodium salt thereof; 2-phosphonobutanetricarboxylic acid-2,3,4, potassium salt thereof, sodium salt thereof), organic phosphonic acids (for example, 1-phosphonobutanetricarboxylic acid-1,2,2, potassium salt thereof, sodium salt thereof; 1-hydroxyethane-1,1-diphosphonic acid, potassium salt thereof, sodium salt thereof; and aminotri(methylene phosphonic acid), potassium salt thereof, and sodium salt thereof, among which ethylenediaminetetraacetic acid, potassium salt thereof, sodium salt thereof, amine salt thereof; ethylenediaminetetra (methylenephosphonic acid), ammonium salt thereof, potassium salt thereof; hexamethylenediaminetetra(methylenephosponic acid), ammonium salt thereof, and potassium salt thereof are particularly preferable.

The optimum amount of the chelate agent varies depending on the hardness and amount of hard water used. In general, the chelate agent is contained in the range of 0.01 to 5 mass %, more preferably 0.01 to 0.5 mass %, in the developer at use.

In addition, an alkali metal salt of an organic acid and/or an alkali metal salt of an inorganic acid may be added as the development regulating agent to the developer. For example, sodium carbonate, potassium carbonate, ammonium carbonate, sodium citrate, potassium citrate or ammonium citrate, or a combination of two or more of such salts may be used.

In addition to the components described above, components such as the following can be simultaneously used if necessary in the developer: organic carboxylic acids such as benzoic acid, phthalic acid, p-ethylbenzoic acid, p-n-propylbenzoic acid, p-isopropylbenzoic acid, p-n-butylbenzoic acid, p-t-butylbenzoic acid, p-t-butylbenzoic acid, p-2-hydroxyethylbenzoic acid, decanoic acid, salicylic acid and 3-hydroxy-2-naphthoic acid, organic solvents such as propylene glycol, and other components such as a reducing agent, a dye, a pigment and a preservative.

From the viewpoint of developability of the non-image portion during development, reduction of damage to the image portion, and handling property of the developer, the pH of the developer at 25° C. is preferably in the range of pH 10 to 12.5, more preferably in the range of pH 11 to 12.5.

The electric conductivity x of the developer is preferably within the range: 2<x<30 mS/cm, and is more preferably from 5 to 25 mS/cm. For regulating the electric conductivity, an alkali metal salt of an organic acid and/or an alkali metal salt of an inorganic acid are added preferably as the electric conductivity regulating agent.

The developer can be used as a developer and a replenisher for the light-exposed planographic printing plate precursor, and is preferably applied to an automatic developing machine. When the planographic printing plate precursor is developed with an automatic developing machine, the developer is exhausted depending on throughput. Therefore, processing power may be recovered by using a replenisher or a fresh developer. This replenishing system can be preferably used also in the plate-making method in the invention.

To restore the processing power of the developer in an automatic developing machine, replenishing can be conducted by a method described in U.S. Pat. No. 4,882,246. Developers described in JP-A No. 50-26601, JP-A No. 58-54341, JP-B No. 56-39464, JP-B No. 56-42860 and JP-B No. 57-7427 are also preferable.

The planographic printing plate precursor which was subjected to development treatment in this manner is post-treated with washing water, a surfactant-containing rinse, or a desensitizing gum solution containing gum arabic or a starch derivative, as described in JP-A No. 54-8002, JP-A No. 55-115045 and JP-A No. 59-58431. Various combinations of these treatments can be used.

For the purpose of improving strength of image portion and printing durability, the whole surface of the image after development can be heated or exposed to light. Very severe conditions can be utilized for the heating after development, and the heating temperature is usually in the range of 200 to 500° C.

The planographic printing plate obtained by these treatments is loaded onto an offset printing machine, and used for printing on a large number of sheets.

At the time of printing, a plate cleaner used for removing dirt from the plate may be a PS plate cleaner conventionally known in the art, such as Multi-cleaners CL-1, CL-2, CP, CN-4, CN, CG-1, PC-1, SR or IC (Fuji Film Corporation).

Exemplary embodiments of the present invention are shown below:

<1>. A polymerizable composition comprising a binder polymer, a polymerizable compound having an unsaturated group, and a diaryl iodonium salt having at least two electron-donating groups.

<2>. The polymerizable composition of <1>, further comprising a compound having an absorption maximum at 700 to 1200 nm.

<3>. The polymerizable composition of <1>, wherein the iodonium salt has three or more electron-donating groups.

<4>. The polymerizable composition of <1>, wherein the iodonium salt has four electron-donating groups.

<5>. The polymerizable composition of <1>, wherein the electron-donating groups are alkoxy groups.

<6>. The polymerizable composition of <1>, wherein the diaryl iodonium salt having at least two electron-donating groups has a partial structure represented by the following formula (I):

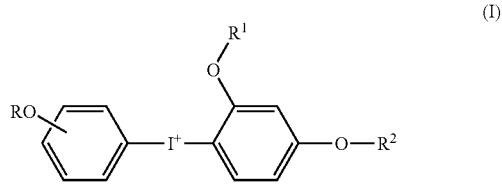

wherein, in formula (I), R, $R^1$ and $R^2$ each independently represent an alkyl group or an aryl group.

<7>. The polymerizable composition of <1>, wherein the diaryl iodonium salt having at least two electron-donating groups has a partial structure represented by the following formula (I-ii):

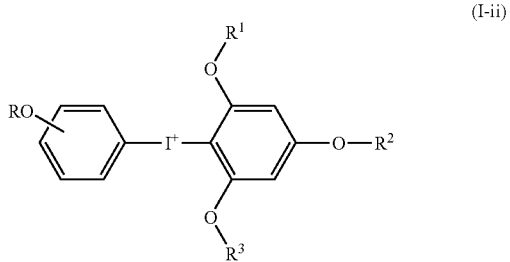

(I-ii)

wherein, in formula (I-ii), R, $R^1$, $R^2$ and $R^3$ each independently represent an alkyl group or an aryl group.

<8>. The polymerizable composition of <1>, wherein a total of Hammett's values of substituents on an aryl skeleton of the diaryl iodonium salt is 0.56 or less.

<9>. The polymerizable composition of <1>, wherein the diaryl iodonium salt has an anion having a sulfonic acid group as a counter anion.

<10>. The polymerizable composition of <1>, wherein the binder polymer is an alkali-soluble resin.

<11>. The polymerizable composition of <1>, wherein the binder polymer includes a structural unit represented by the following formula (II):

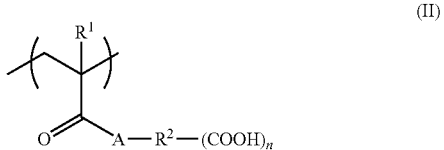

(II)

wherein, in formula (II), $R^1$ represents a hydrogen atom or a methyl group; $R^2$ represents a linking group composed of 2 to 82 atoms selected from the group consisting of carbon atoms, hydrogen atoms, oxygen atoms, nitrogen atoms and sulfur atoms; A represents an oxygen atom or —$NR^3$— wherein $R^3$ represents a hydrogen atom or a $C_{1-10}$ monovalent hydrocarbon group; and n is an integer of 1 to 5.

<12>. A planographic printing plate precursor comprising, on a support, a recording layer including the polymerizable composition of <1>.

<13>. The planographic printing plate precursor of <12>, further comprising a protective layer provided on the recording layer.

<14>. The planographic printing plate precursor of <13>, wherein the protective layer comprises a filler.

<15>. The planographic printing plate precursor of <13>, wherein the protective layer comprises at least one inorganic filler and at least one organic filler.

<16>. The planographic printing plate precursor of <13>, wherein the protective layer includes a lower protective layer that includes an inorganic layered compound and an upper protective layer that includes a filler.

EXAMPLES

Hereinafter, the present invention will be described in more detail by reference to Examples, but the invention is not limited thereto.

Examples 1 to 7 and Comparative Example 1

Preparation of Support

A JIS A 1050 aluminum plate having a thickness of 0.30 mm and a width of 1030 mm was subjected to the following surface treatment.

<Surface Treatment>

In the surface treatment, the following treatments (a) to (f) were successively conducted. After each treatment and water washing, a remaining liquid was removed with nip rollers.

(a) The aluminum plate was subjected to etching treatment with an aqueous solution containing sodium hydroxide at a concentration of 26 mass % and aluminum ion at a concentration of 6.5 mass % at a temperature of 70° C., whereby the aluminum plate was dissolved in an amount of 5 g/m². Thereafter, the aluminum plate was washed with water.

(b) The aluminum plate was subjected to desmutting treatment with a spray of an aqueous solution of 1 mass % nitric acid (also containing 0.5 mass % aluminum ion) at a temperature of 30° C., and then was washed with water.

(c) The plate was subjected to continuous electrochemical surface roughening treatment with an alternating voltage of 60 Hz. The electrolytic solution used was 1 mass % aqueous nitric acid solution (containing 0.5 mass % aluminum ion and 0.007 mass % ammonium ion) at a temperature of 30° C. The electrochemical surface roughening treatment was carried out with a carbon electrode as a counter electrode, using a trapezoid rectangular wave alternating current wherein the time TP required for the electric current to change from 0 to the peak value was 2 msec and the duty ratio was 1:1. Ferrite was used as an assistant anode. The current density was 25 A/dm² in terms of the electric current peak value, and the quantity of electricity was 250 C/dm² in terms of total quantity of electricity at the time the aluminum plate works as the anode. 5% of the electric current from the power source was distributed to the assistant anode. Thereafter, the plate was washed with water.

(d) The aluminum plate was subjected to etching treatment by spraying with an aqueous solution containing sodium hydroxide at a concentration of 26 mass % and aluminum ion at a concentration of 6.5 mass % at a temperature of 35° C., whereby the aluminum plate was dissolved in an amount of 0.2 g/m² to remove smut components mainly composed of aluminum hydroxide generated during the electrochemical surface roughening treatment using the alternating current in the previous stage, and smoothen the edge portion of the generated pit through dissolution of the edge portion. Thereafter, the aluminum plate was washed with water.

(e) The aluminum plate was subjected to desmutting treatment with a spray of an aqueous solution of 25 mass % sulfuric acid (also containing 0.5 mass % aluminum ion) at a temperature of 60° C. and then was washed with sprayed water.

(f) The aluminum plate was subjected to anodizing treatment for 50 seconds in an aqueous solution of sulfuric acid at a concentration of 170 g/L (containing 0.5 mass % aluminum ion) at a temperature of 33° C. and a current density of 5 (A/dm²). Thereafter, washing by spraying with water was carried out. The amount of the anodized coating was 2.7 g/m².

The surface roughness Ra of the aluminum support obtained in this manner was 0.27 (measured with SURFCOM with a sensing pin tip diameter of 2 micrometer manufactured by Tokyo Seimitsu Co., Ltd.).

<Undercoat Layer>

Then, this aluminum support was coated with the following undercoat layer coating liquid, using a wire bar, and then dried at 90° C. for 30 seconds. The coating amount was 10 mg/m$^2$.

(Undercoat Layer Coating Liquid)

| | |
|---|---|
| Polymer compound A having the structure below (weight-average molecular weight: 10,000) | 0.05 g |
| Methanol | 27 g |
| Ion-exchange water | 3 g |

Polymer Compound A

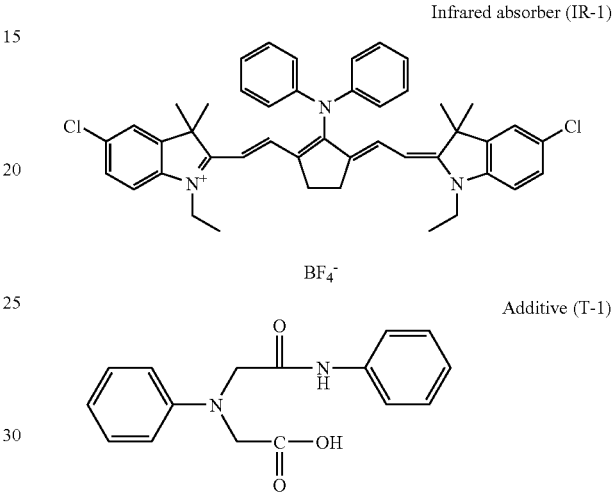

(Recording Layer)

Then, a recording layer coating liquid [P-1] shown below was prepared and applied with a wire bar onto the above support to form a recording layer. Drying was carried out at 115° C. for 34 seconds with a hot-air drying apparatus. The coating amount of the recording layer after drying was 1.4 g/m$^2$.

<Recording Layer Coating Liquid [P-1]>

| | |
|---|---|
| Infrared absorber (IR-1) [Component (D)] | 0.100 g |
| Polymerization initiator [Component (C) or comparative polymerization initiator] | 0.30 g |
| Additive (T-1) | 0.150 g |
| Polymerizable compound (compound shown in Table 1) [Component (B)] | 1.33 g |
| Binder polymer (compound shown in Table 1) [Component (A)] | 1.35 g |
| Ethyl Violet | 0.04 g |
| Fluorine-containing surfactant (MEGAFACE F-780-F, 30 mass % solution in methyl isobutyl ketone (MIBK), manufactured by Dainippon Ink and Chemicals, Inc.) | 0.025 g |
| Methyl ethyl ketone | 18.4 g |
| Methanol | 9.83 g |
| 1-Methoxy-2-propanol | 18.4 g |

The details of the polymerizable compound, infrared absorber, additive and comparative polymerization initiator (H-1) in Table 1 are as follows:

(Polymerizable Compound)

M-1: Pentaerythritol triacrylate hexamethylene diisocyanate urethane prepolymer (UA-306H manufactured by Kyoeisha Chemical Co., Ltd.)

M-2: Ethoxylated bisphenol A diacrylate (SR-601 manufactured by Nippon Kayaku Co., Ltd.)

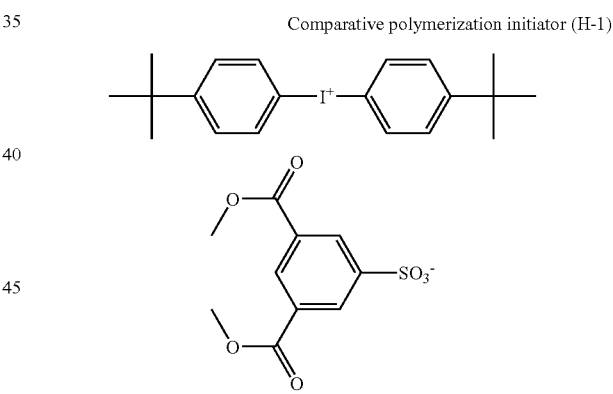

TABLE 1

| | Specific iodonium salt (C) or comparative polymerization initiator | Polymerizable compound (B) | Binder polymer (A) | Evaluation of performance | | |
|---|---|---|---|---|---|---|
| | | | | Fluctuation in sensitivity | Coloration of Non-Image Portion Over Time | Sensitivity |
| Example 1 | I-30 | M-1 | B-1 | 5% or less | A | 105 |
| Example 2 | I-31 | M-1 | B-2 | 5% or less | A | 105 |
| Example 3 | I-16 | M-2 | B-2 | 5% or less | A | 100 |
| Example 4 | I-1 | M-2 | B-2 | 5% | A | 100 |
| Example 5 | I-8 | M-2 | B-1 | 5% | A | 100 |
| Example 6 | I-29 | M-2 | B-2 | 10% | A | 100 |
| Example 7 | I-26 | M-1 | B-1 | 10% | A | 100 |
| Comparative Example 1 | H-1 | M-1 | B-1 | Development was impossible | B | 100 |

-continued

Binder polymer (B-1)

Polyurethane compound (Mw = 100,000) obtained by condensation of the following monomers in the following ratio

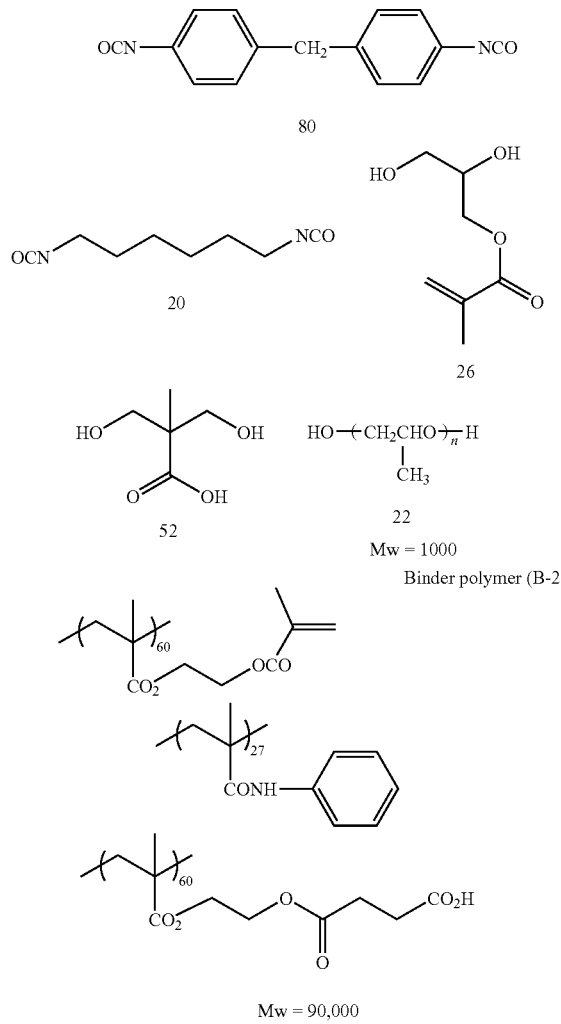

Mw = 90,000

(Protective Layer)

The surface of the recording layer was coated, using a wire bar, with an aqueous mixture solution (protective layer coating liquid) of synthetic mica (SOMASHIF ME-100, 8% water dispersion, manufactured by Co-op Chemical Co., Ltd.), polyvinyl alcohol (GOSERAN CKS-50, having a saponification degree of 99 mol % and a polymerization degree of 300; sulfonic acid-modified polyvinyl alcohol manufactured by Nippon Synthetic Chemical Industry Co., Ltd.) and a surfactant (EALEX 710 manufactured by Nippon Emulsion Co., Ltd.) and then dried at 125° C. for 75 seconds in a hot-air drying apparatus.

The synthetic mica (solid content)/polyvinyl alcohol/surfactant ratio in this aqueous mixture solution (protective layer coating liquid) was 16/82/2 (mass %), and the coating amount (coating amount after drying) was 1.6 g/m$^2$.

In this manner, the planographic printing plate precursors of Examples 1 to 7 and Comparative Example 1 were obtained.

[Evaluation of the Planographic Printing Plate Precursor]

(1) Evaluation of Sensitivity

The resultant planographic printing plate precursors were stacked without inserting interleaf paper therebetween, and then set in AMIZSETTER manufactured by NEC and automatically conveyed one by one. Each planographic printing plate precursor is exposed to light with output power changed in increments of 0.15 in log E within the range of 0 to 19 W at a resolution of 1200 dpi and an outer drum revolution number of 160 rpm. Light exposure was carried out under the condition of 25° C. and 50% RH. After the light exposure, thermal treatment and water pre-washing before alkali development were not carried out, and development was carried out at 30° C. at a conveyance speed (line speed) of 2 m/min with an automatic developing machine LP-1310 News manufactured by Fuji Film. Corporation. DH-N (manufactured by Fuji Film Corporation) diluted with water in a ratio of 1:4 was used as the developer, FCT-421 (manufactured by Fuji Film Corporation) diluted with water in a ratio of 1:1.4 was used as the replenisher, and GN-2K (manufactured by Fuji Film Corporation) diluted with water in a ratio of 1:1 was used as the finisher.

The density of the developed image portion of the planographic printing plate was measured with a Macbeth reflection densitomer RD-918, and a red filter attached to the densitomer was used to measure the cyan density. A reciprocal number of the amount of exposure light necessary for attaining a measured density of 0.9 was regarded as the indicator of sensitivity. Assuming that the sensitivity of the planographic printing plate obtained in Example 1 was 100, the sensitivities of the other planographic printing plates are shown in relative sensitivity. A higher value is indicative of higher sensitivity. The results are shown in Table 1.

(2) Evaluation of Fluctuation in Sensitivity

Fluctuation in sensitivity was determined by storing each planographic printing plate precursor obtained in the manner described above for 24 hours at 60° C., then subjecting it to light exposure and development in the same manner as in the evaluation of sensitivity, and evaluating the difference in the sensitivity from the sensitivity before the storage. A smaller difference is evaluated as indicating excellent stability with time, and a fluctuation of less than 10% is evaluated as indicating excellent stability without any practical problem. The results are shown in Table 1. According to this evaluation, the whole surface of the planographic printing plate precursor of Comparative Example 1 could not be developed, thus indicating inferior stability.

(3) Evaluation of Coloration of Non-Image Portion Over Time

The planographic printing plate precursor was stored over time in the same manner as in the evaluation of fluctuation in sensitivity (2) above and subjected to light exposure and development in the same manner as in evaluation of sensitivity, and the non-image portion was measured for cyan density using Macbeth reflection densitomer RD-918 with a red filter attached thereto. In this manner, the difference in cyan density between the plate before storage and the plate after storage is evaluated.

The plate not showing difference in cyan density between the plate before and after storage was evaluated as A, while the plate made showing higher cyan density after storage was evaluated as B.

As is apparent from Table 1, the planographic printing plate precursors of Examples 1 to 7 having a recording layer containing the polymerizable composition according to the invention, while maintaining high sensitivity, showed excellent storage stability with suppressed fluctuation in sensitivity during storage, and coloration of the non-image portion due to progress of undesirable polymerization over time is also suppressed in the planographic printing plate precursors of Examples 1 to 7. In contrast, although the planographic printing plate precursor of Comparative Example 1 using a known polymerization initiator having an iodonium salt skeleton is capable of recording at high sensitivity, the planographic printing plate precursor of Comparative Example 1 is inferior in stability with time, and is at a practically problematic level.

Examples 8 to 16

A recording layer coating liquid [P-2] shown below was prepared and applied with a wire bar onto a support obtained in the same manner as in Example 1 to form a recording layer. Drying was carried out at 115° C. for 34 seconds in a hot-air drying apparatus. The coating amount of the recording layer after drying was 1.4 g/m².

<Recording Layer Coating Liquid [P-2]>

| | |
|---|---|
| Infrared absorber (IR-1) [Component (D)] | 0.038 g |
| Polymerization initiator (I-31) [Component (C)] | 0.179 g |
| Additive (P-1) | 0.034 g |
| Polymerizable compound (M-3) [Component (B)] | 0.408 g |
| Binder polymer (compound shown in Table 2) [Component (A)] | the amount shown in Table 2 |
| Ethyl Violet | 0.02 g |
| Fluorine-containing surfactant (MEGAFAC F-780-F, 30 mass % solution in methyl isobutyl ketone (MIBK), Dainippon Ink and Chemicals, Inc.) | 0.0077 g |
| Methyl ethyl ketone | 5.63 g |
| Methanol | 2.61 g |
| 1-Methoxy-2-propanol | 5.63 g |

The details of the additive, polymerizable compound and binder polymer used in Examples 8 to 16 are as follows:

(Protective Layer)

<Protective Layer L3-1>

The surface of the recording layer was coated, using a wire bar, with an aqueous mixture solution (protective layer coating liquid) of synthetic mica (SOMASHIF MEB-3L, 3.2% water dispersion, manufactured by Co-op Chemical Co., Ltd.), polyvinyl alcohol (GOSERAN CKS-50, having a saponification degree of 99 mol % and a polymerization degree of 300; sulfonic acid-modified polyvinyl alcohol manufactured by Nippon Synthetic Chemical Industry Co., Ltd.), polymer compound A, surfactant A (EMALEX 710 manufactured by Nippon Emulsion Co., Ltd.) and surfactant B (ADEKA PLURONIC P-84, manufactured by Asahi Denka Kogyo K.K.) and then dried at 125° C. for 75 seconds in a hot-air drying apparatus.

The synthetic mica (solid content)/polyvinyl alcohol/polymer compound A/surfactant A/surfactant B ratio in this aqueous mixture solution (protective layer coating liquid) was 12/75.5/5/4.5/3 (mass %), and the coating amount (coating amount after drying) was 1.6 g/m².

<Protective Layer L3-2>

The surface of the recording layer was coated, using a wire bar, with an aqueous mixture solution (protective layer coating liquid) of an organic filler (CHEMIPEARL W200, 40% water dispersion, manufactured by Mitsui Chemicals, Inc.), polyvinyl alcohol (GOSERAN CKS-50, having a saponification degree of 99 mol % and a polymerization degree of 300; sulfonic acid-modified polyvinyl alcohol manufactured by Nippon Synthetic Chemical Industry Co., Ltd.), polyvinyl pyrrolidone (RUBISCOL K-30 manufactured by BASF) and a surfactant (EMALEX 710 manufactured by Nippon Emulsion Co., Ltd.), and then dried at 125° C. for 75 seconds in a hot-air drying apparatus.

The organic filler (solid content)/polyvinyl alcohol/polyvinyl pyrrolidone/surfactant ratio in this aqueous mixture solution (protective layer coating liquid) was 2.5/83.0/10.0/4.5 (mass %), and the coating amount (coating amount after drying) was 1.6 g/m².

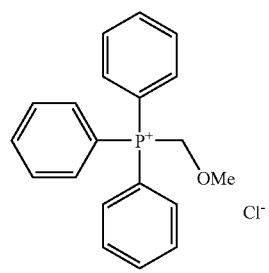

Additive (P-1)

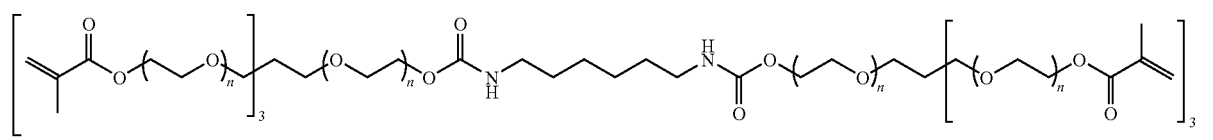

Polymerizable compound (M-4)

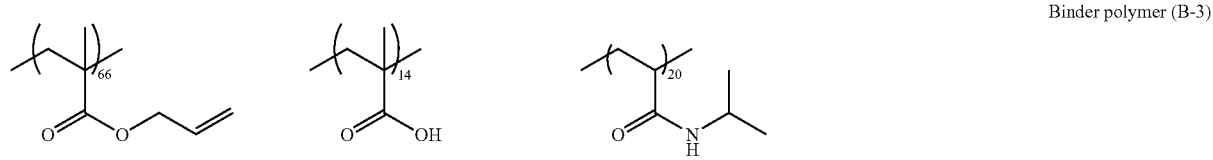

Binder polymer (B-3)

<Protective Layer L3-3>

The surface of the recording layer was coated, using a wire bar, with an aqueous mixture solution (protective layer coating liquid) of an organic filler (CHEMIPEARL W308, 40% water dispersion, manufactured by Mitsui Chemicals, Inc.), synthetic mica (SOMASHIF MEB-3L, 3.2% water dispersion, manufactured by Co-op Chemical Co., Ltd.), polyvinyl alcohol (GOSERAN CKS-50, having a saponification degree of 99 mol % and a polymerization degree of 300; sulfonic acid-modified polyvinyl alcohol manufactured by Nippon Synthetic Chemical Industry Co., Ltd.) and a surfactant (EMALEX 710 manufactured by Nippon Emulsion Co., Ltd.) and then dried at 125° C. for 75 seconds in a hot-air drying apparatus.

The organic filler (solid content)/synthetic mica (solid content)/polyvinyl alcohol/surfactant ratio in this aqueous mixture solution (protective layer coating liquid) was 5.0/3.0/87.5/4.5 (mass %), and the coating amount (coating amount after drying) was 1.6 g/m².

degree of 300; sulfonic acid-modified polyvinyl alcohol manufactured by Nippon Synthetic Chemical Industry Co., Ltd.), surfactant A (EMALEX 710 manufactured by Nippon Emulsion Co., Ltd.) and surfactant B (ADEKA PLURONIC P-84, manufactured by Asahi Denka Kogyo K.K.), and then dried at 125° C. for 30 seconds in a hot-air drying apparatus.

The synthetic mica (solid content)/polyvinyl alcohol/surfactant A/surfactant B ratio in this aqueous mixture (protective layer coating liquid) was 18/71.5/4.5/6 (mass %), and the amount of the aqueous mixture applied (coating amount after drying) was 0.5 g/m².

<Protective Layer L4-1: Upper Recording Layer>

The surface of the lower protective layer formed by the formulation in the above <protective layer L3-4> was coated, using a wire bar, with an aqueous mixture solution (protective layer coating liquid) of an organic filler (CHEMIPEARL W308, 40% water dispersion, manufactured by Mitsui Chemicals, Inc.), synthetic mica (SOMASHIF MEB-3L,

TABLE 2

|  | Binder polymer (g) | | | Protective | Evaluation of performance | | |
|---|---|---|---|---|---|---|---|
|  |  |  |  |  | Sensitivity | Coloration of Non-Image Portion Over |  |
|  | B-1 | B-2 | B-3 | layer | fluctuation | Time | Sensitivity |
| Example 8 | 0 | 0.367 | 0.245 | L3-1 | 5% or less | A | 100 |
| Example 9 | 0.245 | 0.367 | 0 | L3-1 | 5% or less | A | 105 |
| Example 10 | 0.612 | 0 | 0 | L3-1 | 5% or less | A | 105 |
| Example 11 | 0 | 0.367 | 0.245 | L3-2 | 5% or less | A | 100 |
| Example 12 | 0.245 | 0.367 | 0 | L3-2 | 5% or less | A | 105 |
| Example 13 | 0.612 | 0 | 0 | L3-2 | 5% or less | A | 105 |
| Example 14 | 0 | 0.367 | 0.245 | L3-3 | 5% or less | A | 100 |
| Example 15 | 0.245 | 0.367 | 0 | L3-3 | 5% or less | A | 105 |
| Example 16 | 0.612 | 0 | 0 | L3-3 | 5% or less | A | 105 |

[Evaluation of the Planographic Printing Plate Precursor]

The planographic printing plate precursors obtained in Examples 8 to 16 were evaluated in the same manner as in Example 1. The results are shown in Table 2.

From Table 2, it is found that even if the protective layer is changed, the planographic printing plate precursors of Examples 8 to 16 having a recording layer containing the polymerizable composition according to the invention, while maintaining high sensitivity, exhibited excellent storage stability with suppressed fluctuation of sensitivity during storage, and coloring of the non-image portion due to progress of undesired polymerization with time was prevented in the planographic printing plate precursors of Examples 8 to 16.

Examples 17 to 19

The recording layer coating liquid [P-2] was prepared in the same manner as in Example 17 and applied, using a wire bar, onto a support obtained in the same manner as in Example 1, to form a recording layer. Drying was carried out at 115° C. for 34 seconds in a hot-air drying apparatus. The coating amount of the recording layer after drying was 1.4 g/m².

<Protective Layer L3-4: Lower Recording Layer>

The surface of the recording layer was coated, using a wire bar, with an aqueous mixture solution (protective layer coating liquid) of synthetic mica (SOMASHIF MEB-3L, 3.2% water dispersion, manufactured by Co-op Chemical Co., Ltd.), polyvinyl alcohol (GOSERAN CKS-50, having a saponification degree of 99 mol % and a polymerization 3.2% water dispersion, manufactured by Co-op Chemical Co., Ltd.), polyvinyl alcohol (GOSERAN CKS-50, having a saponification degree of 99 mol % and a polymerization degree of 300; sulfonic acid-modified polyvinyl alcohol manufactured by Nippon Synthetic Chemical Industry Co., Ltd.) and a surfactant (EMALEX 710 manufactured by Nippon Emulsion Co., Ltd.), and then dried at 125° C. for 30 seconds in a hot-air drying apparatus.

The organic filler (solid content)/synthetic mica (solid content)/polyvinyl alcohol/surfactant ratio in this aqueous mixture solution (protective layer coating liquid) was 5.0/3.0/87.5/4.5 (mass %), and the coating amount (coating amount after drying) was 0.5 g/m².

In this manner, the upper protective layer was formed on the surface of the lower protective layer as shown in Table 2 below, whereby the planographic printing plate precursors of Examples 17 to 19 were obtained.

The resultant planographic printing plate precursors of Examples 17 to 19 were evaluated in the same manner as in Example 1. Thereafter, the following evaluations were conducted. The results are shown in Table 3 below.

(4) Evaluation of Releasability 500 of each of the planographic printing plate precursors obtained above were stacked without inserting interleaf paper therebetween, and were set in a plate-feeding apparatus. They were sequentially exposed and developed automatically and discharged to a stocker. It was observed whether conveyance trouble attributable to adhesion between the planographic printing plate precursors occurred or not during operation of the apparatus.

If conveyance troubles attributable to the adhesion between the planographic printing plate precursors did not occur, grade "A" was given. If such conveyance trouble occurs for at least one planographic printing plate precursor, grade "B" was given.

(5) Evaluation of Image Deficiency

Image deficiency on the image portion of the planographic printing plate obtained by development was evaluated with the naked eye.

If there was no image deficiency, grade "A" was given. If there was missing part in the image portion, grade "B" was given.

(6) Flaw Generated Upon Reloading 30 of each of the planographic printing plate precursors obtained above were stacked without inserting interleaf paper therebetween, and then put by hand on another stack in which 500 precursors were stacked without interleaf paper therebetween. The upper 31 planographic printing plate precursors in the resultant stack were evaluated with respect to flaws.

If there was no flaw, grade "A" was given. If there was flaw on at least one planographic printing plate precursor, grade "B" was given.

TABLE 3

| | Binder polymer (g) | | | Protective layer | | Evaluation of performance | | | | | |
|---|---|---|---|---|---|---|---|---|---|---|---|
| | | | | Lower | Upper | Fluctuation in | Coloration of Non-Image Portion Over | | | Image | |
| | B-1 | B-2 | B-3 | layer | layer | sensitivity | Time | Sensitivity | Releasability | deficiency | Faw |
| Example 17 | 0 | 0.367 | 0.245 | L3-4 | L4-1 | 5% or less | A | 110 | A | A | A |
| Example 18 | 0.245 | 0.367 | 0 | L3-4 | L4-1 | 5% or less | A | 115 | A | A | A |
| Example 19 | 0.612 | 0 | 0 | L3-4 | L4-1 | 5% or less | A | 115 | A | A | A |

As a result, it is found that the planographic printing plate precursors of Examples 17 to 19 maintain storage stability and an ability to suppress coloration of non-image portion over time, which are included in advantageous effects of the invention, and simultaneously attain higher sensitivity due to the effects of the multi-layered protective layer; further troubles caused by adhesion when stacked without inserting interleaf paper therebetween and image deficiency caused by a reduction in oxygen permeability are also suppressed.

According to the invention, a highly sensitive polymerizable composition which is stable even under severe storage conditions, and whose fluctuation in sensitivity is small, can be provided. According to the invention, a planographic printing plate precursor excellent in stability over time in which the polymerizable composition according to the invention is used as a recording layer can also be provided.

All publications, patent applications, and technical standards mentioned in this specification are herein incorporated by reference to the same extent as if each individual publication, patent application, or technical standard was specifically and individually indicated to be incorporated by reference.

What is claimed is:

1. A polymerizable composition comprising a binder polymer, a polymerizable compound having an unsaturated group, and a radical polymerization initiator, the radical polymerization initiator comprising a diaryl iodonium salt having at least two electron-donating groups at each of the ortho and para positions on at least one of the aryl groups.

2. The polymerizable composition according to claim 1, further comprising a compound having an absorption maximum at 700 to 1200 nm.

3. The polymerizable composition according to claim 1, wherein the iodonium salt has three or more electron-donating groups.

4. The polymerizable composition according to claim 1, wherein the iodonium salt has four electron-donating groups.

5. The polymerizable composition according to claim 1, wherein the electron-donating group are alkoxy groups.

6. The polymerizable composition according to claim 1, wherein the diaryl iodonium salt having at least two electron-donating groups has a partial structure represented by the following formula (I):

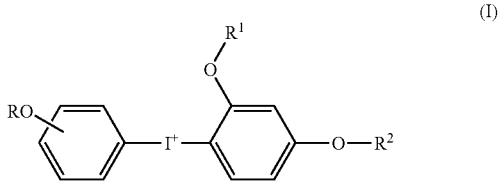

(I)

wherein, in formula (I), R, $R^1$ and $R^2$ each independently represent an alkyl group or an aryl group.

7. The polymerizable composition according to claim 1, wherein the diaryl iodonium salt having at least two electron-donating groups has a partial structure represented by the following formula (I-ii):

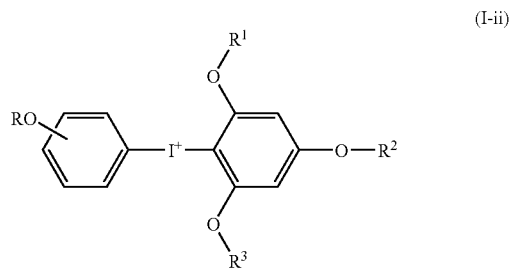

(I-ii)

wherein, in formula (I-ii), R, $R^1$, $R^2$ and $R^3$ each independently represent an alkyl group or an aryl group.

8. The polymerizable composition according to claim 1, wherein a total of Hammett's values of substituents on an aryl skeleton of the diaryl iodonium salt is −0.56 or less.

9. The polymerizable composition according to claim 1, wherein the diaryl iodonium salt has an anion having a sulfonic acid group as a counter anion.

10. The polymerizable composition according to claim 1, wherein the binder polymer is an alkali-soluble resin.

11. The polymerizable composition according to claim 1, wherein the binder polymer includes a structural unit represented by the following formula (II):

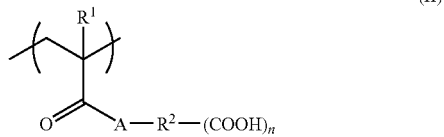

wherein, in formula (II), $R^1$ represents a hydrogen atom or a methyl group; $R^2$ represents a linking group composed of 2 to 82 atoms selected from the group consisting of carbon atoms, hydrogen atoms, oxygen atoms, nitrogen atoms and sulfur atoms; A represents an oxygen atom or —$NR^3$— wherein $R^3$ represents a hydrogen atom or a $C_{1-10}$ monovalent hydrocarbon group; and n is an integer of 1 to 5.

12. A planographic printing plate precursor comprising, on a support, a recording layer including the polymerizable composition of claim 1.

13. The planographic printing plate precursor according to claim 12, further comprising a protective layer provided on the recording layer.

14. The planographic printing plate precursor according to claim 13, wherein the protective layer comprises a filler.

15. The planographic printing plate precursor according to claim 13, wherein the protective layer comprises at least one inorganic filler and at least one organic filler.

16. The planographic printing plate precursor according to claim 13, wherein the protective layer includes a lower protective layer that includes an inorganic layered compound and an upper protective layer that includes a filler.

17. The planographic printing plate precursor according to claim 12, wherein the support is an aluminum support.

18. The planographic printing plate precursor according to claim 13, wherein the protective layer comprises polyvinyl alcohol.

* * * * *